United States Patent
Kantani

(10) Patent No.: US 12,340,096 B2
(45) Date of Patent: Jun. 24, 2025

(54) MEMORY SYSTEM

(71) Applicant: Kioxia Corporation, Tokyo (JP)

(72) Inventor: Tomoyuki Kantani, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/746,394

(22) Filed: Jun. 18, 2024

(65) Prior Publication Data

US 2024/0338129 A1    Oct. 10, 2024

Related U.S. Application Data

(62) Division of application No. 17/821,960, filed on Aug. 24, 2022, now Pat. No. 12,056,368.

(30) Foreign Application Priority Data

Mar. 8, 2022    (JP) .................................. 2022-035409

(51) Int. Cl.
    *G06F 3/06* (2006.01)
(52) U.S. Cl.
    CPC .......... *G06F 3/0619* (2013.01); *G06F 3/0629* (2013.01); *G06F 3/0679* (2013.01)
(58) Field of Classification Search
    CPC ..... G06F 3/0619; G06F 3/0629; G06F 3/0679
    See application file for complete search history.

(56) References Cited

U.S. PATENT DOCUMENTS

| | | | |
|---|---|---|---|
| 9,703,494 B1 | 7/2017 | Rajwade | |
| 10,775,865 B2 | 9/2020 | Nomura | |
| 11,437,093 B2 | 9/2022 | Moschiano | |
| 11,449,382 B2 | 9/2022 | Oh | |
| 11,586,385 B1 | 2/2023 | Lercari | |
| 2010/0191931 A1* | 7/2010 | Kim | G11C 11/5628 711/170 |
| 2011/0149651 A1 | 6/2011 | Gorobets et al. | |
| 2012/0069677 A1* | 3/2012 | Lee | G11C 16/16 365/185.33 |
| 2012/0134214 A1* | 5/2012 | Joo | G11C 11/5628 365/185.18 |
| 2012/0170366 A1* | 7/2012 | Kim | G11C 16/16 365/185.24 |
| 2016/0011807 A1* | 1/2016 | Seol | G11C 11/5628 711/102 |

(Continued)

FOREIGN PATENT DOCUMENTS

JP    2020-30875 A    2/2020

*Primary Examiner* — Prasith Thammavong
(74) *Attorney, Agent, or Firm* — Oblon, McClelland, Maier & Neustadt, L.L.P.

(57) ABSTRACT

According to one embodiment, a controller identifies a fourth storage location on which a second step program operation is executed last among storage locations of a block and determines whether a condition that a fifth storage location stores unreadable data and each of memory cells of a sixth storage location has a threshold voltage corresponding to an erased state, is satisfied. Among the storage locations, in response to completion of a first step program operation on the fifth storage location, the second step program operation on the fourth storage location has been executed, and the first step program operation on the sixth storage location is to be executed after completion of the second step program operation on the fifth storage location.

6 Claims, 37 Drawing Sheets

(56) References Cited

U.S. PATENT DOCUMENTS

| | | |
|---|---|---|
| 2016/0211014 A1 | 7/2016 | Lee |
| 2020/0371718 A1 | 11/2020 | Chien et al. |
| 2020/0379905 A1 | 12/2020 | Ji |
| 2021/0406107 A1 | 12/2021 | Banerjee |

* cited by examiner

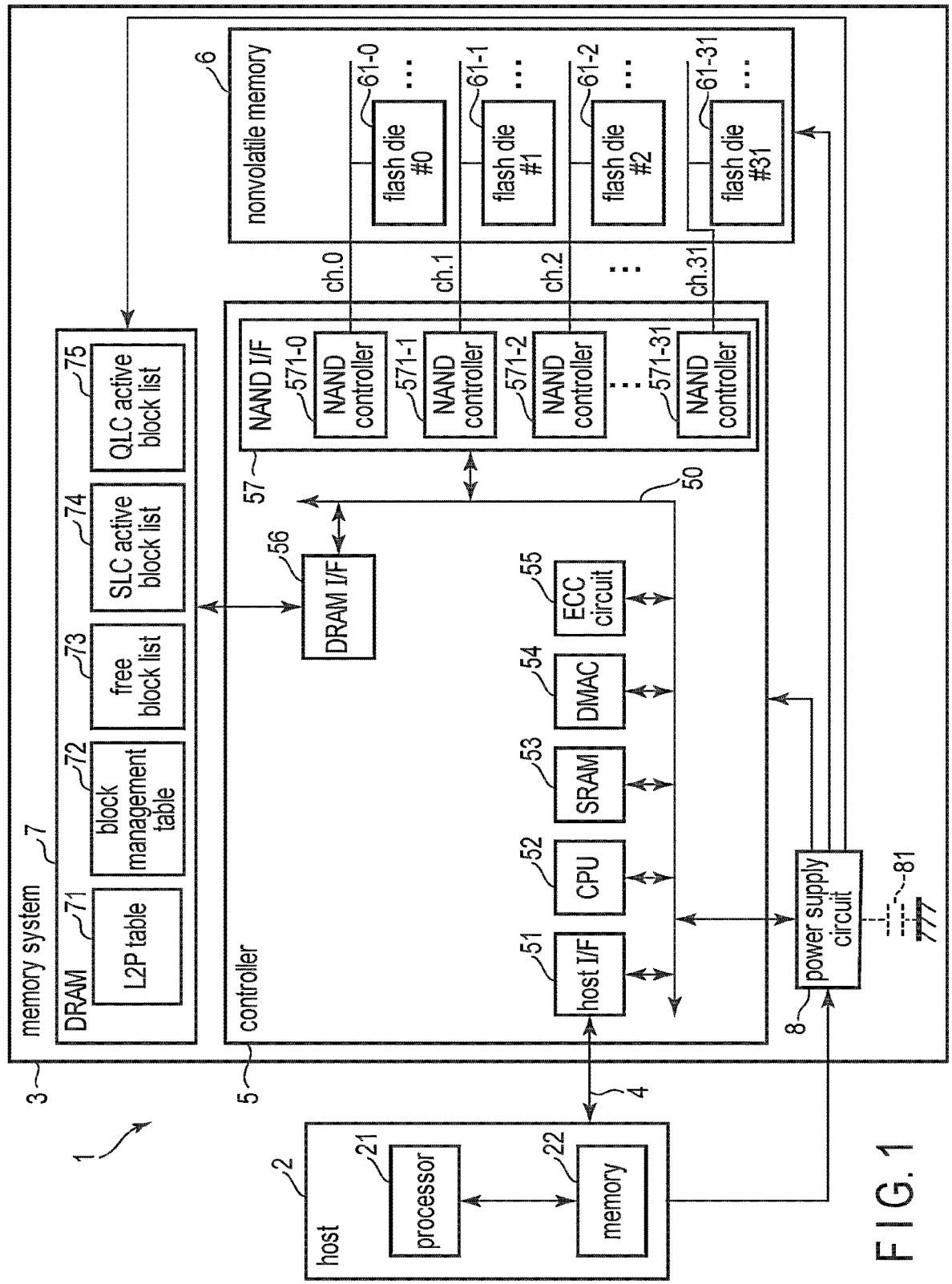
F I G. 1

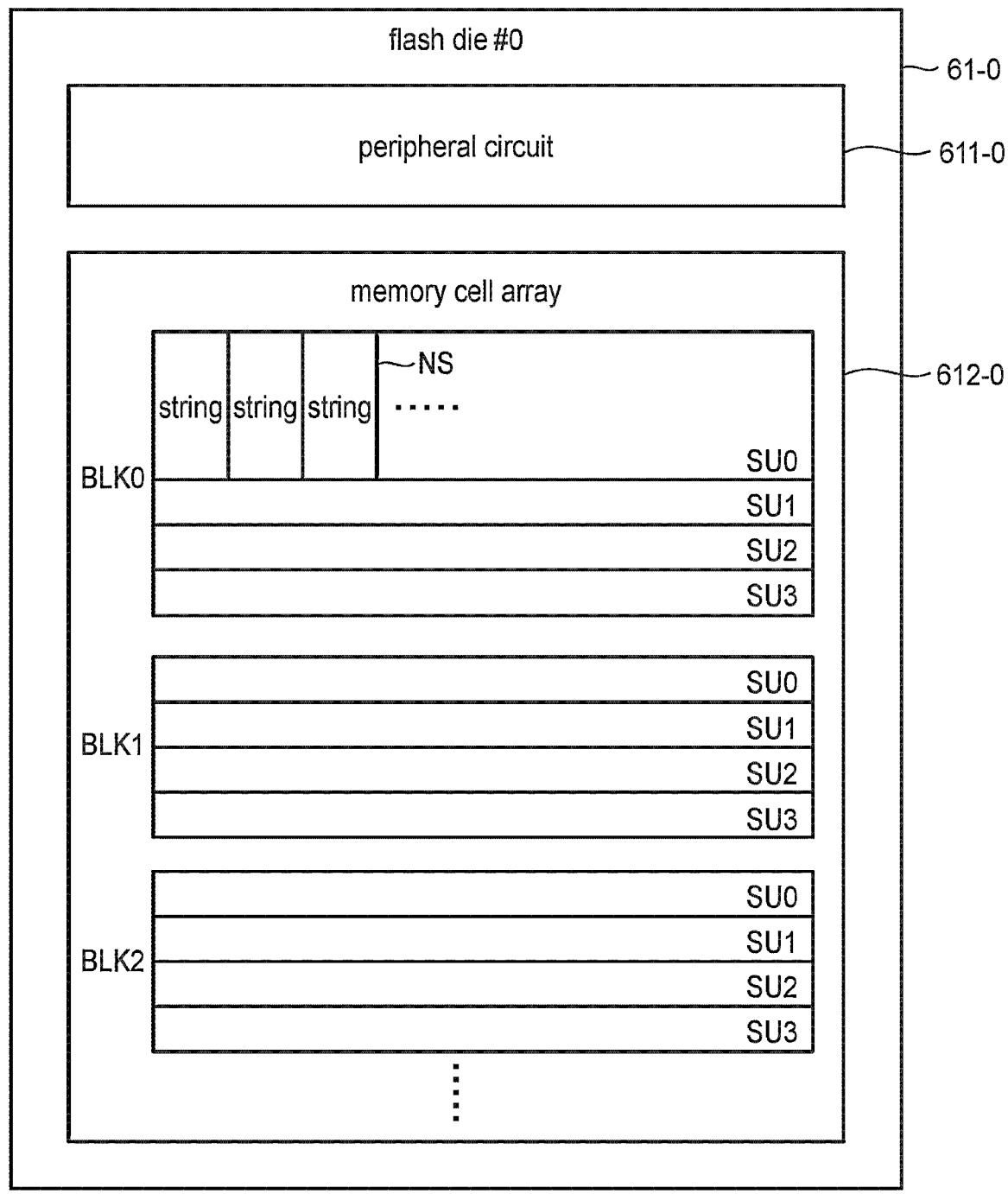
F I G. 2

|  |  | SU0 | SU1 | SU2 | SU3 |
|---|---|---|---|---|---|
| WL0 | foggy | 1 | 2 | 3 | 4 |
|  | fine | 6 | 8 | 10 | 12 |
| WL1 | foggy | 5 | 7 | 9 | 11 |
|  | fine | 14 | 16 | 18 | 20 |
| WL2 | foggy | 13 | 15 | 17 | 19 |
|  | fine | 22 | 24 | 26 | 28 |
| WL3 | foggy | 21 | 23 | 25 | 27 |
|  | fine | 30 | 32 | 34 | 36 |
| WL4 | foggy | 29 | 31 | 33 | 35 |
|  | fine | 38 | 40 | 42 | 44 |
| WL5 | foggy | 37 | 39 | 41 | 43 |
|  | fine | 46 | 48 | 50 | 52 |
| WL6 | foggy | 45 | 47 | 49 | 51 |
|  | fine | 54 | 56 | 58 | 60 |
| WL7 | foggy | 53 | 55 | 57 | 59 |
|  | fine | 61 | 62 | 63 | 64 |

FIG. 8

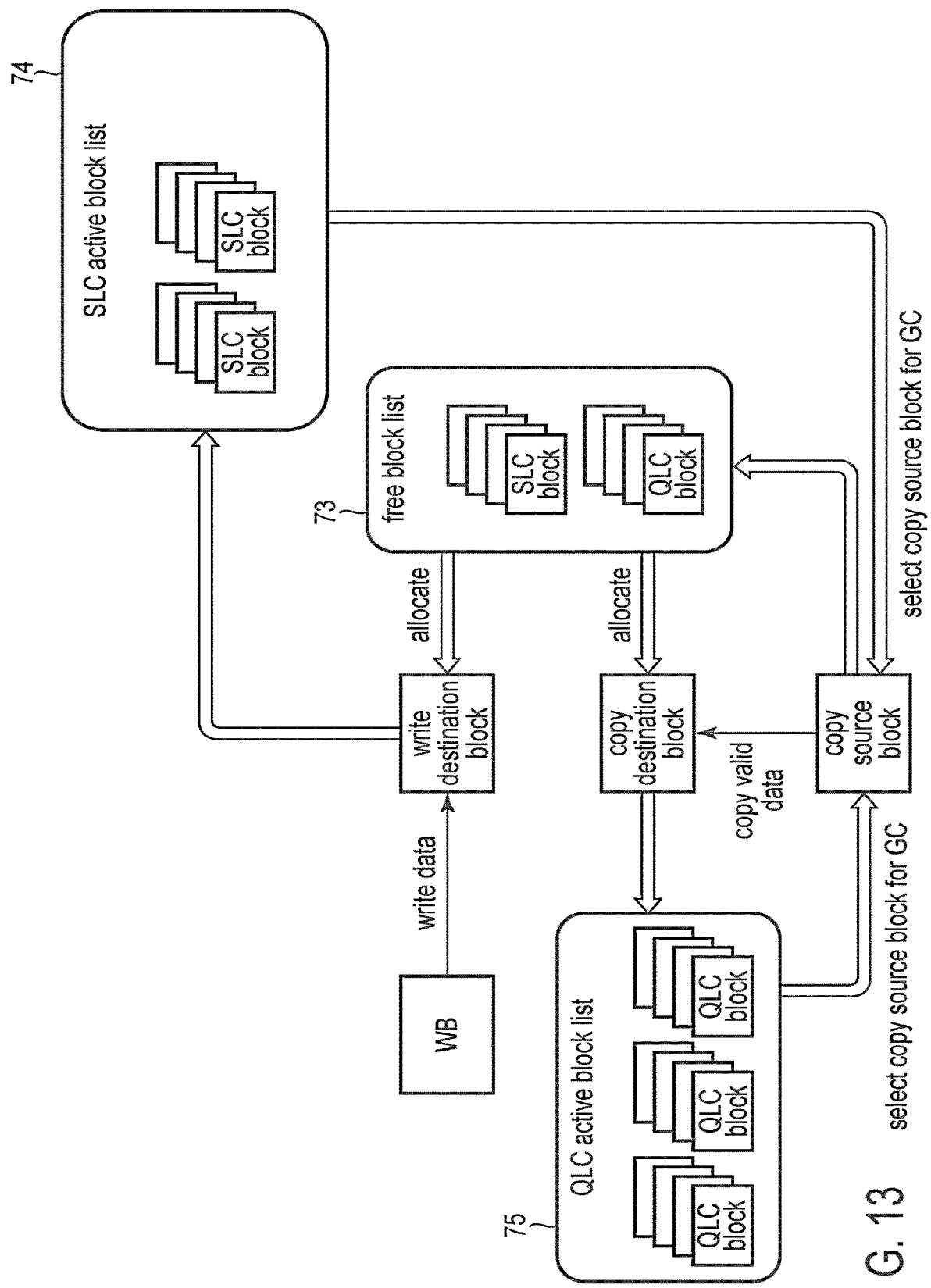
F I G. 13

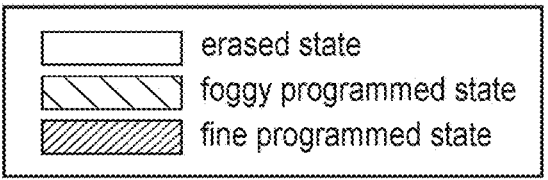
F I G. 14
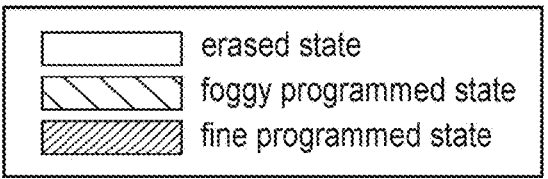
F I G. 15

| WL | string unit | state |
|---|---|---|
| 0 | SU0 | program interrupted state |
| | SU1 | fine programmed |
| | SU2 | fine programmed |
| | SU3 | fine programmed |
| 1 | SU0 | fine programmed |
| | SU1 | |
| | SU2 | |
| | SU3 | |
| 2 | SU0 | |
| | SU1 | |
| | SU2 | |
| | SU3 | | unreadable = foggy programmed state or program interrupted state? (SU0, WL0)

unreadable = foggy programmed state or program interrupted state? (SU0, WL1)

Legend:
- erased state
- foggy programmed state
- fine programmed state
- program interrupted state

FIG. 22

| WL | string unit | state |
|---|---|---|
| 0 | SU0 | foggy programmed |
| | SU1 | foggy programmed |
| | SU2 | foggy programmed |
| | SU3 | foggy programmed |
| 1 | SU0 | foggy programmed |
| | SU1 | |
| | SU2 | |
| | SU3 | |
| 2 | SU0 | |
| | SU1 | |
| | SU2 | |
| | SU3 | | unreadable = foggy programmed state or program interrupted state? (SU0, WL0)

unreadable = foggy programmed state or program interrupted state? (SU0, WL1)

Legend:
- erased state
- foggy programmed state
- fine programmed state
- program interrupted state

FIG. 23

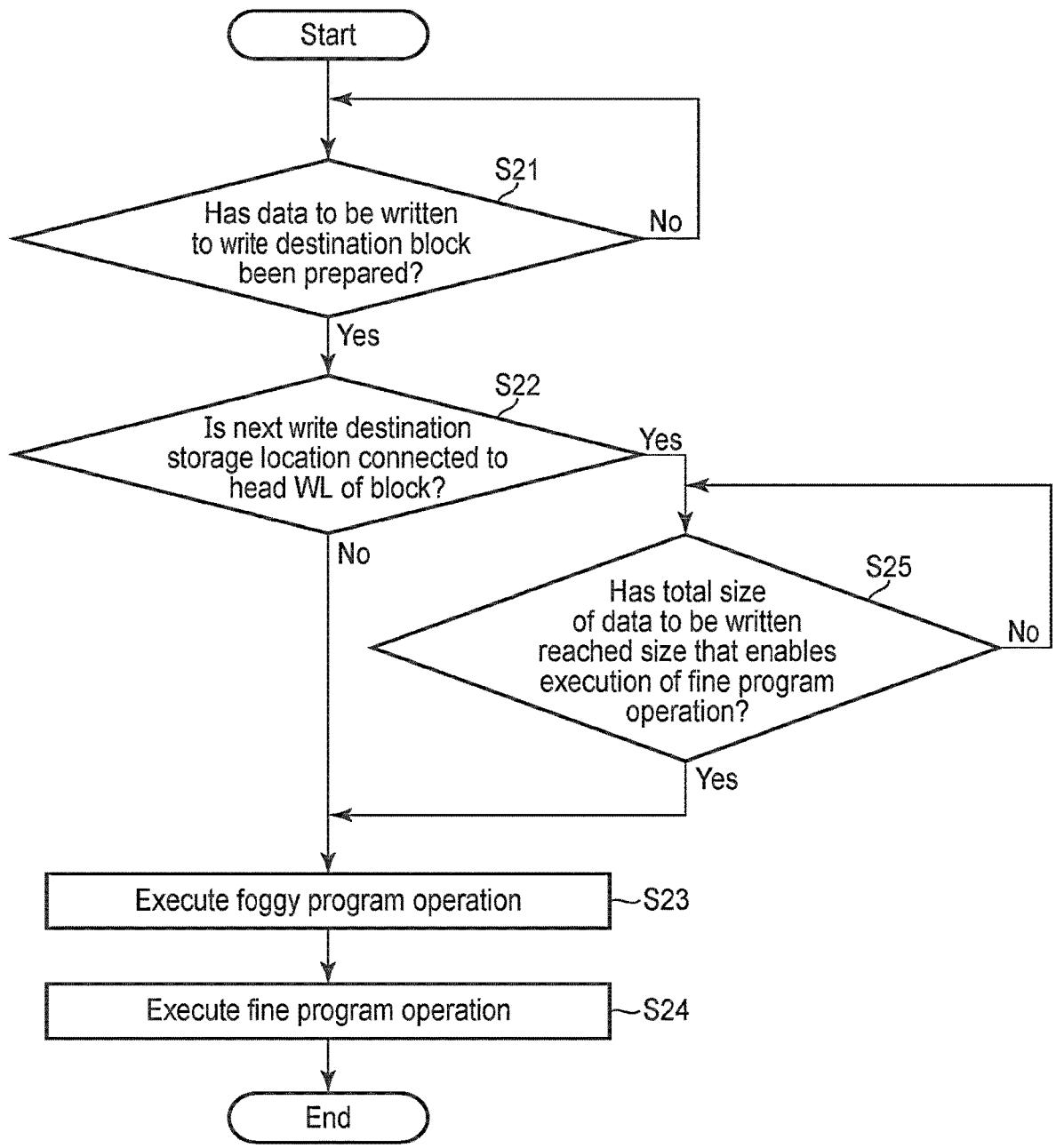
F I G. 29

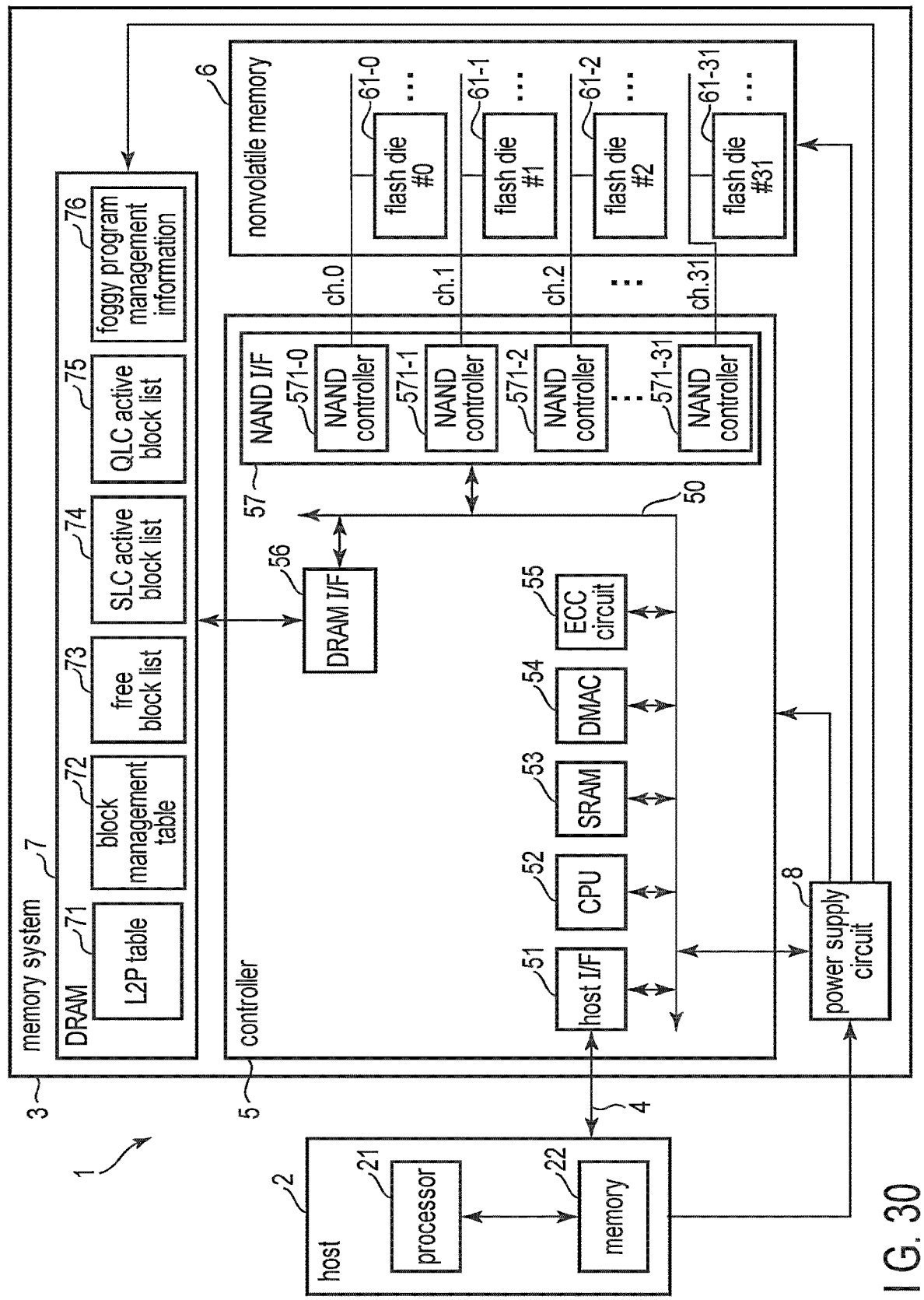
F I G. 30

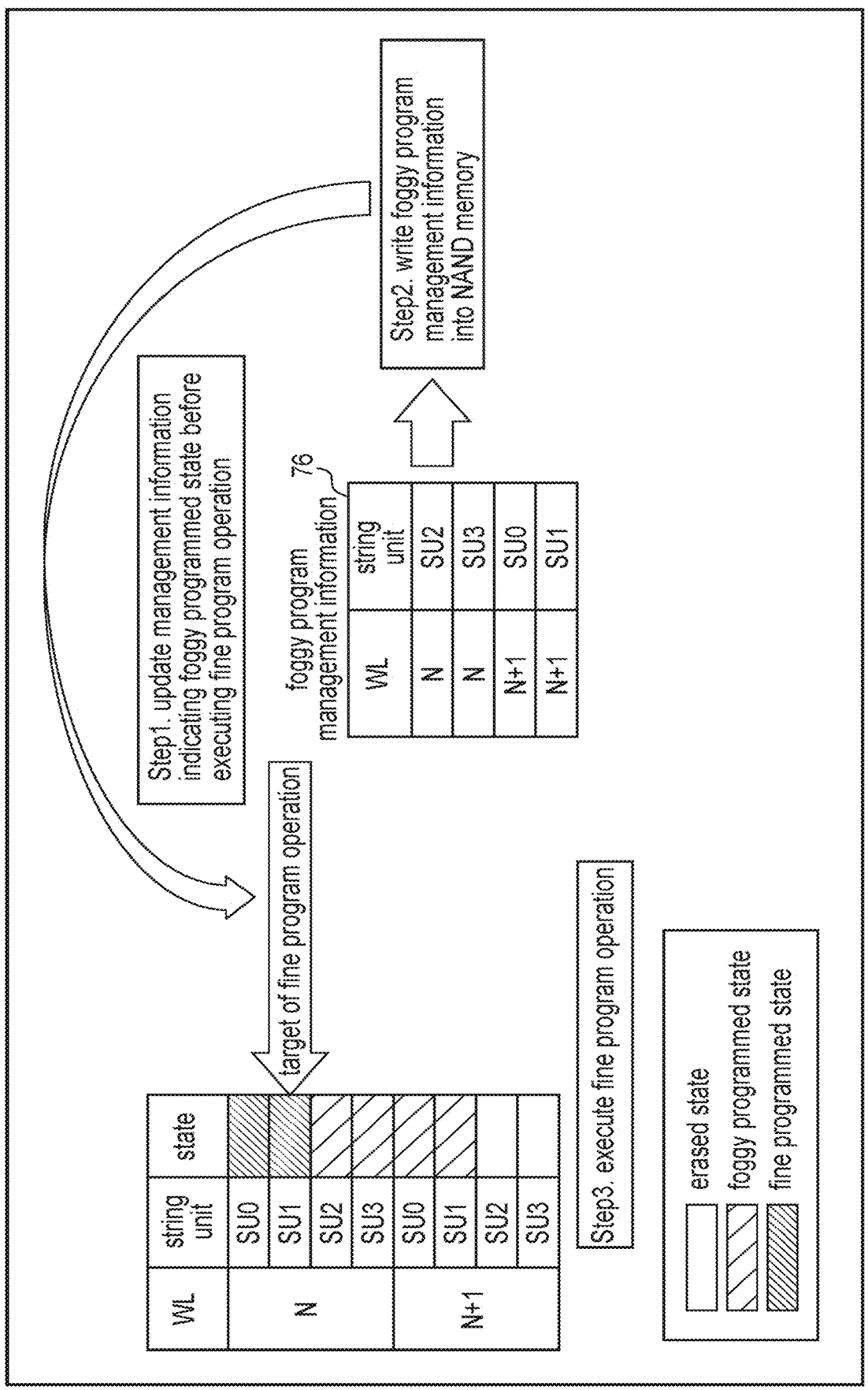
F I G. 32

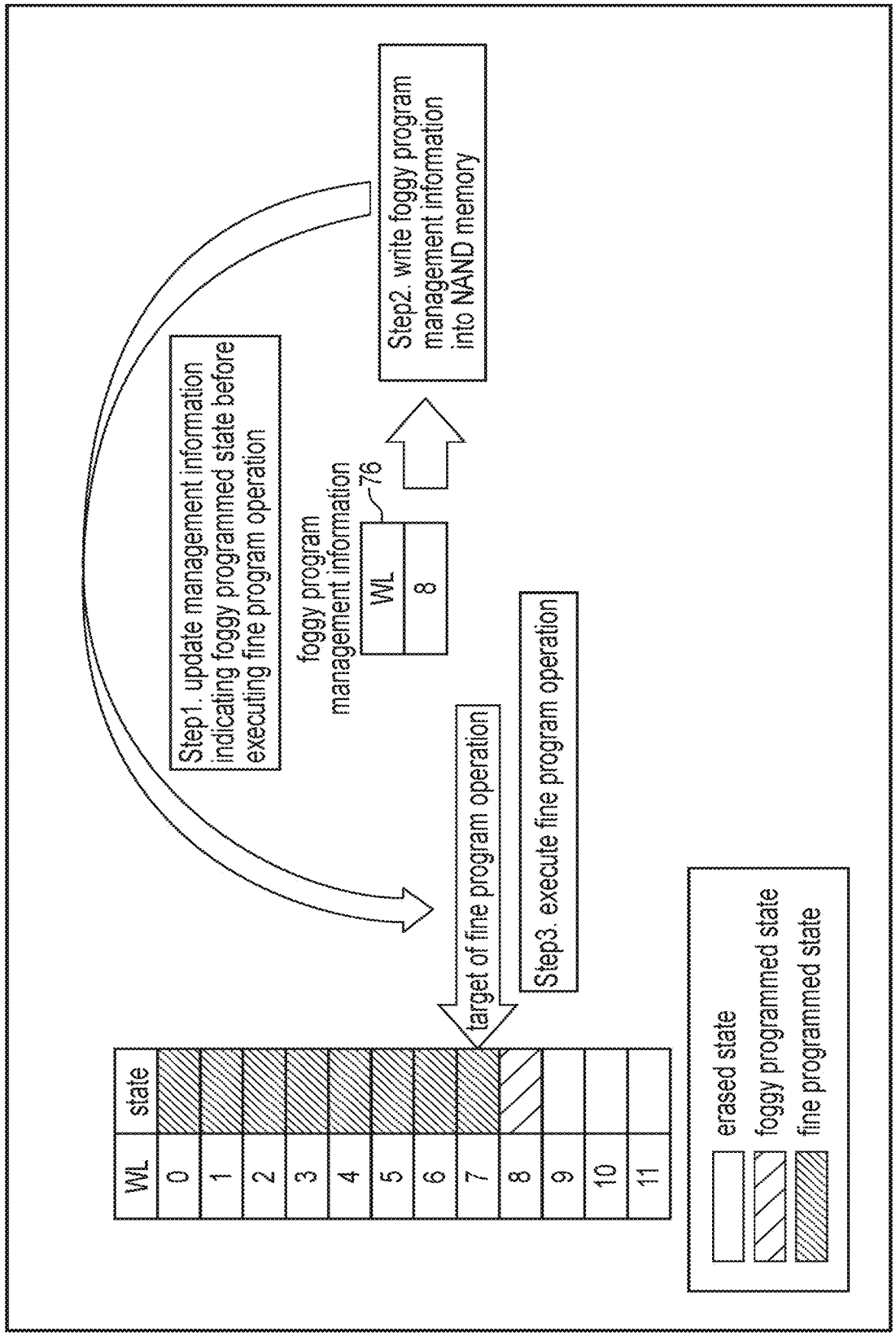
F I G. 34

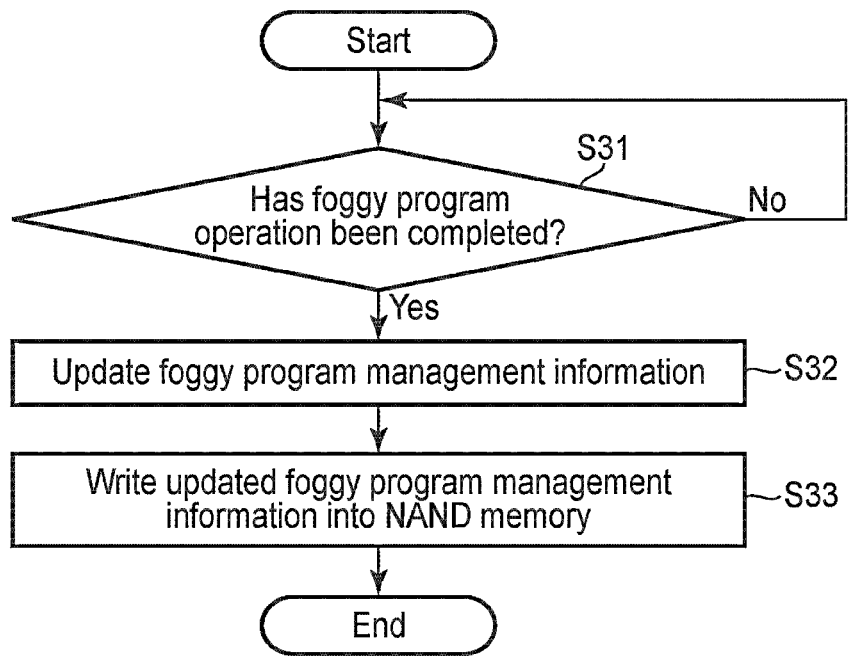
F I G. 35
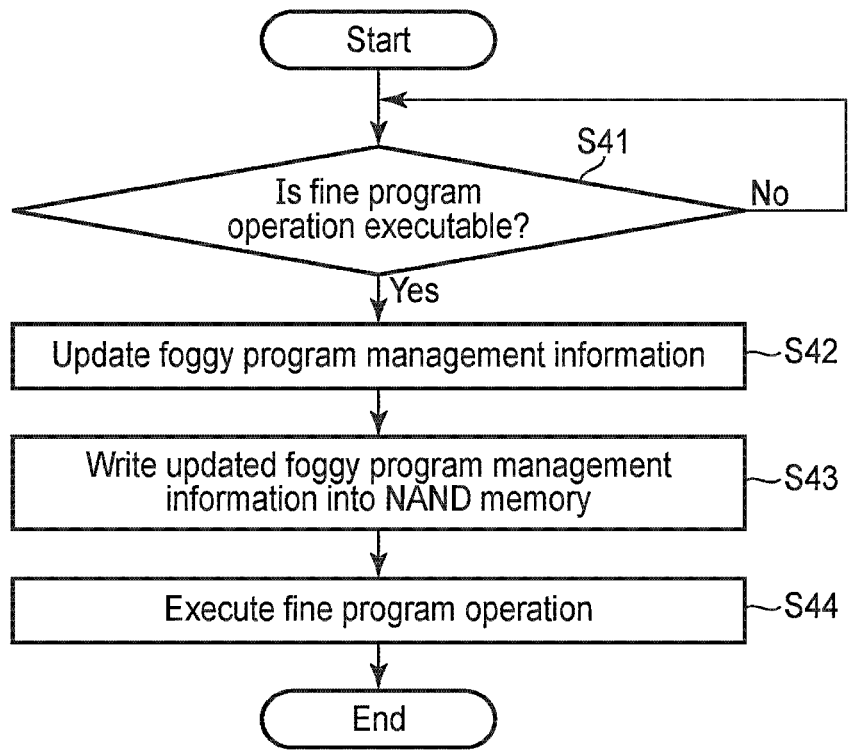
F I G. 36

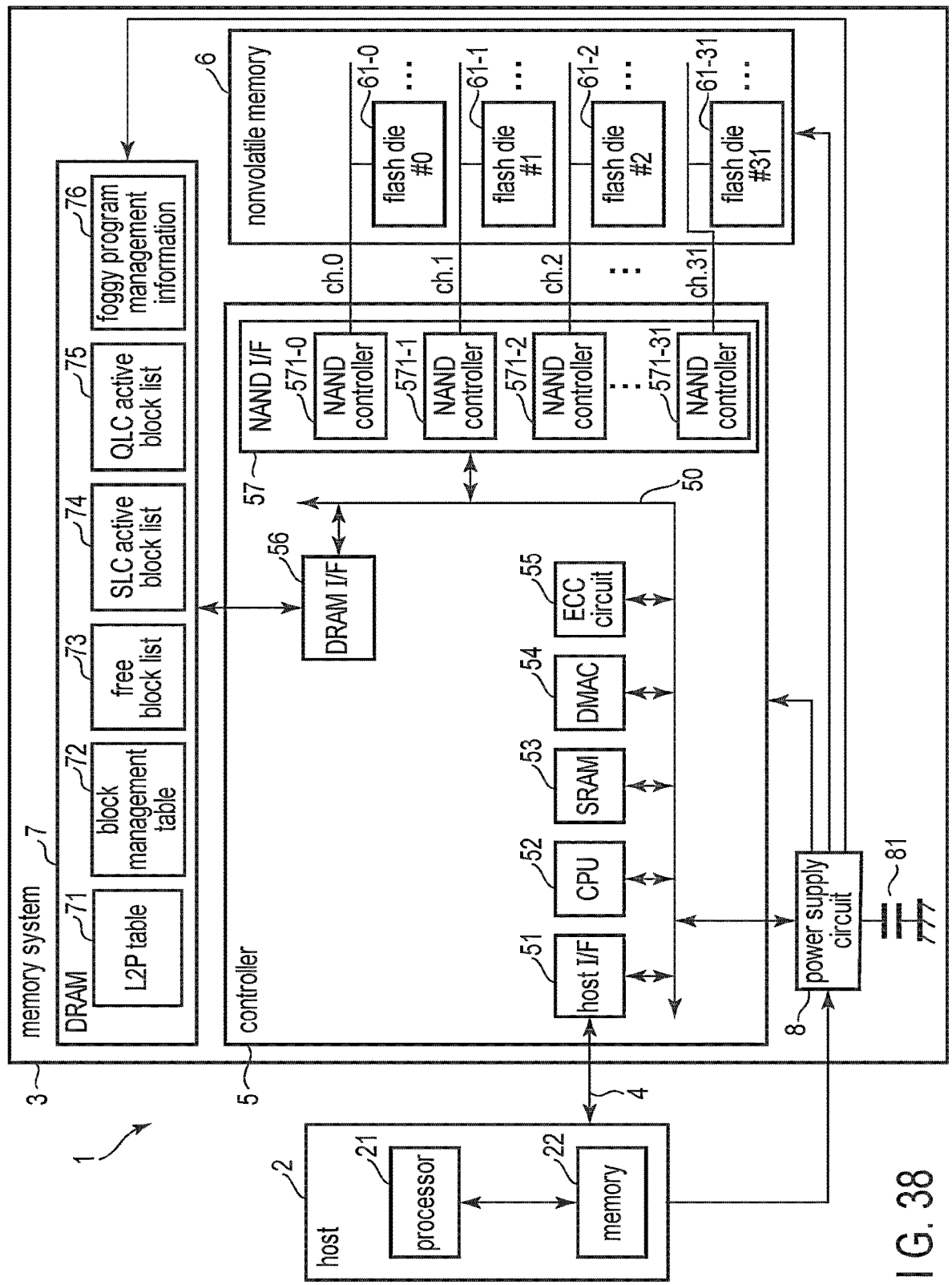
F I G. 38

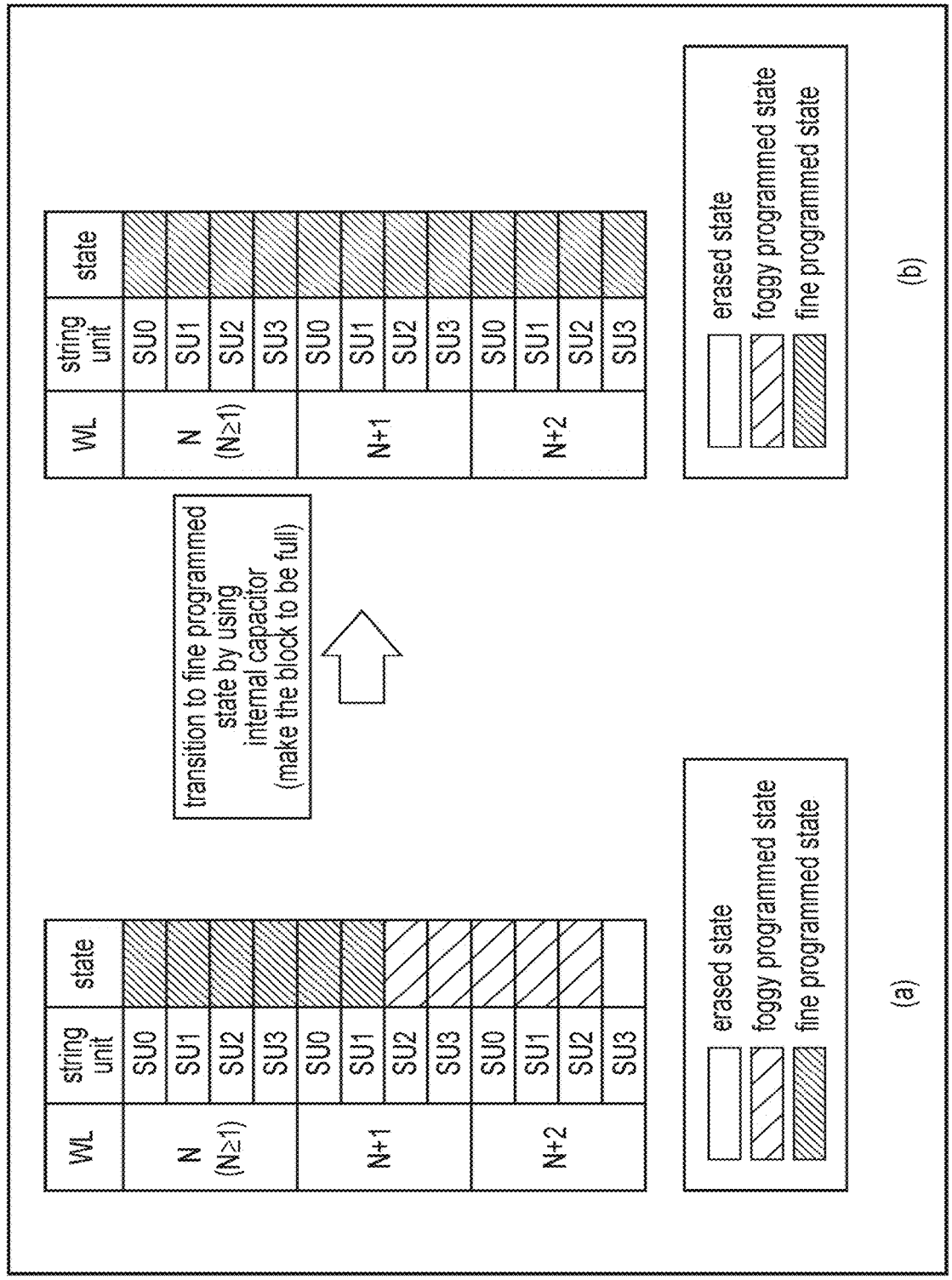
F I G. 42

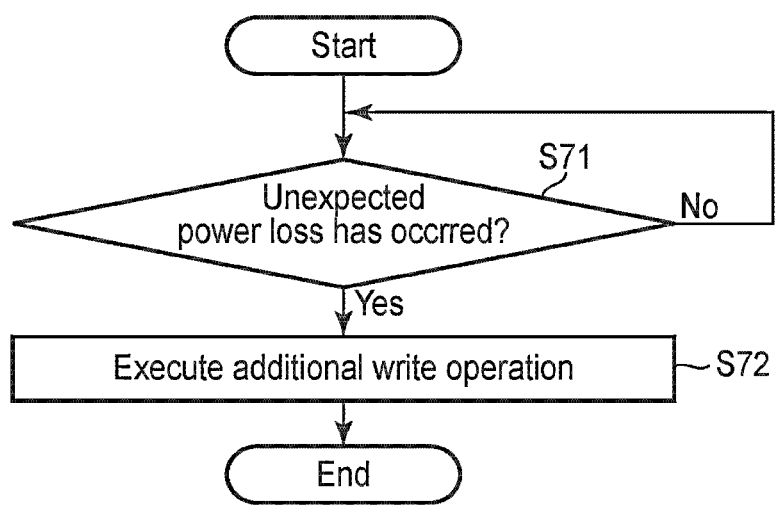
F I G. 43

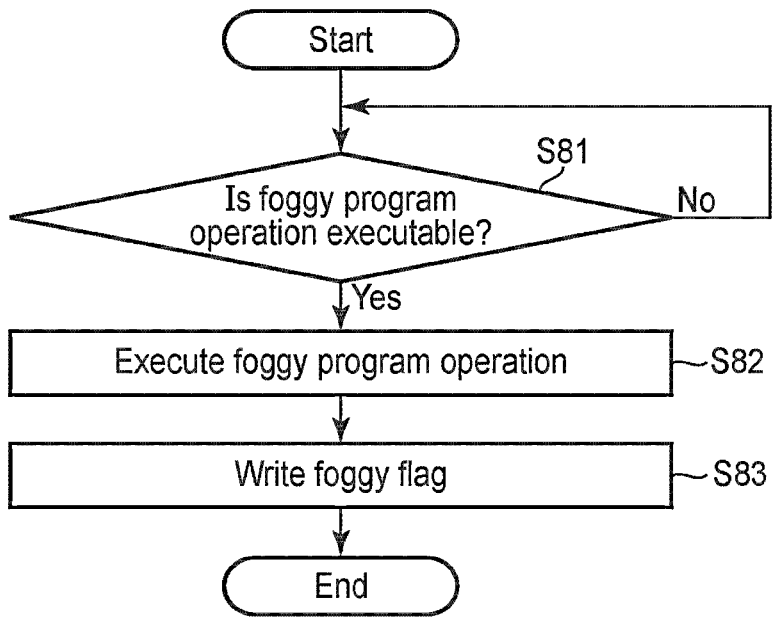
F I G. 46
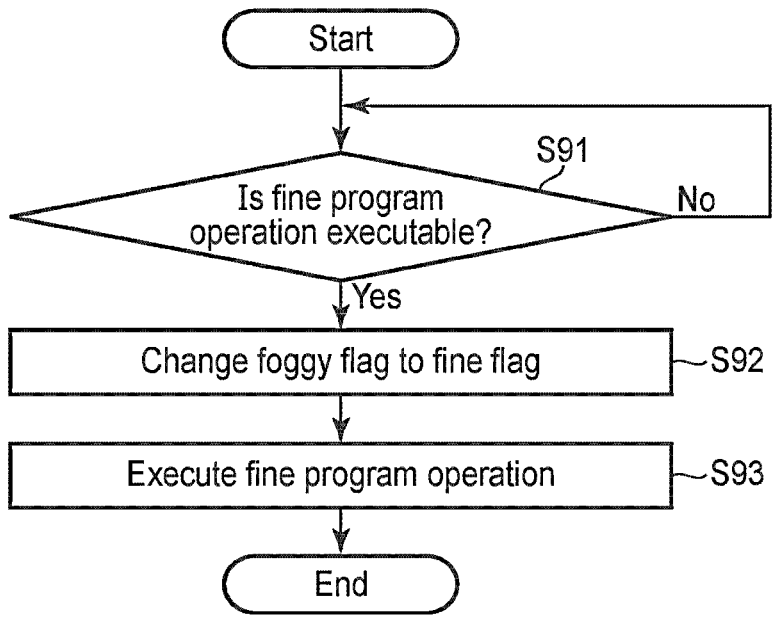
F I G. 47

MEMORY SYSTEM

CROSS-REFERENCE TO RELATED APPLICATIONS

This application is a division of and claims the benefit of priority under 35 U.S.C. § 120 from U.S. application Ser. No. 17/821,960 filed Aug. 24, 2022, and claims the benefit of priority under 35 U.S.C. § 119 from Japanese Patent Application No. 2022-035409 filed Mar. 8, 2022, the entire contents of each of which are incorporated herein by reference.

FIELD

Embodiments described herein relate generally to a technique for controlling a nonvolatile memory.

BACKGROUND

In recent years, memory systems that includes a nonvolatile memory are widely used. Such a memory system is used as a storage for various computing devices, such as computers, mobile devices, and in-vehicle devices.

For example, in a case where the memory system is incorporated in a mobile device having a removable battery, when the battery is removed from the mobile device, power supply to the memory system is suddenly shut off without any notice to the memory system.

In this case, a measure against unexpected power loss, which is caused by suddenly shutting off of power supplied to the memory system, needs to be taken.

BRIEF DESCRIPTION OF THE DRAWINGS

FIG. 1 is a block diagram illustrating an example of a configuration of an information processing system that includes a memory system according to a first embodiment.

FIG. 2 is a block diagram illustrating an example of a configuration of a NAND flash memory included in the memory system according to the first embodiment.

FIG. 8 illustrates a writing order in the multi-step program operations executed in the memory system according to the first embodiment.

FIG. 13 illustrates an example of data write operations according to a write command received from a host and a garbage collection operation, executed in the memory system according to the first embodiment.

FIG. 14 illustrates a relationship between foggy-fine program operations and an unexpected power loss determination process that are executed in a memory system according to a comparative example.

FIG. 15 illustrates a first example of a relationship between foggy-fine program operations and an unexpected power loss determination process that are executed in the memory system according to the first embodiment.

FIG. 16 illustrates a second example of the relationship between the foggy-fine program operations and the unexpected power loss determination process that are executed in the memory system according to the first embodiment.

FIG. 17 illustrates a third example of the relationship between the foggy-fine program operations and the unexpected power loss determination process that are executed in the memory system according to the first embodiment.

FIG. 18 illustrates a fourth example of the relationship between the foggy-fine program operations and the unexpected power loss determination process that are executed in the memory system according to the first embodiment.

FIG. 19 illustrates an example of a relationship between foggy-fine program operations, which are executed on the head word line of a write destination block, and the unexpected power loss determination process that are executed in the memory system according to the comparative example.

FIG. 22 illustrates a third example of the relationship between the foggy-fine program operations, which are executed on the head word line of the write destination block, and the unexpected power loss determination process that are executed in the memory system according to the first embodiment.

FIG. 23 illustrates a fourth example of the relationship between the foggy-fine program operations, which are executed on the head word line of the write destination block, and the unexpected power loss determination process that are executed in the memory system according to the first embodiment.

FIG. 29 is a flowchart illustrating the procedure of the data write operation executed in the memory system according to the first embodiment.

FIG. 30 is a block diagram illustrating an example of a configuration of an information processing system that includes a memory system according to a second embodiment.

FIG. 32 illustrates a fine program operation executed in the memory system according to the second embodiment.

FIG. 34 illustrates a fine program operation executed in the memory system according to the second embodiment in a case where each block includes only one string unit.

FIG. 35 is a flowchart illustrating the procedure of a process of updating and storing foggy program management information in response to completion of a foggy program operation, the process being executed in the memory system according to the second embodiment.

FIG. 36 is a flowchart illustrating the procedure of a process of updating and storing the foggy program management information before starting a foggy program operation, the process being executed in the memory system according to the second embodiment.

FIG. 38 illustrates an example of a configuration of an information processing system that includes a memory system according to a third embodiment.

FIG. 42 illustrates a state of each storage location of a block in which unexpected power loss occurred and a state of each storage location of the block after execution of the additional write operation, which are in the memory system according to the fourth embodiment.

FIG. 43 is a flowchart illustrating the procedure of the additional write operation executed in the memory system according to the fourth embodiment.

FIG. 46 is a flowchart illustrating the procedure of a foggy program operation executed in the memory system according to the fifth embodiment.

FIG. 47 is a flowchart illustrating the procedure of a fine program operation executed in the memory system according to the fifth embodiment.

DETAILED DESCRIPTION

Figure 3:
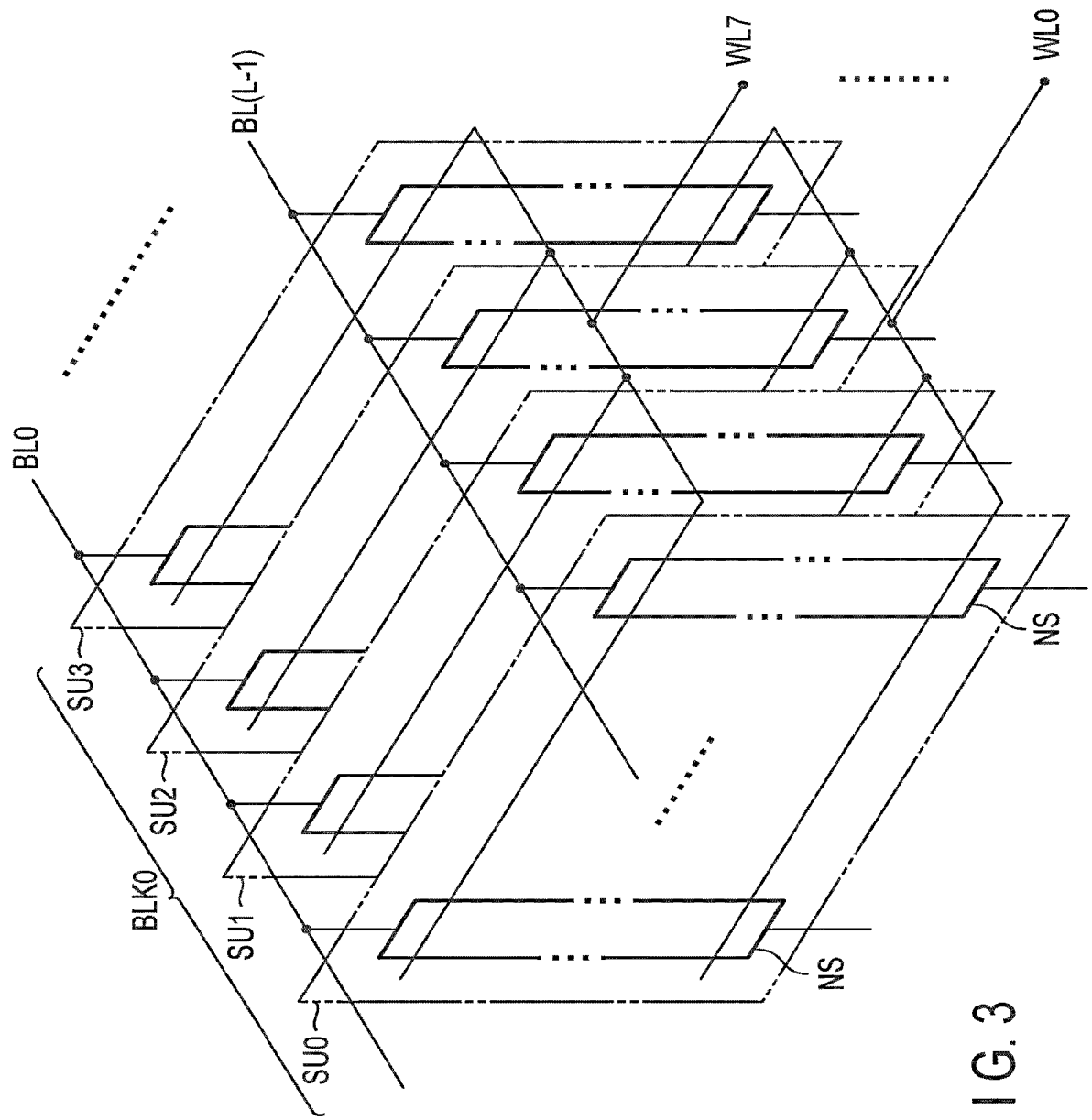
FIG. 3 illustrates an example of a configuration of a block of the NAND flash memory included in the memory system according to the first embodiment.

Various embodiments will be described hereinafter with reference to accompanying drawings.

In general, according to one embodiment, a memory system comprises a nonvolatile memory that includes a plurality of blocks, each of the plurality of blocks being a unit of a data erase operation and including a plurality of storage locations, each of the plurality of storage locations including a plurality of memory cells, and a controller electrically connected to the nonvolatile memory and configured to execute a data write operation on a write destination block among the plurality of blocks by using a multi-step program operation that includes at least a first step program operation and a second step program operation. The controller is configured to execute the data write operation on the plurality of storage locations of the write destination block in an order in which: the first step program operation on a first storage location of the write destination block is executed; after completion of the first step program operation on the first storage location, the first step program operation on a second storage location of the write destination block is executed; in response to completion of the first step program operation on the second storage location, the second step program operation on the first storage location is executed; and after completion of the second step program operation on the first storage location, the first step program operation on a third storage location of the write destination block is executed. In response to resuming of power supply to the memory system after shutoff of power supply to the memory system, the controller identifies, in a first block among the plurality of blocks, a fourth storage location on which the second step program operation is executed last among the plurality of storage locations of the first block according to the order. The controller determines whether a first condition that (A) a fifth storage location of the first block stores unreadable data and (B) each of the plurality of memory cells of a sixth storage location of the first block has a threshold voltage that corresponds to an erased state, is satisfied. Among the plurality of storage locations of the first block, according to the order, the first step program operation on the fourth storage location has been executed; after completion of the first step program operation on the fourth storage location, the first step program operation on the fifth storage location has been executed; in response to completion of the first step program operation on the fifth storage location, the second step program operation on the fourth storage location has been executed; and the first step program operation on the sixth storage location is to be executed after completion of the second step program operation on the fourth storage location. When the first condition is satisfied, the controller determines the sixth storage location of the first block as a next write destination storage location.

First Embodiment

FIG. 1 is a block diagram illustrating an example of a configuration of an information processing system 1 that includes a memory system 3 according to a first embodiment. The memory system 3 according to the first embodiment is a storage device including a nonvolatile memory.

The information processing system 1 includes a host (host device) 2 and the memory system 3. The host 2 and the memory system 3 are connectable through a bus 4.

The host 2 is an information processing device. The host 2 is, for example, a personal computer, a server computer, a mobile device, or an in-vehicle device. The host 2 accesses the memory system 3. Specifically, the host 2 transmits a write command, which is a command to write data, to the memory system 3. The host 2 transmits also a read command, which is a command to read data, to the memory system 3.

The memory system 3 is a semiconductor storage device. The memory system 3 is, for example, a solid state drive (SSD) or a universal flash storage (UFS) device. The memory system 3 includes a nonvolatile memory. The memory system 3 writes data into the nonvolatile memory. The memory system 3 reads data from the nonvolatile memory.

The bus 4 conforms to, for example, PCI Express™ (PCIe™) standard or Mobile Industry Processor Interface™ (MIPI™) standard. The bus 4 is a communication path that connects the host 2 and the memory system 3. The bus 4 is used to transmit data and an input/output (I/O) command from the host 2 to the memory system 3 and transmit data and a response from the memory system 3 to the host 2. The I/O command is a command for writing or reading data to or from the nonvolatile memory. Such an I/O command includes a write command and a read command.

An internal configuration of the host 2 will then be described. The host 2 includes a processor 21 and a memory 22.

The processor 21 is, for example, a central processing unit (CPU). The processor 21 communicates with the memory system 3 through the bus 4. The processor 21 executes a software (host software) that is loaded from the memory system 3 or another storage device connected to the host 2, onto the memory 22. The host software includes an operating system, a file system, a device driver, and an application program.

The memory 22 is, for example, a volatile memory. The memory 22 is, for example, a dynamic random access memory (DRAM).

An internal configuration of the memory system 3 will then be described. The memory system 3 includes a controller 5 and a nonvolatile memory 6. An example of the nonvolatile memory 6 is a NAND flash memory. Hereinafter, the nonvolatile memory 6 will be referred to as a NAND memory 6.

The controller 5 is a memory controller. The controller 5 is, for example, a semiconductor device, such as a system-on-a-chip (SoC). The controller 5 is electrically connected to the NAND memory 6. The controller 5 executes data writing to the NAND memory 6 and data reading from the NAND memory 6. In addition, the controller 5 executes communication with the host 2 through the bus 4. A physical interface connecting the controller 5 and the NAND memory 6 conforms to, for example, a Toggle NAND flash interface or an open NAND flash interface (ONFI). The function of each unit in the controller 5 may be realized by a dedicated hardware, a processor executing programs, or a combination thereof.

The NAND memory 6 is, for example, a flash memory of a two-dimensional structure or a flash memory of a three-dimensional structure. The NAND memory 6 includes multiple blocks. Each of the blocks is a minimum unit of erasing data stored in the NAND memory 6, that is, a unit of a data erase operation.

The memory system 3 may include a dynamic random access memory (DRAM) 7. The DRAM 7 is a volatile memory. A part of the storage area of the DRAM 7 temporarily stores, for example, write data received from the host 2 or read data read from the NAND memory 6. In other words, the DRAM 7 may be used as a write buffer or a read buffer.

The memory system 3 may further include a power supply circuit 8. The power supply circuit 8 is a power supply control circuit. The power supply circuit 8 supplies, for example, each component of the memory system 3 with power that is supplied from the host 2.

An internal configuration of the controller 5 will then be described. The controller 5 includes a host interface (host I/F) 51, a CPU 52, a static RAM (SRAM) 53, a direct memory access controller (DMAC) 54, an error checking and correction (ECC) circuit 55, a DRAM interface (DRAM I/F) 56, and a NAND interface (NAND I/F) 57. These units are interconnected through an internal bus 50.

The host interface 51 is a hardware interface circuit. The host interface 51 executes communication with the host 2. The host interface 51, for example, receives an I/O command from the host 2.

The CPU 52 is a processor. The CPU 52 controls the host interface 51, the SRAM 53, the DMAC 54, the ECC circuit 55, the DRAM interface 56, and the NAND interface 57. The CPU 52 loads a control program (firmware) stored in the NAND memory 6 or a ROM (not shown), onto the SRAM 53, and executes the firmware to perform various processes. The firmware may be loaded onto the DRAM 7.

The CPU 52 functions as, for example, a flash translation layer (FTL) configured to execute management of data stored in the NAND memory 6 and management of blocks included in the NAND memory 6. The management of data stored in the NAND memory 6 includes, for example, management of mapping information indicating a correspondence relationship between each logical address and each physical address. The logical address is an address used by the host 2 for accessing the memory system 3. The logical address is, for example, a logical block address (LBA). The physical address is an address that indicates a location of a physical storage element included in the NAND memory 6. The CPU 52 manages mapping between each logical address and each physical address by using a logical-to-physical translation table (L2P table) 71. The management of blocks included in the NAND memory 6 includes, for example, garbage collection, management of defective blocks (bad blocks), and wear leveling.

The SRAM 53 is a volatile memory. The SRAM 53 is used as, for example, a work area for the CPU 52. A part of the storage area of the SRAM 53 may be used as a write buffer or a read buffer.

The DMAC 54 is a circuit that executes direct memory access (DMA). The DMAC 54 executes data transfer between the memory 22 of the host 2 and the DRAM 7 or the SRAM 53.

The ECC circuit 55 is a circuit that executes data encoding and data decoding. The ECC circuit 55 executes an encoding process when data is written into the NAND memory 6. In the encoding process, the ECC circuit 55 adds an ECC parity, which is a redundant code, to the data to be written. The ECC circuit 55 executes a decoding process by using an ECC parity that is added to data read from the NAND memory 6. In the decoding process, the ECC circuit 55 corrects an error in the read data. When succeeding in correcting the error in the data read from the NAND memory 6, that is, when having corrected the error in the read data, the ECC circuit 55 sends an ECC pass notice to the CPU 52. When failing in correcting the error in the data read from the NAND memory 6, that is, when not having corrected the error in the read data, the ECC circuit 55 notifies the CPU 52 of an ECC error.

The DRAM interface 56 is a circuit that controls the DRAM 7. The DRAM interface 56 stores data in the DRAM 7 and reads data stored in the DRAM 7.

The NAND interface 57 is a circuit that controls the NAND memory 6. The NAND interface 57 includes, for example, NAND controllers 571-0, 571-1, 571-2, ..., and 571-31. Each of the NAND controllers 571-0, 571-1, 571-2, ..., and 571-31 is connected to one or more flash dies included in the NAND memory 6, through a corresponding one channel of one or more channels (ch) 0, 1, 2, ..., and 31. The flash die is referred to also as a flash chip. The NAND controllers 571-0, 571-1, 571-2, ..., and 571-31 control, for example, a flash die (#0) 61-0, a flash die (#1) 61-1, ..., and a flash die (#31) 61-31, respectively, which are included in the NAND memory 6.

Information stored in the DRAM 7 will then be described. The information stored in the DRAM 7 includes the L2P table 71, a block management table 72, a free block list 73, a single-level cell (SLC) active block list 74, and a quad-level cell (QLC) active block list 75. Some or all of the L2P table 71, the block management table 72, the free block list 73, the SLC active block list 74, and the QLC active block list 75 may be stored not in the DRAM 7 but in the SRAM 53.

The L2P table 71 manages mapping between each logical address and each physical address with a certain size unit, such as a sector.

The block management table 72 manages each of blocks of the NAND memory 6. The block management table 72 manages the blocks to indicate whether each block is available.

The free block list 73 manages each of blocks of the NAND memory 6 in which valid data is not stored, as a free block. Data stored in each block is roughly divided into valid data and invalid data. The valid data means the latest data to which the L2P table 71 refers. Specifically, the valid data is data stored in a physical storage element whose location is specified by a physical address that is associated with (i.e., mapped to) a logical address. The valid data is data to possibly be read by the host 2 later. On the other hand, the invalid data means old data to which the L2P table 71 no longer refers. Specifically, the invalid data is data stored in a physical storage element whose location is specified by a physical address that is not associated with (i.e., not mapped to) a logical address. The invalid data is data not to be read by the host 2 anymore.

The SLC active block list 74 and the QLC active block list 75 manage active blocks of the NAND memory 6. The active block stores at least valid data. Specifically, the SLC active block list 74 manages active blocks each storing valid data written in an SLC mode. The SLC mode is a writing mode in which 1-bit data is stored in one memory cell of the NAND memory 6. The QLC active block list 75 manages active blocks each storing valid data written in a QLC mode. The QLC mode is a writing mode in which 4-bit data is stored in one memory cell of the NAND memory 6.

An example of a configuration of the flash die 61 included in the NAND memory 6 will then be described. FIG. 2 is a block diagram illustrating an example of the configuration of the flash die 61 of the NAND memory 6 included in the memory system 3 according to the first embodiment.

The configuration of the flash die 61 will be described with focusing on the flash die (#0) 61-0. Other flash dies are the same in configuration as the flash die (#0) 61-0. The flash die (#0) 61-0 includes a peripheral circuit 611-0 and a memory cell array 612-0.

The peripheral circuit 611-0 controls the memory cell array 612-0. The peripheral circuit 611-0 includes, for example, a row decoder, a column decoder, a sense amplifier, a latch circuit, and a voltage generation circuit. In response to reception of an address and a command from the NAND controller 571-0, the peripheral circuit 611-0 executes a program operation, a read operation, or a data erase operation on the memory cell array 612-0.

The memory cell array 612-0 includes a plurality of blocks (BLK0, BLK1, BLK2, ...). Each block BLK is a set of nonvolatile memory cell transistors (which will hereinafter be simply referred to as memory cell transistors or memory cells). Each block includes a plurality of string units (SU0, SU1, SU2, and SU3). Each string unit SU is a set of memory cell transistors. Each string unit SU includes a plurality of NAND strings NS (which is also simply referred to as strings). Each NAND string NS is a set of memory cell transistors.

FIG. 2 illustrates a case where each block includes four string units SU0, SU1, SU2, and SU3. The number of string units SU included in each block may be three or less, or may be five or more. A configuration in which each block includes only one string unit SU may also be adopted. In short, each block includes one or more string units SU.

A configuration example of the block will then be described. FIG. 3 illustrates an example of the configuration of the block of the NAND memory 6 included in the memory system 3 according to the first embodiment.

In FIG. 3, the configuration of the block will be described with focusing on the block BLK0. Other blocks are the same in configuration as the block BLK0. The block BLK0 includes four string units (SU0, SU1, SU2, and SU3). The four string units (SU0, SU1, SU2, and SU3) are arranged in a direction (horizontal direction) orthogonal to a direction (vertical direction) in which a plurality of word lines WL0 to WL7 are stacked. Each string unit SU includes a plurality of NAND strings NS. One end of each NAND string NS is connected to the corresponding bit line among a plurality of bit lines (BL0 to BL L−1)). Each NAND string NS extends in the vertical direction. Control gates of the memory cell transistors included in each NAND string NS are connected to the word lines (WL0, WL1, ..., WL7), respectively.

Figure 4:
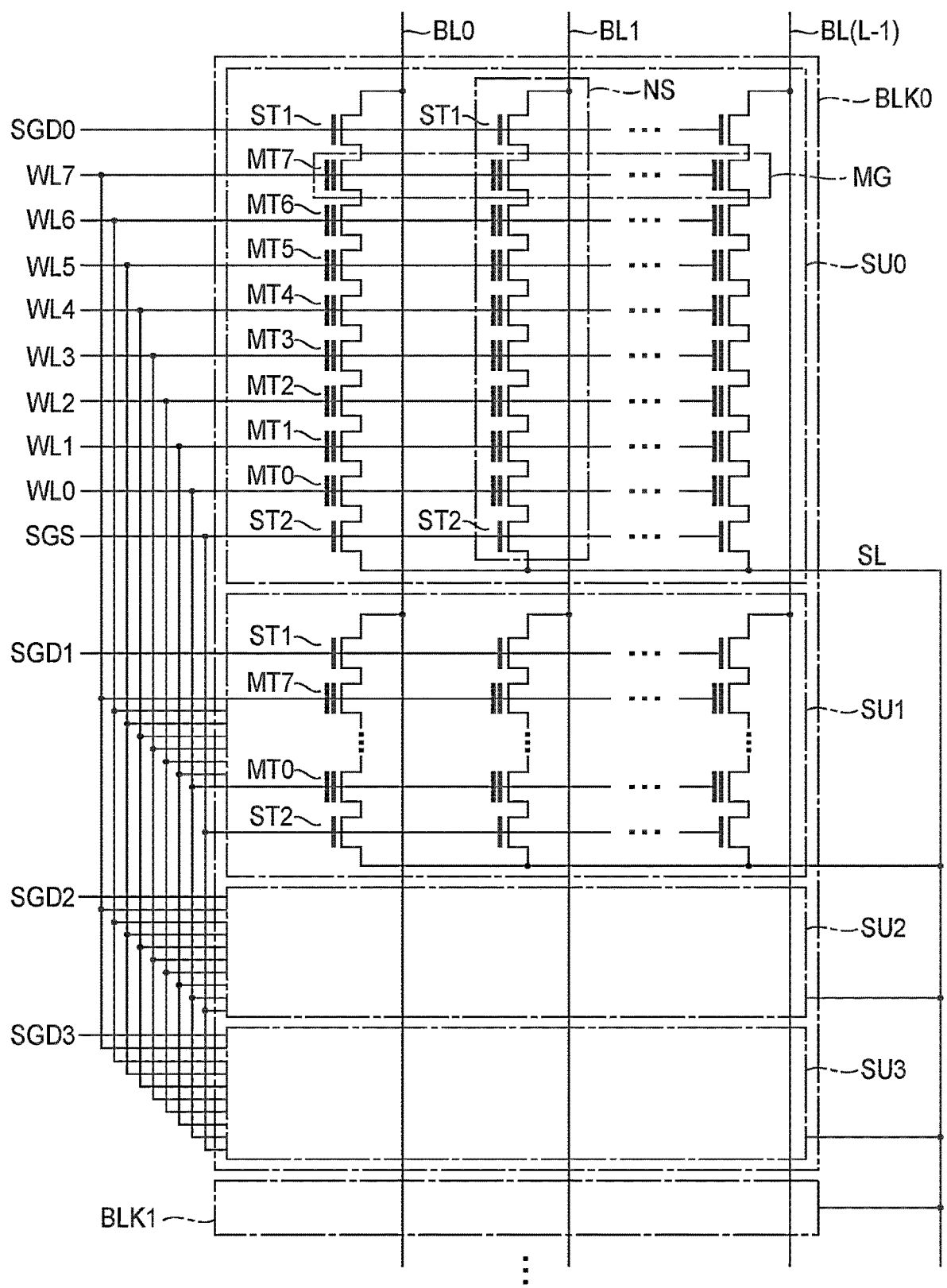
FIG. 4 illustrates an example of a circuit configuration of the block of the NAND flash memory included in the memory system according to the first embodiment.

A circuit configuration of the block will then be described. FIG. 4 illustrates an example of the circuit configuration of the block of the NAND memory 6 included in the memory system 3 according to the first embodiment.

In FIG. 4, the configuration of the block will be described with focusing on the block BLK0. Other blocks are the same in configuration as the block BLK0. The block BLK0 includes four string units (SU0, SU1, SU2, and SU3). Each string unit SU includes a plurality of NAND strings NS.

Each NAND string NS includes, for example, eight memory cell transistors MT (MT0 to MT7) and two selection transistors ST1 and ST2. Each memory cell transistor MT includes a control gate and a charge accumulation layer, and stores data in a nonvolatile manner. The memory cell transistors MT (MT0 to MT7) are connected in series between the source of the selection transistor ST1 and the drain of the selection transistor ST2. The number of memory cell transistors MT in the NAND string NS is not limited to eight.

Gates of respective selection transistors ST1 of the string unit SU0 are connected to a selection gate line SGD0 that corresponds to the string unit SU0. Gates of respective selection transistors ST1 of the string unit SU1 are connected to a selection gate line SGD1 that corresponds to the string unit SU1. Gates of respective selection transistors ST1 of the string unit SU2 are connected to a selection gate line SGD2 that corresponds to the string unit SU2. Gates of respective selection transistors ST1 of the string unit SU3 are connected to a selection gate line SGD3 that corresponds to the string unit SU3. In contrast, gates of selection transistors ST2 of the string units SU0 to SU3 are all connected commonly to a selection gate line SGS. The gates of the selection transistors ST2 of the string unit SU0 to the string unit SU3, however, may be connected respectively to a selection gate line (SGS0) to a selection gate line (SGS3), which are different from each other. Control gates of the memory cell transistors MT0 to MT7 in the same block BLK are commonly connected to the word lines WL0 to WL7, respectively.

A program operation and a read operation by the peripheral circuit 611 can each be collectively executed on a plurality of memory cells MT that are connected to one word line in one string unit SU. A set of memory cells MT that are selected collectively at execution of the program operation or the read operation is referred to as a memory cell group MG. The memory cell group MG is a unit of the program operation and of the read operation, and is treated as a storage location. The size of data that is stored in each memory cell group MG in a case where each memory cell MT is configured to store 1-bit data is referred to as a page. In a case where each memory cell MT is configured to store 4-bit data, the size of data stored in each memory cell group MG is 4 pages.

A data erase operation by the peripheral circuit 611 is executed in units of blocks. In other words, the data, which is stored in every memory cell MT included in one block, is erased collectively.

Figure 5:
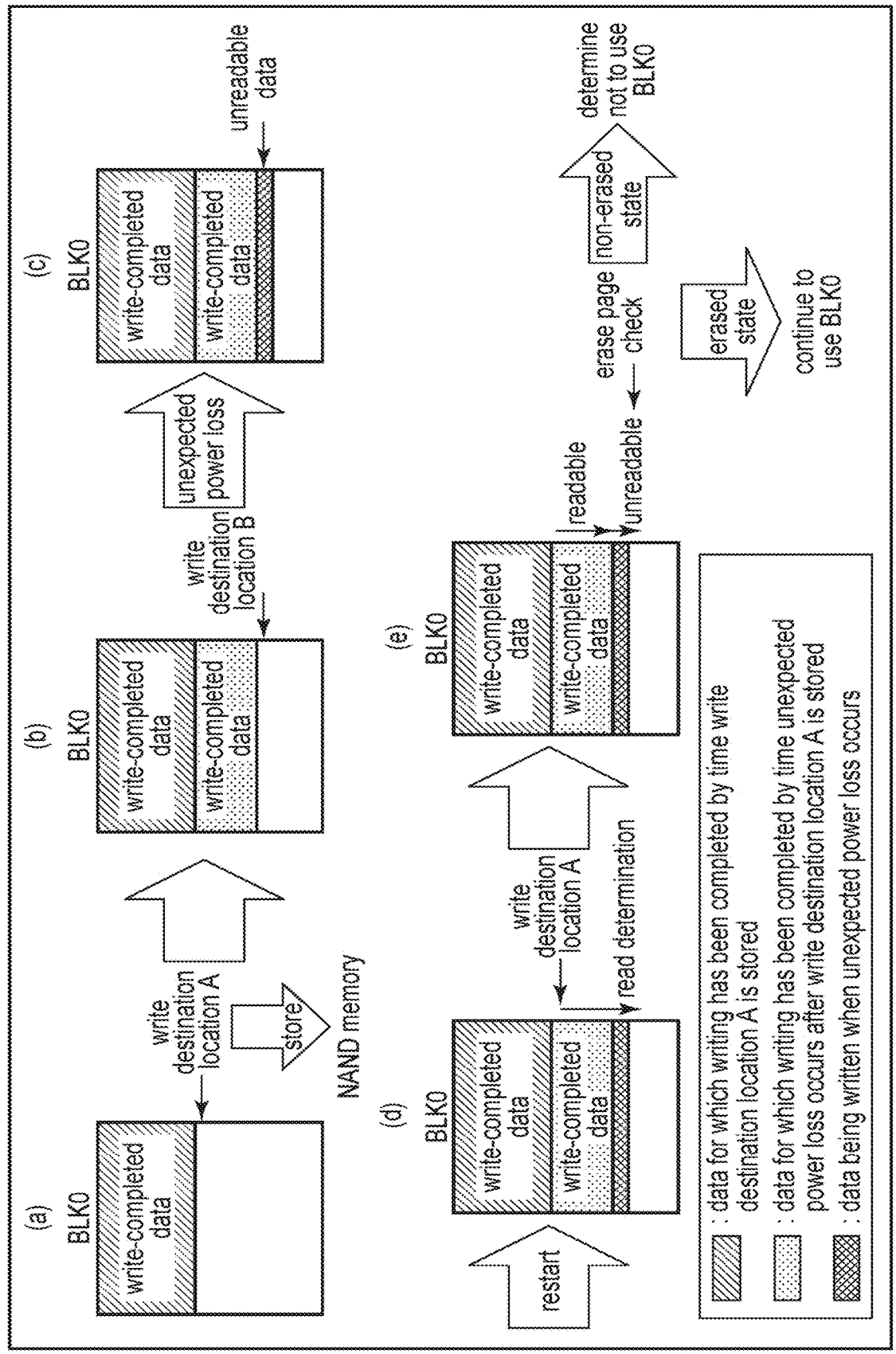
FIG. 5 illustrates a state of data in a block when unexpected power loss occurred during a data write operation and a state of data in the block when the memory system is restarted, in the memory system according to the first embodiment.

A restart process that is executed after unexpected power loss occurred during a data write operation will be described. FIG. 5 illustrates a state of data in the block BLK0 when unexpected power loss occurred during a data write operation, and a state of data in the block BLK0 when the memory system 3 is restarted, in the memory system 3 according to the first embodiment. Hereinafter, a case where a data write operation is executed by using a full sequence program operation will be described. The full sequence program operation is a program operation by which data is written into one storage location (memory cell group MG) in one string unit SU at a time. The program operation includes, for example, one or more program loops. Each program loop includes a first operation of injecting charges into the charge accumulation layer of the memory cell MT to increase a threshold voltage of the memory cell MT, and a second operation of verifying whether the threshold voltage of the memory cell MT is equal to or higher than a voltage corresponding to data to be written.

(a) The controller 5 executes a data write operation on the block BLK0, which is allocated as a write destination block, using the full sequence program operation. Data stored in each storage location where the program operation is completed is referred to as write-completed data. The write-completed data is readable data. The controller 5 periodically records, in the NAND memory 6, information indicating a storage location at which the data write operation is to be executed next among storage locations included in the write destination block. The information is recorded as a write destination storage location. In FIG. 5, the controller 5 records a write destination location A as the storage location at which the data write operation is to be executed next.

(b) Subsequently, the controller 5 executes the data write operation using the full sequence program operation, from the storage location indicated by the write destination location A to a storage location indicated by a write destination location B. Now a case is assumed where unexpected power loss occurred when the program operation is being executed on the storage location indicated by the write destination location B. Unexpected power loss is an event that power supply to the memory system 3 is shut off without receiving a shutdown notice from the host 2 to the memory system 3 in advance.

(c) When power loss occurred when the program operation is being executed on the storage location indicated by the write destination location B, the program operation is interrupted before being completed. As a result, this storage location becomes a storage location including unreadable data. Unreadable data is data that cannot be correctly read from the NAND memory 6. When data is read from a storage location that includes unreadable data, the ECC circuit 55 cannot correct an error in the data, and therefore outputs a status indicating an ECC error. In some cases, the threshold voltage of each memory cell MT included in the storage location where the unreadable data is stored is already changed by the interrupted program operation. For this reason, the controller 5 does not re-execute the program operation on this storage location.

(d) When power supply to the memory system 3 is resumed and the memory system 3 restarts, the controller 5 acquires information indicating a write destination storage location, from the NAND memory 6. Here, information indicating the write destination location B is not recorded in the NAND memory 6. The information acquired from the NAND memory 6, therefore, indicates the write destination location A. The controller 5 reads data from the storage location indicated by the acquired write destination location A, and determines whether readable data is stored in the storage location. Readable data is data that can be correctly read from the NAND memory 6. When readable data is stored in this storage location, error correction by the ECC circuit 55 may be successful. In other words, the controller 5 can determine whether data stored in the NAND memory 6 is readable data or unreadable data on the basis of an ECC pass notice or an ECC error notice that is sent from the ECC circuit 55 to the CPU 52. When data stored in the storage location, which is indicated by the write destination location A, is readable data, the controller 5 further reads data stored in a storage location subsequent to the write destination location A, and determines whether data stored in this storage location is readable data.

(e) By repeating the operation described in (d), the controller 5 identifies the first storage location that stores unreadable data. The controller 5 then determines whether the identified storage location is in an erased state. On every memory cell MT included in the storage location in the erased state, no program operation is executed after a data erase operation. When the identified storage location is in the erased state, the controller 5 is capable of executing a data write operation on the identified storage location. Therefore, the controller 5 continues the data write operation on the block BLK0. On the other hand, when the identified storage location is not in the erased state, the controller 5 is incapable of continuing the data write operation on the identified storage location. In this case, the controller 5 may record the block BLK0 in the block management table 72, as a block unavailable for data writing, and newly allocate a different block as a write destination block. Then, the controller 5 may execute the data write operation on the block newly allocated as the write destination block.

In this manner, in the case of using the full sequence program operation, the controller 5 can determine whether power loss occurred during execution of the program operation, by performing the process of determining whether readable data is stored in each of several storage locations and the process of determining whether a storage location which is firstly identified to store unreadable data is in the erased state.

Figure 6:
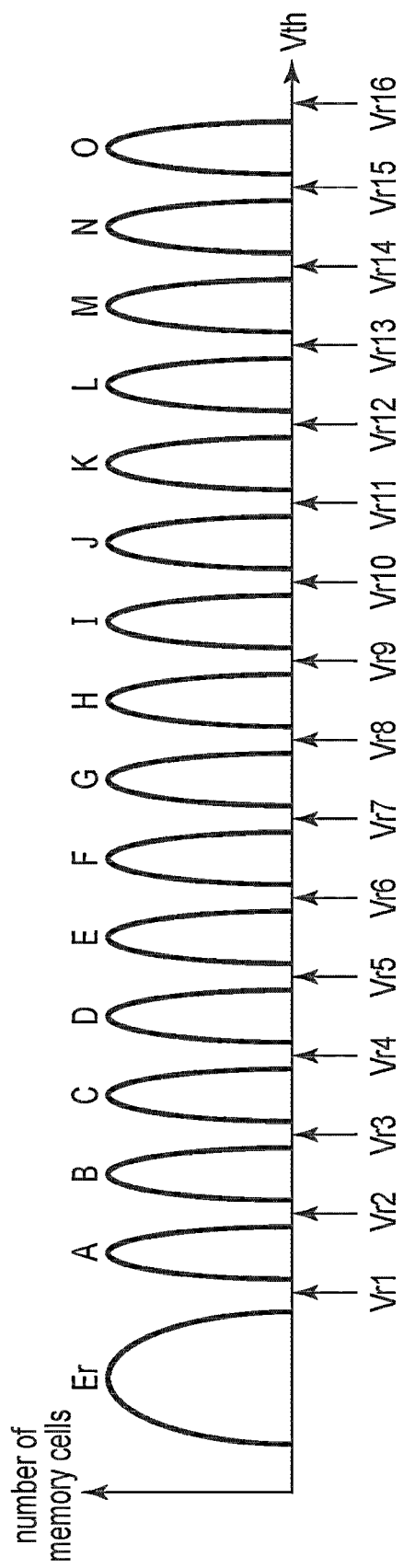
FIG. 6 illustrates an example of threshold voltage distributions of memory cells of the NAND flash memory included in the memory system according to the first embodiment.

Threshold voltage distributions of a plurality of memory cells to which data is written in the QLC mode will then be described. In the QLC mode, 4-bit data is written to one memory cell. FIG. 6 illustrates an example of threshold voltage distributions of a plurality of memory cells of the NAND memory 6 included in the memory system 3 according to the first embodiment.

The threshold voltage Vth of each memory cell changes depending on the amount of charge held by the charge accumulation layer of each memory cell. The NAND memory 6 stores information by mapping a plurality of data values, which represents the information to be stored, with threshold voltage distributions of the threshold voltage Vth of the memory cell.

In the QLC mode, the threshold voltage each memory cell may take is divided into 16 threshold voltage ranges. These 16 threshold voltage ranges are referred to as an Er state, an A state, a B state, a C state, . . . , and an O state in the ascending order of the threshold voltages. The threshold voltage Vth of each memory cell is controlled by the program operation such that the threshold voltage Vth belongs to any one of the threshold voltage ranges.

These 16 states correspond respectively to different pieces of 4-bit data. The threshold voltage Vth of a memory cell in which 4-bit data corresponding to the A state is programmed is set in a threshold voltage range between Vr1 to Vr2. Likewise, the threshold voltage Vth of a memory cell in which 4-bit data corresponding to the B state is programmed is set in a threshold voltage range between Vr2 to Vr3. Likewise, the threshold voltage Vth of a memory cell in which 4-bit data corresponding to the O state is programmed is set in a threshold voltage range between Vr15 to Vr16. This pattern of setting the threshold voltage Vth applies also to the other states.

Figure 7:
FIG. 7 illustrates the procedure of a multi-step program operation executed in the memory system according to the first embodiment.

A multi-step program operation will then be described. FIG. 7 illustrates the procedure of the multi-step program operation that is executed in the memory system 3 according to the first embodiment when data is written in the QLC mode.

The controller 5 executes a data write operation on each of a plurality of storage locations included in a write destination block by using multi-step program operation that includes at least a first step program operation and a second step program operation. In the first step program operation, data of four pages to be written is transferred to the NAND memory 6, and the data is written into a plurality of memory cells (memory cell group MG) that are connected to a certain word line and are included in a certain storage location in the write destination block. In the first step program operation, the threshold voltage of each memory cell is set with low precision. In this state, data cannot be read correctly from each memory cell. In the second step program operation, the same data of four pages as the data transferred in the first step program operation is transferred to the NAND memory 6 again, and the data is written into the memory cell group MG corresponding to the storage location. In the second step program operation, the threshold voltage of each memory cell is set to a target threshold voltage that corresponds to the data to be written. When the second step program operation is completed, data can be read correctly from each memory cell.

The second step program operation on each storage location is executed after the first step program operation on a different storage location is completed. The different storage location is connected to a word line subsequent to the word line that connects the storage location to which the second step program operation is to be executed.

As multi-step program operation, for example, a foggy-fine program operation may be used. The foggy-fine program operation includes a foggy program operation and a fine program operation. The foggy program operation is a program operation (the first step program operation) by which the threshold voltage of each memory cell is set with low precision. The fine program operation is a program operation (the second step program operation) by which the threshold voltage of each memory cell is adjusted to set it to the target threshold voltage.

Foggy-fine program operations on a write destination block are executed in the following procedure. Hereinafter, a storage location (i.e., memory cell group MG) that is connected to a certain word line WLx and is included in a certain string unit SUy will be referred to as an MG (WLx, SUy).

(1) First, a foggy program operation is executed on an MG (WL0, SU0). At this point, write data having the size of four pages, that is, write data having a size that is four times as large as a page size is transferred to the NAND memory 6. The page size is equivalent to the number of strings included in one string unit SU, that is, the number of memory cells included in one storage location (i.e., memory cell group MG).

(2) Subsequently, a foggy program operation is executed on an MG (WL0, SU1).

(3) Subsequently, a foggy program operation is executed on an MG (WL0, SU2).

(4) Subsequently, a foggy program operation is executed on an MG (WL0, SU3).

(5) When the foggy program operations on the MG (WL0, SU0) to the MG (WL0, SU3) are completed, a foggy program operation on an MG (WL1, SU0) is executed.
(6) When the foggy program operation on the MG (WL1, SU0) is completed, a fine program operation on the MG (WL0, SU0) is executed. At this point, the same write data as the write data used in the foggy program operation on the MG (WL0, SU0) is transferred to the NAND memory 6 again. Then, the fine program operation is executed on the MG (WL0, SU0). When this fine program operation is completed, the MG (WL0, SU0) transitions to a fine programmed state. Data stored in a storage location in the fine programmed state is readable data that can be read correctly.
(7) Subsequently, a foggy program operation is executed on an MG (WL1, SU1).
(8) When the foggy program operation on the MG (WL1, SU1) is completed, a fine program operation on the MG (WL0, SU1) is executed. When the fine program operation is completed, the MG (WL0, SU1) transitions to the fine programmed state.
(9) Subsequently, a foggy program operation is executed on an MG (WL1, SU2).
(10) When the foggy program operation on the MG (WL1, SU2) is completed, a fine program operation on the MG (WL0, SU2) is executed. As a result, the MG (WL0, SU2) transitions to the fine programmed state.
(11) Subsequently, a foggy program operation is executed on an MG (WL1, SU3).
(12) When the foggy program operation on the MG (WL1, SU3) is completed, a fine program operation on the MG (WL0, SU3) is executed. As a result, the MG (WL0, SU3) transitions to the fine programmed state.
(13) When the foggy program operations on the MG (WL1, SU0) to the MG (WL1, SU3) are completed, a foggy program operation on an MG (WL2, SU0) is executed.
(14) When the foggy program operation on the MG (WL2, SU0) is completed, a fine program operation on the MG (WL1, SU0) is executed. As a result, the MG (WL1, SU0) transitions to the fine programmed state.
(15) Subsequently, a foggy program operation is executed on an MG (WL2, SU1).
(16) When the foggy program operation on the MG (WL2, SU1) is completed, a fine program operation on the MG (WL1, SU1) is executed. As a result, the MG (WL1, SU1) transitions to the fine programmed state.
(17) Subsequently, a foggy program operation is executed on an MG (WL2, SU2).
(18) When the foggy program operation on the MG (WL2, SU2) is completed, a fine program operation on the MG (WL1, SU2) is executed. As a result, the MG (WL1, SU2) transitions to the fine programmed state.

The order in which foggy-fine program operations are executed on each of the storage locations included in each block will then be described. FIG. 8 illustrates a writing order of multi-step program operations on a block, which is executed in the memory system 3 according to the first embodiment.

Each block includes one or more string units SU. The controller 5 executes foggy program operations on one or more memory cell groups MG (referred to as first storage locations) that are connected to a certain word line (first word line) and are included in one or more string units SU, respectively. After completing the foggy program operations on the one or more first storage locations, the controller 5 executes a foggy program operation on one second storage location among one or more memory cell groups MG (referred to as second storage locations) that are connected to a second word line subsequent to the first word line and that are included in one or more string units SU, respectively.

Then, in response to completion of the foggy program operation on the one second storage location, the controller 5 executes a fine program operation on one of the first storage locations that is connected to the first word line and that is included in the same string unit as the one second storage location.

The controller 5 executes the foggy-fine program operations on storage locations included in the write destination block in such a writing order as described above. Data written to each storage location becomes readable after completion of the fine program operation on each storage location.

In FIG. 8, the order of data writing to a plurality of storage locations included in one block are denoted by numbers. FIG. 8 illustrates an assumed case where the number of word lines per block is eight (word lines WL0 to WL7). The foggy program operation on the MG (WL0, SU0) is executed as the first data write operation for the block.

The foggy program operation on the MG (WL0, SU1) is executed as the second data write operation for the block. The foggy program operation on the MG (WL0, SU2) is executed as the third data write operation for the block. The foggy program operation on the MG (WL0, SU3) is executed as the fourth data write operation for the block.

The foggy program operation on the MG (WL1, SU0) is executed as the fifth data write operation for the block. The fine program operation on the MG (WL0, SU0) is executed as the sixth data write operation for the block.

The foggy program operation on the MG (WL1, SU1) is executed as the seventh data write operation for the block. The fine program operation on the MG (WL0, SU1) is executed as the eighth data write operation for the block.

The foggy program operation on the MG (WL1, SU2) is executed as the ninth data write operation for the block. The fine program operation on the MG (WL0, SU2) is executed as the tenth data write operation for the block.

The foggy program operation on the MG (WL1, SU3) is executed as the 11th data write operation for the block. The fine program operation on the MG (WL0, SU3) is executed as the 12th data write operation for the block.

The foggy program operation on the MG (WL2, SU0) is executed as the 13th data write operation for the block. The fine program operation on the MG (WL1, SU0) is executed as the 14th data write operation for the block.

In this manner, an MG (WL x, SU y+1) is a storage location on which a foggy program operation is to be executed subsequently to execution of a foggy program operation on an MG (WL x, SU y). An MG (WL x+1, SU0) is a storage location on which a foggy program operation is to be executed subsequently to execution of a foggy program operation on an MG (WL x, SU3). An MG (WL x+1, SU y) is a storage location on which a foggy program operation has been executed previously to execution of a fine program operation on an MG (WL X, SU y). An MG (WL x+1, SU y+1) is a storage location on which a foggy program operation is to be executed subsequently to execution of a fine program operation on the MG (WL x, SU y).

Figure 9:
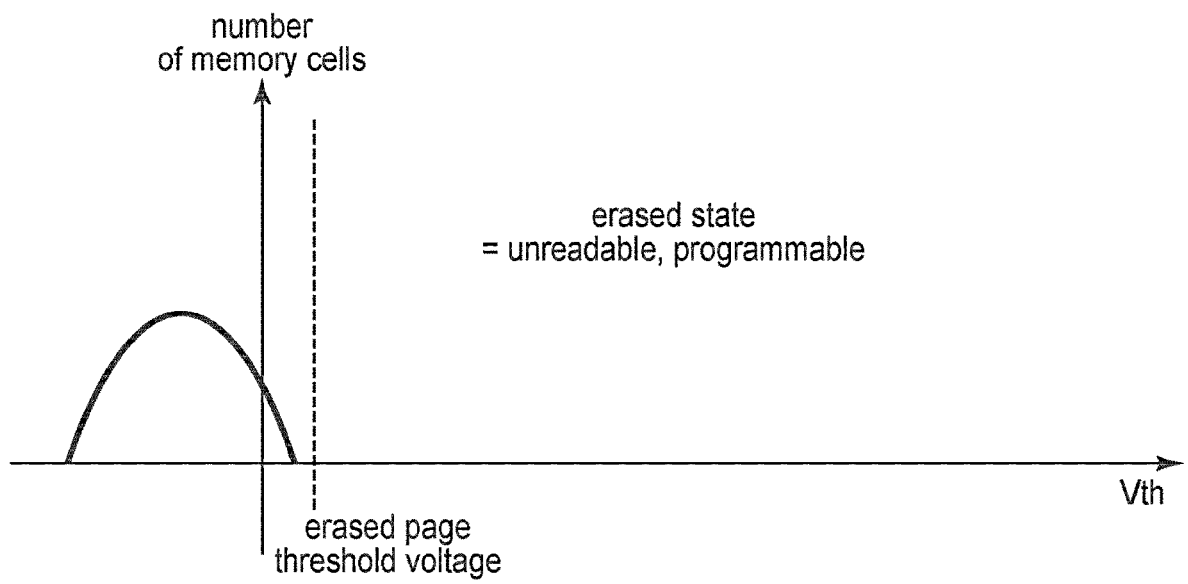
FIG. 9 illustrates a first example of a threshold voltage distribution of memory cells included in a storage location in the memory system according to the first embodiment.

Threshold voltage distributions of memory cells included in each storage location will then be described. Threshold voltages of memory cells included in a storage location in the erased state will first be described. FIG. 9 illustrates threshold voltage distributions of memory cells included in a storage location in the erased state in the memory system 3 according to the first embodiment.

The threshold voltage of each of the memory cells included in the storage location in the erased state is lower than an erased page threshold voltage. The erased page threshold voltage is, for example, 0 V. The erased page threshold voltage is, for example, Vr1 described with reference to FIG. 6. In other words, the storage location in the erased state is a storage location including memory cells whose threshold voltages are all kept in the threshold voltage range of the Er state after execution of the data erase operation. The storage location in the erased state does not include any memory cell whose threshold voltage is equal to or higher than the erased page threshold voltage. Accordingly, the controller 5 performs an erased page check on a storage location, thereby determining whether the storage location is in the erased state. In the erased page check, the controller 5 determines whether the storage location includes a memory cell whose threshold voltage is equal to or higher than the erased page threshold voltage.

The storage location in the erased state is a storage location where data cannot be read correctly. When data is read from the storage location in the erased state, the ECC circuit 55 cannot correct an error in the read data since the data includes no ECC parity.

In the erased page check, the controller 5 may directly acquire raw data read from the storage location by bypassing the ECC circuit 55. When data from all memory cells included in the raw data is data corresponding to the Er state, the controller 5 determines that all the memory cells included in the storage location have the threshold voltage corresponding to the erased state.

When the controller 5 includes a circuit that counts the number of memory cells each having a threshold voltage equal to or higher than the erased page threshold voltage, the controller 5 may determine whether all the memory cells included in the storage location each have the threshold voltage corresponding to the erased state on the basis of a count value outputted from the circuit. This circuit may control the NAND memory 6 in such a way as to apply the erased page threshold voltage as a read voltage, to a word line of an erased page check target. This circuit may count the number of memory cells that store data, which is included in data read from the NAND memory 6, having different value from that corresponding to the Er state, as the number of memory cells each having a threshold voltage equal to or higher than the erased page threshold voltage.

The storage location in the erased state is a storage location on which a data write operation is executable.

Figure 10:
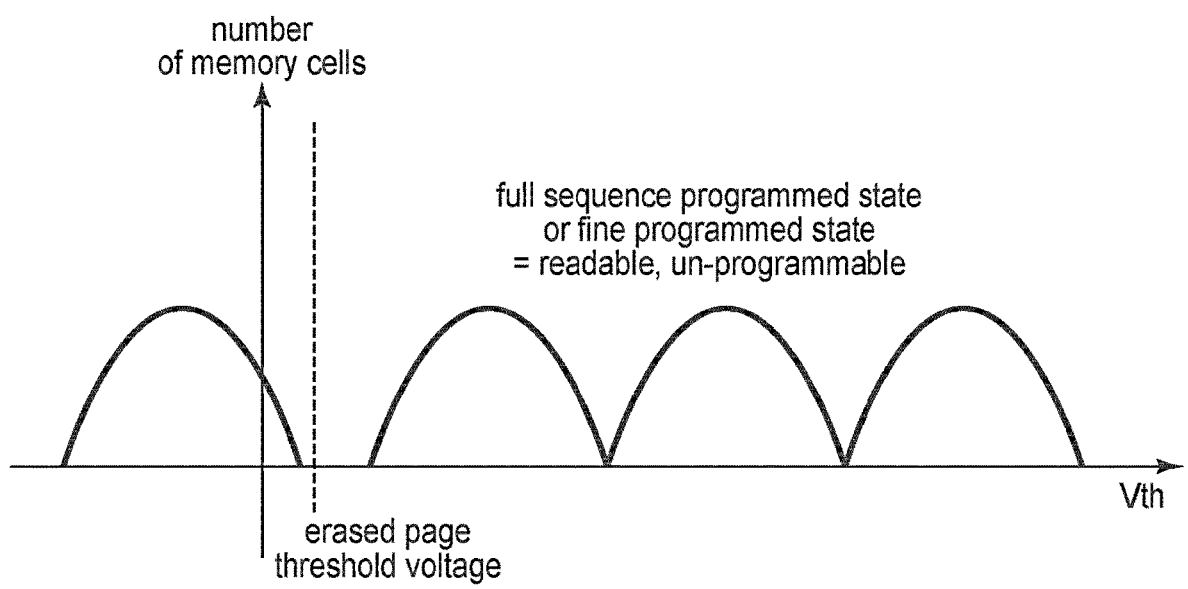
FIG. 10 illustrates a second example of threshold voltage distributions of memory cells included in a storage location in the memory system according to the first embodiment.

Threshold voltage distributions of a plurality of memory cells included in a storage location where readable data is stored will then be described. FIG. 10 illustrates threshold voltage distributions of a plurality of memory cells included in a storage location where data is readable, in the memory system 3 according to the first embodiment.

A storage location where data is readable is a storage location in a full sequence programmed state in which a full sequence program operation has been completed, or a storage location in a fine programmed state in which a fine program operation has been completed. When data is read from this storage location, the ECC circuit 55 may correct an error in the read data since the data includes an ECC parity. The threshold voltage of each memory cell included in this storage location has been changed to a threshold voltage corresponding to data stored in the memory cell. The threshold voltage of each memory cell included in this storage location is, therefore, a threshold voltage corresponding to any one of the Er state, the A state, the B state, the C state, . . . , and the C state. A storage location in the full sequence programmed state or in the fine programmed state is unavailable for writing new data unless a data erase operation is executed on the block including this storage location.

Figure 11:
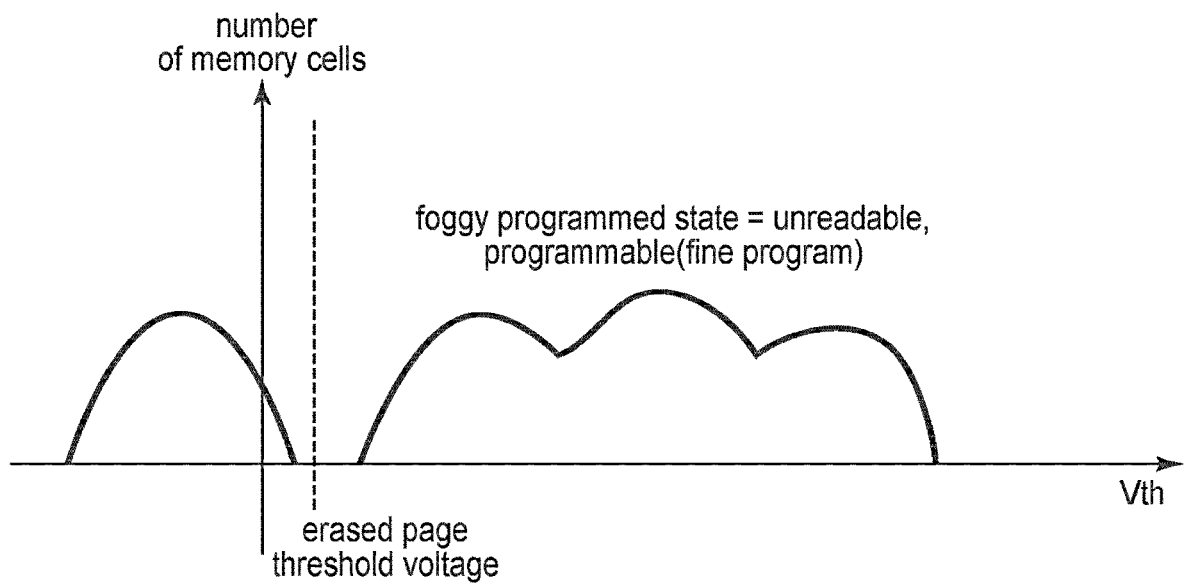
FIG. 11 illustrates a third example of threshold voltage distributions of memory cells included in a storage location in the memory system according to the first embodiment.

Threshold voltage distributions of a plurality of memory cells included in a storage location on which a foggy program operation has been completed will then be described. FIG. 11 illustrates threshold voltage distributions of a plurality of memory cells included in a storage location in a foggy programmed state on which a foggy program operation has been completed, in the memory system 3 according to the first embodiment. A storage location in the foggy programmed state is a storage location where the foggy program operation has been completed but a fine program operation has not been started yet.

The threshold voltage of each memory cell included in the storage location in the foggy programmed state is set with low precision. The storage location in the foggy programmed state is, therefore, a storage location where data cannot be read correctly. When data is read from the storage location in the foggy programmed state, the ECC circuit 55 cannot correct an error in the read data. The storage location in the foggy programmed state may include a memory cell having a threshold voltage equal to or higher than the erased page threshold voltage. The controller 5 is thus able to distinguish the storage location in the foggy programmed state from the storage location in the erased state.

The storage location in the foggy programmed state is a storage location on which the second step program operation (e.g., fine program operation) is executable. In other words, the storage location in the foggy programmed state is not a storage location in the erased state but a storage location on which the fine program operation is executable.

Figure 12:
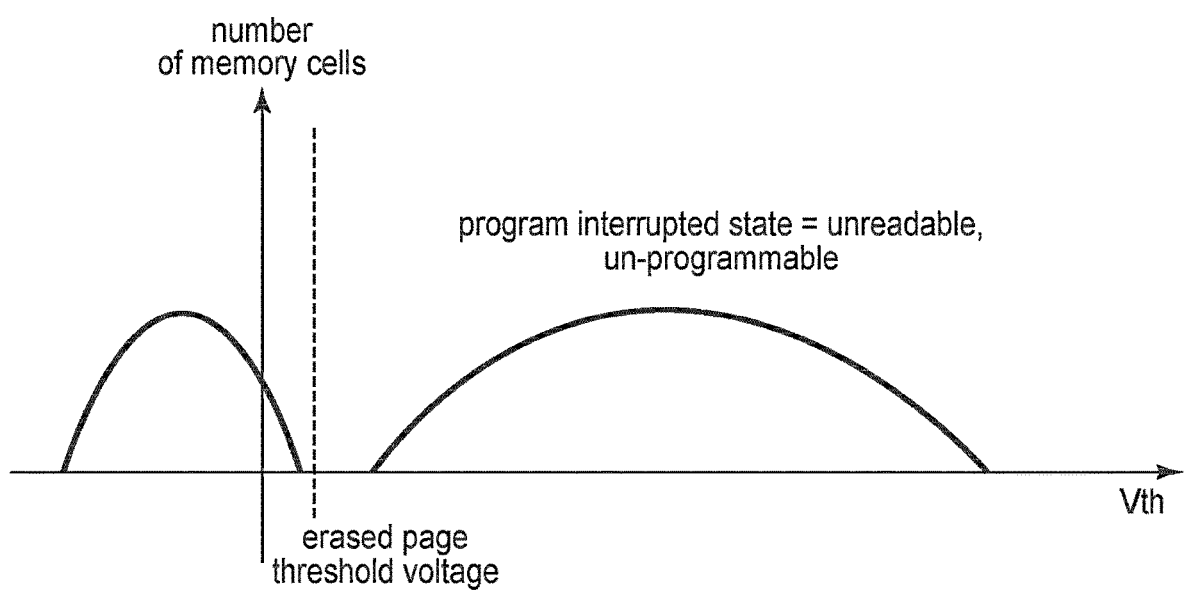
FIG. 12 illustrates a fourth example of threshold voltage distributions of memory cells included in a storage location in the memory system according to the first embodiment.

Threshold voltage distributions of a plurality of memory cells included in a storage location in a state where power loss occurred during a data write operation will then be described. FIG. 12 illustrates threshold voltage distributions of a plurality of memory cells included in a storage location where power loss occurred during a data write operation, in the memory system 3 according to the first embodiment.

A storage location where a data write operation (a full sequence program operation, a foggy program operation, or a fine program operation) is interrupted because of shutoff of power supply to the memory system 3 during execution of the data write operation is a storage location in a program interrupted state storing data that cannot be read correctly. When data is read from the storage location in the program interrupted state, the ECC circuit 55 cannot correct an error in the read data. Threshold voltages of some memory cells included in the storage location in the program interrupted state exceed the erased page threshold voltage. The controller 5, therefore, can distinguish the storage location in the program interrupted state from the storage location in the erased state.

Because the storage location in the program interrupted state is not in the erased state, the storage location in the program interrupted state is unavailable for writing new data.

Hereinafter, a state in which a storage location in the program interrupted state is not present, that is, a case where each storage location is in one of the full sequence programmed state, the fine programmed state, the foggy programmed state, and the erased state will be referred to as a state in which a write operation is stopped properly.

In both a case where data is read from a storage location in the program interrupted state and a case where data is read from the storage location in the foggy programmed state, the ECC circuit 55 determines an ECC error and the erased page check determines that the storage location is not in the erased state. Only from these two determination results, the controller 5 is not able to correctly determine whether the storage location is in the program interrupted state or in the foggy programmed state.

A data write operation corresponding to a write command received from the host 2 and a data write operation internally executed according to a garbage collection operation will then be described. FIG. 13 illustrates an example of a data write operation corresponding to a write command received from the host 2 and a data write operation internally executed according to a garbage collection operation, which are executed in the memory system 3 according to the first embodiment. The data write operation corresponding to a write command received from the host 2, that is, the data write operation executed on the basis of the write command received from the host 2 will first be described.

The controller 5 acquires, from the memory 22 of the host 2, write data associated with the write command received from the host 2, and temporarily stores the acquired write data to a write buffer (WB). A part of the storage area of the DRAM 7 or a part of the storage area of the SRAM 53 may be used as the write buffer.

The controller 5 selects an SLC block from the free block list 73, and allocates the selected SLC block as a write destination block. The SLC block is a block in which data is to be written in the SLC mode among blocks included in the NAND memory 6. When an SLC block is already allocated as the write destination block, the controller 5 skips the operation of selecting the SLC block.

When the total size of write data stored in the write buffer reaches the size of a write unit (e.g., one page), the controller 5 writes the write data into the SLC block, which is allocated as the write destination block. At this time, the controller 5 executes a data write operation in the SLC mode.

When the SLC block allocated as the write destination block becomes full with data, the controller 5 registers the SLC block in the SLC active block list 74 and deallocates the SLC block from the write destination block. The controller 5 then selects another SLC block from the free block list 73, and allocates the selected another SLC block as a write destination block.

In a period of idle state or in response to the number of SLC blocks (free SLC blocks) included in the free block list 73 becoming lower than a threshold, the controller 5 executes a garbage collection operation on SLC blocks included in the SLC active block list 74. The idle state means a state in which no command from the host 2 to execute is present.

The controller 5 selects a QLC block from the free block list 73, and allocates the QLC block as a copy destination block. The QLC block is a block on which foggy-fine program operations in the QLC mode are to be executed among blocks included in the NAND memory 6. Each of memory cells included in the QLC block is to store 4-bit data. Thus, the capacity of the QLC block is four times as much as the SLC block. When a QLC block is already allocated as the copy destination block, the controller 5 skips the operation of selecting the QLC block.

The controller 5 selects a certain block from the SLC active block list 74, and allocates the selected block as a copy source block. The controller 5 may preferentially select a block that stores a smaller amount of valid data. The controller 5 may select a block to be allocated as the copy source block on the basis of a certain algorithm.

The controller 5 selects valid data stored in a storage location (copy source storage location) in the copy source block, and reads the selected valid data. The controller 5 writes the read valid data into a storage location (copy destination storage location) into the copy destination block with foggy-fine program operations in the QLC mode. The controller 5 updates the L2P table 71 so that the physical address associated with the logical address corresponding to the valid data is changed from the physical address indicating the copy source storage location to the physical address indicating the copy destination storage location. By this updating, the valid data stored in the copy source storage location changes to invalid data.

When the copy source block becomes a block storing no valid data, the controller 5 returns the block to the free block list 73 to deallocate the block from the copy source block.

The controller 5 then selects a certain block from the SLC active block list 74 again, and allocates the selected block as a copy source block.

When the QLC block allocated as the copy destination block becomes full with data, the controller 5 registers the QLC block in the QLC active block list 75 and deallocates the QLC block from the copy destination block.

The case where the controller 5 executes the foggy-fine program operations when writing data into the QLC block according to the garbage collection operation has been described above. However, in a case where writing of data based on a write command received from the host 2 is executed, a QLC block may be allocated as the write destination block, as in the case of writing of data according to the garbage collection operation. An operation of writing data into a write destination block will hereinafter be described. The write destination block may be a copy destination block in the garbage collection operation, or may be a block into which data from the host 2 is to be written.

As described above, in the memory system 3, not only a data write operation in the SLC mode but also a data write operation in the QLC mode is executed. The data write operation in the QLC mode is executed by using multi-step program operation.

An operation that is performed in a case where power loss occurred during a data write operation using multi-step program operation will then be described.

FIG. 14 illustrates a relationship between foggy-fine program operations and an unexpected power loss determination process, which are executed in a memory system according to a comparative example.

A case is assumed where power supply to the memory system is shut off in a period between completion of a foggy program operation on a storage location (MG (WL N+2, SU2)), which is connected to a word line WL N+2 (N denotes an integer of one or more) and is included in a string unit SU2, and the start of a fine program operation on a storage location (MG (WL N+1, SU)) that is connected to a word line WL N+1 and is included in a string unit SU2.

In response to resuming of power supply to the memory system after shutoff of power supply to the memory system, a controller acquires a write destination storage location stored in a NAND memory, and determines whether data stored in each of storage locations subsequent to the write destination storage location is readable data.

The controller thus determines that four storage locations (MG (WL N, SU0) to MG (WL N, SU3)), which are connected to a word line WL N, and two storage locations (MG (WL N+1, SU0) and MG (WL N+1, SU1)) out of four storage locations (MG (WL N+1, SU0) to MG (WL N+1, SU3)), which are connected to the word line WL N+1, are each in a fine programmed state. The storage location that has transitioned to the fine programmed state last is the MG (WL N+1, SU1).

The controller then executes an erased page check of each storage location, which is subsequent to the MG (WL N+1, SU1) having transitioned to the fine programmed state last, thereby determining whether each storage location subsequent to the MG (WL N+1, SU1) is in an erased state.

Thus, the controller determines that the MG (WL N+1, SU2), the MG (WL N+1, SU3), the MG (WL N+2, SU0), the MG (WL N+2, SU1), and the MG (WL N+2, SU2) are not in the erased state.

The controller, however, cannot determine whether each storage location not in the erased state is in a foggy programmed state or in a program interrupted state.

From the information obtained by the above determination, the controller cannot determine that each of the MGs (WL N+1, SU2) to (WL N+2, SU2) is in any of (1) a state in which power loss occurred during execution of a fine program operation on the MG (WL N+1, SU2), (2) a state in which power loss occurred during execution of a foggy program operation on the MG (WL N+2, SU2) and (3) a state in which power loss occurred during a period between completion of the foggy program operation on the MG (WL N+2, SU2) and the start of the fine program operation on the MG (WL N+1, SU2) but the write operation has been stopped properly.

In other words, the controller cannot determine whether the previous write operation has been stopped properly.

To deal with this problem, the memory system 3 according to the first embodiment executes a data write operation according to a rule to execute a foggy program operation and a fine program operation, which becomes executable upon completion of the foggy program operation, as a series of program operations.

FIG. 15 illustrates a first example of a relationship between the foggy-fine program operations and an unexpected power loss determination process, which are executed in the memory system 3 according to the first embodiment.

According to the writing order of the foggy-fine program operations described with reference to FIG. 8, the controller 5 executes a data write operation on a plurality of storage locations included in a write destination block. In response to completion of the foggy program operation on the MG (WL N+2, SU2), the controller 5 executes the fine program operation on the MG (WL N+1, SU2). In other words, the controller 5 executes the foggy program operation on the MG (WL N+2, SU2) and the fine program operation on the MG (WL N+1, SU2), as a series of program operations.

Now a case is assumed where power supply to the memory system 3 is shut off because of unexpected power loss after completion of the fine program operation on the MG (WL N+1, SU2).

In response to recovering of power supply to the memory system 3, that is, in response to resuming of power supply to the memory system 3 after power supply to the memory system 3 is shut off, the controller 5 acquires information indicating a write destination storage location from the NAND memory 6. The controller 5 reads data from a storage location indicated by the acquired information, and determines whether the data stored in the storage location is readable data on the basis of a result of error correction (ECC pass or ECC error) by the ECC circuit 55. When the data stored in the storage location is readable data, that is, when the result indicates the ECC pass, the controller 5 reads data stored in a storage location subsequent to this storage location, and determines again whether the data stored in the subsequent storage location is readable data on the basis of a result of an error correction by the ECC circuit 55.

In this manner, until finding the first storage location that stores unreadable data, the controller 5 repeats to determine whether data stored in a storage location of reading target is readable data while changing the storage location of reading target. Through this process, the controller 5 identifies the last storage location that stores readable data. In other words, the controller 5 identifies the storage location storing data that has become readable last, among a plurality of storage locations included in the write destination block. In this example, the controller 5 identifies the MG (WL N+1, SU2) as the storage location storing data that has become readable last.

Subsequently, the controller 5 determines whether a first condition that (1-A) among four storage locations that are connected to a word line subsequent to the word line that is connected to the identified storage location, a storage location included in the same string unit that includes the identified storage location stores unreadable data and (1-B) a storage location on which the foggy program operation is to be executed subsequently to execution of the foggy program operation on the above storage location that stores the unreadable data is in the erased state, is satisfied.

Specifically, the controller 5 first reads data from the MG (WL N+2, SU2), and determines whether the MG (WL N+2, SU2) stores unreadable data on the basis of a result of error correction (ECC pass or ECC error) by the ECC circuit 55.

When the MG (WL N+2, SU2) stores unreadable data, the controller 5 determines whether the MG (WL N+2, SU3), which is a storage location on which the foggy program operation is to be executed subsequently to execution of the foggy program operation on the MG (WL N+2, SU2), is in the erased state.

Because the last storage location that stores readable data is the MG (WL N+1, SU2), the foggy program operation on the MG (WL N+2, SU2) is already completed. Thus, when the MG (WL N+2, SU2) stores unreadable data and the MG (WL N+2, SU3) is in the erased state, the controller 5 can determine that the foggy program operation on the MG (WL N+2, SU2) is completed.

In other words, when the MG (WL N+2, SU2) stores unreadable data and the MG (WL N+2, SU3) is in the erased state, the controller 5 can determine that the MG (WL N+2, SU2) is in the foggy programmed state. Because the MG (WL N+2, SU3) is in the erased state, the fine program operation on the MG (WL N+1, SU3) is not started. The controller 5, therefore, can determine that the MG (WL N+1, SU3) is in the foggy programmed state, too.

When the MG (WL N+2, SU2) stores unreadable data and the MG (WL N+2, SU3) is in the erased state, the first condition is satisfied. In this case, therefore, the controller 5 determines that the previous write operation in the memory system 3 was stopped properly, that is, a storage location in the program interrupted state is not present in the block allocated as the write destination block. The controller 5 then determines the MG (WL N+2, SU3), which is determined to be in the erased state, as the next write destination storage location.

Specifically, when determining that the previous write operation in the memory system 3 has been stopped properly, the controller 5 continues the data write operation on the block allocated as the write destination block, and determines the MG (WL N+2, SU3), as a storage location on which the next foggy program operation is to be executed.

When the first condition is not satisfied, the controller 5 determines that a storage location where power loss occurred during execution of the foggy program operation or the fine program operation is present, that is, the previous write operation in the memory system 3 was stopped improperly. For example, when the MG (WL N+2, SU2) stores unreadable data but the MG (WL N+2, SU3) is not in the erased state, the controller 5 determines that the previous write operation was stopped improperly.

The controller 5 may determine whether a condition that the MG (WL N+2, SU2) is not in the erased state and stores unreadable data and that the MG (WL N+2, SU3) is in the erased state, is satisfied. When this condition is satisfied, the controller 5 may determine that the previous write operation in the memory system 3 was stopped properly.

Figures 16, 17:
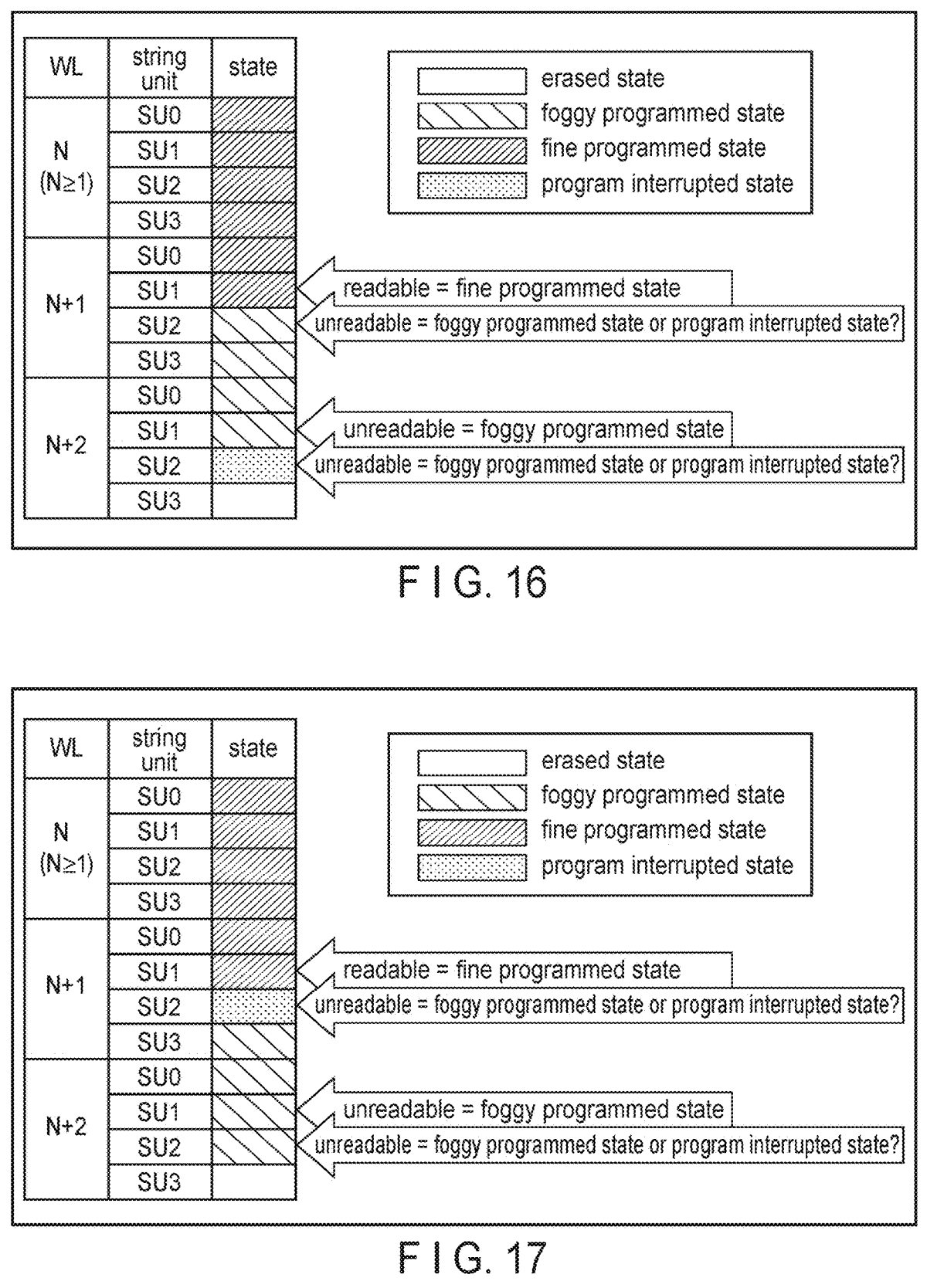

A case of determining that the previous write operation in the memory system 3 was stopped improperly will then be described. FIG. 16 illustrates a second example of the relationship between the foggy-fine program operations and the unexpected power loss determination process, which are executed in the memory system 3 according to the first embodiment It is assumed in this example that power loss occurred during execution of the foggy program operation on the MG (WL N+2, SU2).

When the memory system 3 restarts after power supply to the memory system 3 is shut off, the controller 5 identifies the last storage location that stores readable data, according to the same procedure as described with reference to FIG. 15. In this case, the controller 5 identifies the MG (WL N+1, SU1) as the last storage location that stores readable data.

The controller 5 then determines whether, among four storage locations that are connected to a word line subsequent to the word line that is connected to the identified storage location, a storage location included in the same string unit that includes the identified storage location stores unreadable data. In other words, the controller 5 determines whether the MG (WL N+2, SU1) stores unreadable data.

When the MG (WL N+2, SU1) stores unreadable data, the controller 5 determines whether the MG (WL N+2, SU2), which is a storage location on which the foggy program operation is to be executed subsequently to execution of the foggy program operation on the MG (WL N+2, SU1), is in the erased state.

In a case where power loss occurred during execution of the foggy program operation on the MG (WL N+2, SU2), data cannot be read correctly from the MG (WL N+2, SU2). In addition, the MG (WL N+2, SU2) includes one or more memory cells each having a threshold voltage higher than the erased page threshold voltage. It is therefore determined that the MG (WL N+2, SU2) is not in the erased state. On the basis of this result, the controller 5 determines that the foggy program operation on the MG (WL N+2, SU2) and the fine program operation on the MG (WL N+1, SU2) have not been completed as a series of program operations. In this case, the controller 5 is not able to determine whether the MG (WL N+2, SU2) is in the foggy programmed state or power loss occurred during execution of the foggy program operation on the MG (WL N+2, SU2).

The controller 5 is also not able to determine whether the MG (WL N+1, SU2) is in the foggy programmed state or power loss occurred during execution of the fine program operation on the MG (WL N+1, SU2). This is because data stored in the MG (WL N+1, SU2) is unreadable data, and the MG (WL N+2, SU2) is not in the erased state. Therefore, the MG (WL N+1, SU2) may be in the foggy programmed state or may be in the program interrupted state resulting from power loss that occurred during execution of the fine program operation.

In this manner, when finding a possibility that a storage location in the program interrupted state may be present in the block allocated as the write destination block, the controller 5 determines that the previous write operation in the memory system 3 was stopped improperly.

When determining that the previous write operation was stopped improperly, the controller 5 registers the block, which is allocated as the write destination block, in the block management table 72 as an unavailable block. The controller 5 thus deallocates the registered block from the write destination block. The controller 5 then selects another block from the free block list 73. The controller 5 newly allocates the selected block as the write destination block. The controller 5 determines the MG (WL0, SU0), which is the head storage location among storage locations included in the newly allocated block, as the next write destination storage location. Also in a case where data stored in the MG (WL N+2, SU1) is readable data, the first condition is not satisfied. It is determined in this case that the previous write operation was stopped improperly.

Another case of determining that the previous write operation in the memory system 3 was stopped improperly will then be described. FIG. 17 illustrates a third example of the relationship between the foggy-fine program operations and the unexpected power loss determination process, which are executed in the memory system 3 according to the first embodiment.

It is assumed in this example that power loss occurred during execution of a fine program operation on the MG (WL N+1, SU2).

When the memory system 3 restarts after power supply to the memory system 3 is shut off, the controller 5 identifies the last storage location that stores readable data according to the same procedure as described with reference to FIG. 15. In a case where power loss occurred during execution of the fine program operation on the MG (WL N+1, SU2), data cannot be read correctly from the MG (WL N+1, SU2). The controller 5 thus identifies the MG (WL N+1, SU1) as the last storage location that stores readable data.

The controller 5 then determines whether, among four storage locations that are connected to a word line subsequent to the word line that is connected to the identified storage location, a storage location included in the same string unit that includes the identified storage location stores unreadable data. In other words, the controller 5 determines whether the MG (WL N+2, SU1) stores unreadable data.

When the MG (WL N+2, SU1) stores unreadable data, the controller 5 determines whether the MG (WL N+2, SU2), which is a storage location on which the foggy program operation is to be executed following execution of the foggy program operation on the MG (WL N+2, SU1), is in the erased state.

Because the MG (WL N+2, SU2) is in the foggy programmed state, data cannot be read correctly from the MG (WL N+2, SU2). In addition, the MG (WL N+2, SU2) includes one or more memory cells each having a threshold voltage higher than the erased page threshold voltage. It is therefore determined that the MG (WL N+2, SU2) is not in the erased state. On the basis of this result, the controller 5 determines that the foggy program operation on the MG (WL N+2, SU2) and the fine program operation on the MG (WL N+1, SU2) have not been completed as a series of program operations. In this case, the controller 5 is not able to determine whether the MG (WL N+2, SU2) is in the foggy programmed state or power loss occurred during execution of the foggy program operation on the MG (WL N+2, SU2).

The controller 5 is also not able to determine whether the MG (WL N+1, SU2) is in the foggy programmed state or power loss occurred during execution of the fine program operation on the MG (WL N+1, SU2). This is because data stored in the MG (WL N+1, SU2) is unreadable data, and the MG (WL N+2, SU2) is not in the erased state. Therefore, the MG (WL N+1, SU2) may be in the foggy programmed state or may be in the program interrupted state resulting from power loss that occurred during execution of the fine program operation.

In this manner, when finding a possibility that a storage location in the program interrupted state may be present in the block allocated as the write destination block, the controller 5 determines that the previous write operation in the memory system 3 was stopped improperly.

Figures 18, 19:
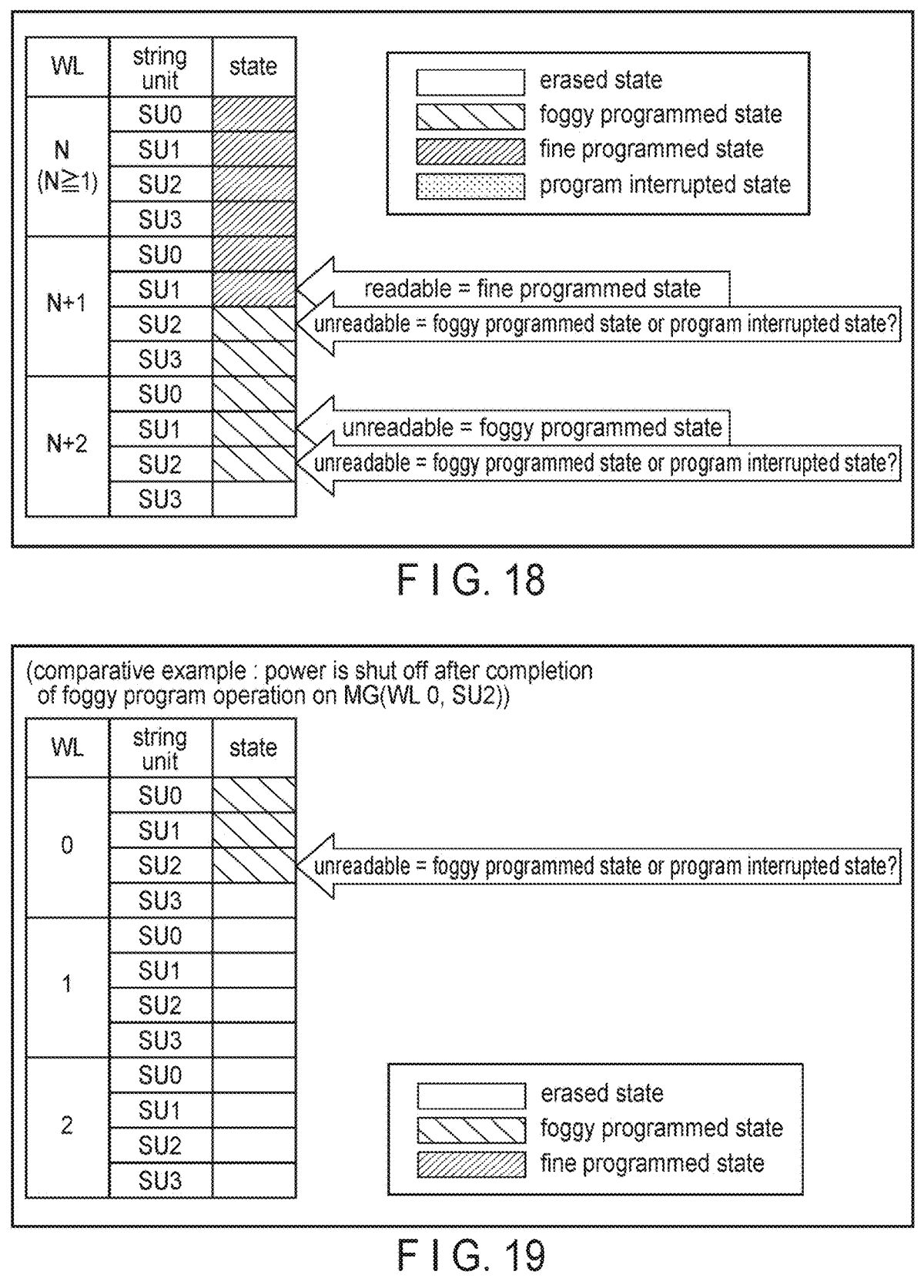

A still another case of determining that the previous write operation in the memory system 3 was stopped improperly will then be described. FIG. 18 illustrates a fourth example of the relationship between the foggy-fine program operations and the unexpected power loss determination process, which are executed in the memory system 3 according to the first embodiment.

It is assumed in this example that power loss occurred in a period between completion of the foggy program operation on the MG (WL N+2, SU2) and the start of execution of the fine program operation on the MG (WL N+1, SU2).

When the memory system 3 restarts after power supply to the memory system 3 is shut off, the controller 5 identifies the last storage location that stores readable data according to the same procedure as described with reference to FIG. 15. In this case, the controller 5 identifies the MG (WL N+1, SU1) as the last storage location that stores readable data.

The controller 5 then determines whether, among four storage locations that are connected to a word line subsequent to the word line that is connected to the identified storage location, a storage location included in the same string unit that includes the identified storage location stores unreadable data. In other words, the controller 5 determines whether the MG (WL N+2, SU1) stores unreadable data.

When the MG (WL N+2, SU1) stores unreadable data, the controller 5 determines whether the MG (WL N+2, SU2), which is a storage location on which the foggy program operation is to be executed following execution of the foggy program operation on the MG (WL N+2, SU1), is in the erased state.

Because the MG (WL N+2, SU2) is in the foggy programmed state, data cannot be read correctly from the MG (WL N+2, SU2). In addition, the MG (WL N+2, SU2) includes one or more memory cells each having a threshold voltage higher than the erased page threshold voltage. It is therefore determined that the MG (WL N+2, SU2) is not in the erased state. On the basis of this result, the controller 5 determines that the foggy program operation on the MG (WL N+2, SU2) and the fine program operation on the MG (WL N+1, SU2) have not been completed as a series of program operations. In this case, the controller 5 is not able to determine whether the MG (WL N+2, SU2) is in the foggy programmed state or power loss occurred during execution of the foggy program operation on the MG (WL N+2, SU2).

The controller 5 is also not able to determine whether the MG (WL N+1, SU2) is in the foggy programmed state or power loss occurred during execution of the fine program operation on the MG (WL N+1, SU2). This is because data stored in the MG (WL N+1, SU2) is unreadable data, and the MG (WL N+2, SU2) is not in the erased state. Therefore, the MG (WL N+1, SU2) may be in the foggy programmed state or may be in the program interrupted state resulting from power loss that occurred during execution of the fine program operation.

In this manner, when finding a possibility that a storage location in the program interrupted state may be present in the block allocated as the write destination block, the controller 5 determines that the previous write operation in the memory system 3 was stopped improperly.

A data write operation on four storage locations connected to the head word line of a write destination block will then be described. The data write operation on four storage locations connected to the head word line of a block, which is executed in the memory system according to the comparative example, will first be described. FIG. 19 illustrates a relationship between foggy-fine program operations executed on the head word line of a write destination block and the unexpected power loss determination process, which are executed in the memory system according to the comparative example.

Now a case is assumed where power loss of the memory system occurred in a period between completion of the foggy program operation on the MG (WL0, SU2) and the start of the foggy program operation on the MG (WL0, SU3).

Every time data to be written to one storage location among four storage locations, which are connected to the word line WL0, is prepared, the controller of the memory system according to the comparative example writes the data into the one storage location connected to the word line WL0 by using the foggy program operation. In this case, therefore, power loss of the memory system may occur in a state where the fine program operation on any one of the four storage locations, which are connected to the word line WL0, has not been completed yet.

In the case of FIG. 19, after the restart of the memory system, the controller cannot determine whether the MG (WL0, SU2) is in the foggy programmed state or in the program interrupted state in which power loss occurred during execution of the foggy program operation.

Figure 20:
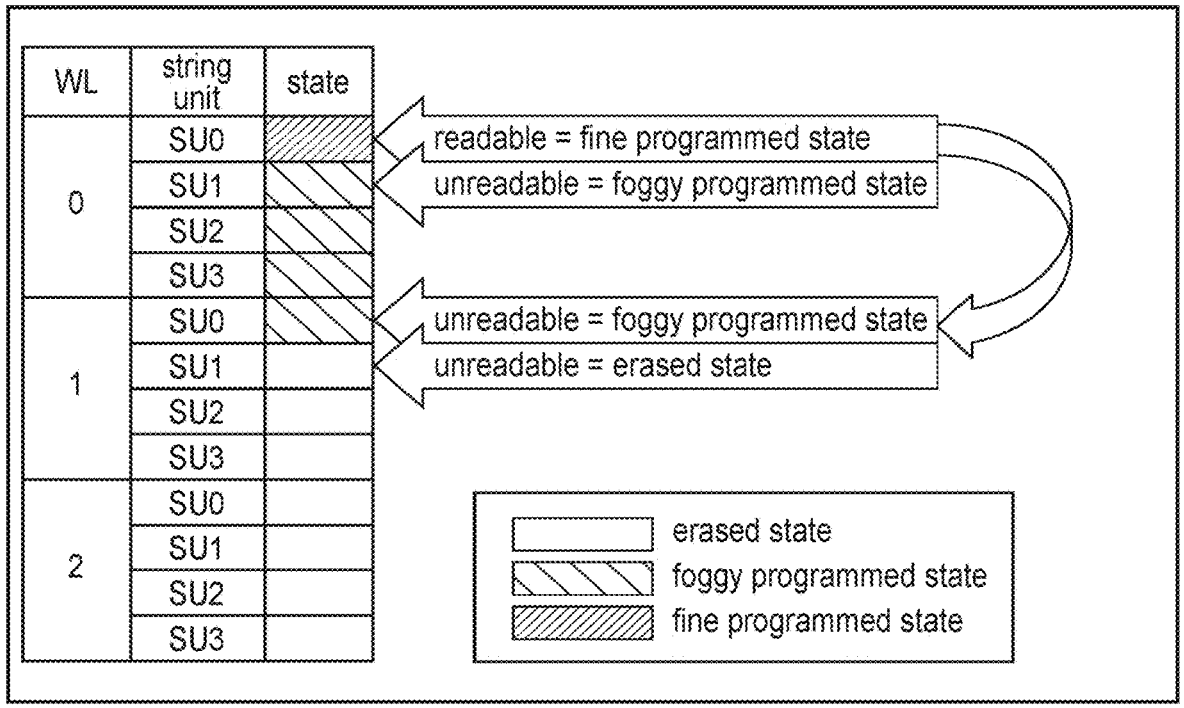
FIG. 20 illustrates a first example of a relationship between foggy-fine program operations, which are executed on the head word line of a write destination block, and the unexpected power loss determination process that are executed in the memory system according to the first embodiment.

To avoid such a situation, according to the memory system 3 of the first embodiment, the foggy program operation on the four storage locations connected to the head word line of a write destination block is started in response to the first fine program operation becoming executable. FIG. 20 illustrates a first example of a relationship between foggy-fine program operations executed on the head word line of the write destination block and the unexpected power loss determination process, which are executed in the memory system 3 according to the first embodiment.

The controller 5 executes the foggy program operations on four storage locations (MG (WL0, SU0) to MG (WL0, SU3)) connected to the word line WL0, which is the head word line, the foggy program operation on a storage location (MG (WL1, SU0)) connected to the word line WL1 and included in the string unit SU0, and the fine program operation on the MG (WL0, SU0), as a series of program operations. In other words, the controller 5 waits until data to be written to the MG (WL0, SU0) to the MG (WL0, SU3) and data to be written to the MG (WL1, SU0) are prepared. For example, the controller 5 waits for all of these data to be stored in the write buffer. In response to preparation of all the data, the controller 5 executes the foggy program operations on the MG (WL0, SU0) to the MG (WL0, SU3), the foggy program operation on the MG (WL1, SU0), and the fine program operation on the MG (WL0, SU0).

The controller 5 is thus able to complete the fine program operation on the MG (WL0, SU0) unless unexpected power loss occurs. When data stored in the MG (WL0, SU0) is readable data, the controller 5 can execute the unexpected power loss determination process on the write destination block, according to the same procedure as described with reference to FIG. 15. At the restart of the memory system 3, when finding that data stored in the MG (WL0, SU0) is unreadable data and that the MG (WL0, SU0) is not in the erased state, the controller 5 can determine that the previous write operation in the memory system 3 was stopped improperly.

Hereinafter, this case will be described in detail. It is assumed in the example of FIG. 20 that following completion of the fine program operation on the MG (WL0, SU0), power supply to the memory system 3 is shut off because of unexpected power loss.

When the memory system 3 restarts after power supply to the memory system 3 is shut off, the controller 5 identifies the last storage location that stores readable data according to the same procedure as described with reference to FIG. 15. In this case, the controller 5 identifies the MG (WL0, SU0) as the last storage location that stores readable data.

The controller 5 then determines whether, among four storage locations connected to a word line subsequent to the word line connected to the identified storage location, a storage location included in the same string unit that includes the identified storage location stores unreadable data. In other words, in this case, the controller 5 determines whether the MG (WL1, SU0) stores unreadable data.

When the MG (WL1, SU0) stores unreadable data, the controller 5 determines whether the MG (WL1, SU1), which is a storage location on which the foggy program operation is to be executed following execution of the foggy program operation on the MG (WL1, SU0), is in the erased state Because the last storage location that stores readable data is the MG (WL0, SU0), the foggy program operation on the MG (WL1, SU0) is already completed. Thus, when the MG (WL1, SU0) stores unreadable data and the MG (WL1, SU1) is in the erased state, the controller 5 can determine that the foggy program operation on the MG (WL1, SU0) is completed.

In other words, when the MG (WL1, SU0) stores unreadable data and the MG (WL1, SU1) is in the erased state, the controller 5 can determine that the MG (WL1, SU0) is in the foggy programmed state. Because the MG (WL1, SU1) is in the erased state, the fine program operation on the MG (WL0, SU1) is not started. The controller 5, therefore, can determine that the MG (WL0, SU1) is in the foggy programmed state, too.

When the MG (WL1, SU0) stores unreadable data and the MG (WL1, SU1) is in the erased state, the first condition is satisfied. In this case, therefore, the controller 5 determines that the previous write operation in the memory system 3 was stopped properly, that is, a storage location in the program interrupted state is not present in the block allocated as the write destination block. The controller 5 then determines the MG (WL1, SU1), which is determined to be in the erased state, as the next write destination storage location.

Specifically, when determining that the previous write operation in the memory system 3 was stopped properly, the controller 5 continues the data write operation on the block allocated as the write destination block, and determines the MG (WL1, SU1) as the storage location on which the next foggy program operation is to be executed.

When the first condition is not satisfied, the controller 5 determines that a storage location where power loss occurred during execution of the foggy program operation or the fine program operation is present, that is, the previous write operation in the memory system 3 was stopped improperly. For example, when the MG (WL1, SU0) stores unreadable data but the MG (WL1, SU1) is not in the erased state, the controller 5 determines that the previous write operation was stopped improperly.

The controller 5 may determine whether a condition that the MG (WL1, SU0) is not in the erased state and stores unreadable data and that the MG (WL1, SU1) is in the erased state, is satisfied. When this condition is satisfied, the controller 5 may determine that the previous write operation in the memory system 3 was stopped properly.

Figure 21:
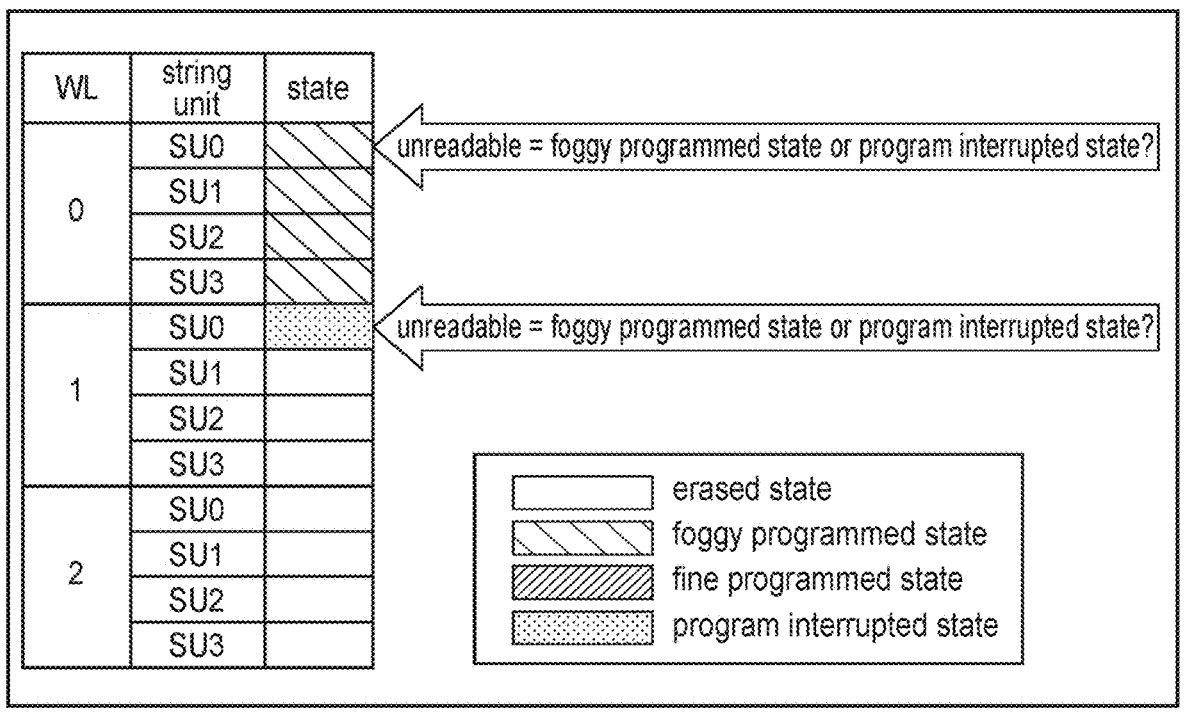
FIG. 21 illustrates a second example of the relationship between the foggy-fine program operations, which are executed on the head word line of the write destination block, and the unexpected power loss determination process that are executed in the memory system according to the first embodiment.

A case of determining that the previous write operation in the memory system 3 was stopped improperly will then be described. FIG. 21 illustrates a second example of the relationship between the foggy-fine program operations on the head word line of the write destination block and the unexpected power loss determination process, which are executed in the memory system 3 according to the first embodiment.

It is assumed in this example that power loss occurred during execution of the foggy program operation on the MG (WL1, SU0).

When the memory system 3 restarts after power supply to the memory system 3 is shut off, the controller 5 identifies the last storage location that stores readable data according to the same procedure as described with reference to FIG. 15. In the case of FIG. 21, none of the storage locations stores readable data. The controller 5, therefore, determines that a storage location that stores readable data, i.e., a storage location in the fine programmed state is not present. The controller 5 thus determines that the foggy program operations on the MG (WL0, SU0) to MG (WL0, SU3), the foggy program operation on the MG (WL1, SU0), and the fine program operation on the MG (WL0, SU0) have not been completed as a series of program operations. In this case, the controller 5 is not able to determine whether the MG (WL1, SU0) is in the foggy programmed state or power loss occurred during execution of the foggy program operation on the MG (WL1, SU0).

The controller 5 is also not able to determine whether the MG (WL0, SU0) is in the foggy programmed state or power loss occurred during execution of the fine program operation on the MG (WL0, SU0).

In this manner, when finding a possibility that a storage location in the program interrupted state may be present in the block allocated as the write destination block, the controller 5 determines that the previous write operation in the memory system 3 was stopped improperly.

When determining that the previous write operation was stopped improperly, the controller 5 registers the block, which is allocated as the write destination block, in the block management table 72 as an unavailable block. The controller 5 thus deallocates the registered block from the write destination block. The controller 5 then selects another block from the free block list 73. The controller 5 newly allocates the selected block as the write destination block. The controller 5 determines the MG (WL0, SU0), which is the head storage location among storage locations included in the newly allocated block, as the next write destination storage location.

Another case of determining that the previous write operation in the memory system 3 was stopped improperly will then be described. FIG. 22 illustrates a third example of the relationship between the foggy-fine program operations on the head word line of the write destination block and the unexpected power loss determination process, which are executed in the memory system 3 according to the first embodiment.

It is assumed in this example that power loss occurred during execution of the fine program operation on the MG (WL0, SU0).

When the memory system 3 restarts after power supply to the memory system 3 is shut off, the controller 5 identifies the last storage location that stores readable data according to the same procedure as described with reference to FIG. 15. In the case of FIG. 22, none of the storage locations stores readable data. The controller 5, therefore, determines that a storage location that stores readable data, i.e., a storage location in the fine programmed state is not present. The controller 5 thus determines that the foggy program operations on the MG (WL0, SU0) to MG (WL0, SU3), the foggy program operation on the MG (WL1, SU0), and the fine program operation on the MG (WL0, SU0) have not been completed as a series of program operations.

In this case, the controller 5 is not able to determine whether the MG (WL0, SU0) is in the foggy programmed state or power loss occurred during execution of the foggy program operation on the MG (WL0, SU0). The controller 5 is also not able to determine whether the MG (WL1, SU0) is in the foggy programmed state or power loss occurred during execution of the fine program operation on the MG (WL1, SU0).

In this manner, when finding a possibility that a storage location in the program interrupted state may be present in the block allocated as the write destination block, the controller 5 determines that the previous write operation in the memory system 3 was stopped improperly.

A still another case of determining that the previous write operation in the memory system 3 was stopped improperly will then be described. FIG. 23 illustrates a fourth example of the relationship between the foggy-fine program operations on the head word line of the write destination block and the unexpected power loss determination process, which are executed in the memory system 3 according to the first embodiment.

It is assumed in this example that power loss occurred in a period between completion of the foggy program operation on the MG (WL1, SU0) and the start of the fine program operation on the MG (WL0, SU0).

When the memory system 3 restarts after power supply to the memory system 3 is shut off, the controller 5 identifies the last storage location that stores readable data according to the same procedure as described with reference to FIG. 15. In the case of FIG. 23, none of the storage locations stores readable data. The controller 5, therefore, determines that a storage location that stores readable data, i.e., a storage location in the fine programmed state is not present. The controller 5 thus determines that the foggy program operations on the MG (WL0, SU0) to MG (WL0, SU3), the foggy program operation on the MG (WL1, SU0), and the fine program operation on the MG (WL0, SU0) have not been completed as a series of program operations.

In this case, the controller 5 is not able to determine whether the MG (WL1, SU0) is in the foggy programmed state or power loss occurred during execution of the foggy program operation on the MG (WL1, SU0). The controller 5 is also not able to determine whether the MG (WL0, SU0) is in the foggy programmed state or power loss occurred during execution of the fine program operation on the MG (WL0, SU0).

In this manner, when there is a possibility that a storage location in the program interrupted state may be present in the block allocated as the write destination block, the controller 5 determines that the previous write operation in the memory system 3 was stopped improperly.

The cases where the fine program operation on the MG (WL0, SU0) becomes executable after completion of the foggy program operation on the MG (WL1, SU0) have been described with reference to FIGS. 20 to 23, The foggy-fine program operations, however, may be executed in an order different from the order indicated in FIGS. 20 to 23. For example, the fine program operation on the MG (WL0, SU0) may become executable after completion of the foggy program operation on the MG (WL0, SU1). In this case, the foggy program operation on the MG (WL0, SU0) is started when data to be written to the MG (WL0, SU0) and MG (WL0, SU1) have been prepared.

Figure 24:
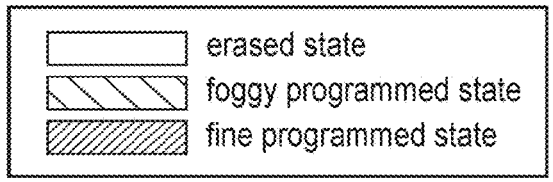
FIG. 24 illustrates a first example of a relationship between foggy-fine program operations and the unexpected power loss determination process that are executed in the memory system according to the first embodiment in a case where each block includes only one string unit.

A case where the number of string units included in each block is one will then be described. FIG. 24 illustrates a first example of a relationship between foggy-fine program operations and the unexpected power loss determination process, which are executed in the memory system 3 according to the first embodiment, in a case where each block includes only one string unit SU. Hereinafter, a storage location connected to a certain word line WLx will be referred to as MG (WLx).

When each block includes only one string unit SU, the controller 5 executes a data write operation by executing the foggy program operation on an MG (WL0), the foggy program operation on an MG (WL1), the fine program operation on an MG (WL0), the foggy program operation on an MG (WL2), and the fine program operation on an MG (WL1) in this order.

The controller 5 executes the foggy program operation and the fine program operation which becomes executable upon completion of the foggy program operation, as a series of program operations. The controller 5 thus executes the foggy program operation on the MG (WL1) and the fine program operation on the MG (WL0), as a series of program operations.

Hereinafter, this case will be described in detail. It is assumed in FIG. 24 that following completion of the fine program operation on an MG (WL6), power supply to the memory system 3 has been shut off because of unexpected power loss.

When the memory system 3 restarts after power supply to the memory system 3 is shut off, the controller 5 identifies the last storage location that stores readable data according to the same procedure as described with reference to FIG. 15. In this case, the controller 5 identifies the MG (WL6) as the last storage location that stores readable data.

The controller 5 then determines whether, among storage locations that are connected to a word line subsequent to the word line that is connected to the identified storage location, a storage location included in the same string unit that includes the identified storage location stores unreadable data. Because only one string unit is present in this case, the controller 5 just checks a storage location connected to a word line subsequent to the word line connected to the identified storage location. In other words, the controller 5 determines whether an MG (WL7) stores unreadable data.

When the MG (WL7) stores unreadable data, the controller 5 determines whether an MG (WL8), which is a storage location on which the foggy program operation is to be executed subsequently to execution of the foggy program operation on the MG (WL7), is in the erased state.

Because the last storage location that stores readable data is the MG (WL6), the foggy program operation on the MG (WL7) is already completed. Thus, when the MG (WL7) stores unreadable data and the MG (WL8) is in the erased state, the controller 5 can determine that the foggy program operation on the MG (WL7) is completed.

When the MG (WL7) stores unreadable data and the MG (WL8) is in the erased state, the first condition is satisfied. In this case, therefore, the controller 5 determines that the previous write operation in the memory system 3 was stopped properly, that is, a storage location in the program interrupted state is not present in the block allocated as the write destination block. The controller 5 then determines the MG (WL8), which is determined to be in the erased state, as the next write destination storage location.

When the first condition is not satisfied, the controller 5 determines that a storage location where power loss occurred during execution of the foggy program operation or the fine program operation is present, that is, the previous write operation in the memory system 3 was stopped improperly. For example, when the MG (WL7) stores unreadable data but the MG (WL8) is not in the erased state, the controller 5 determines that the previous write operation was stopped improperly.

Figure 25:
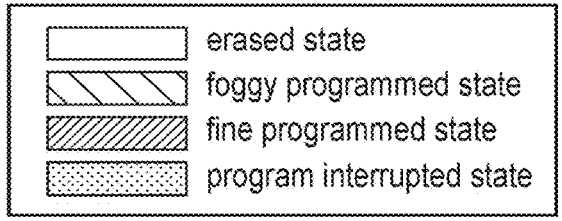
FIG. 25 illustrates a second example of the relationship between the foggy-fine program operations and the unexpected power loss determination process that are executed in the memory system according to the first embodiment in a case where each block includes only one string unit.

A case of determining that the previous write operation in the memory system 3 was stopped improperly will then be described. FIG. 25 illustrates a second example of the relationship between the foggy-fine program operations and the unexpected power loss determination process, which are executed in the memory system 3 according to the first embodiment, in the case where each block includes only one string unit.

It is assumed in this example that power loss occurred during execution of the foggy program operation on the MG (WL7).

When the memory system 3 restarts after power supply to the memory system 3 is shut off, the controller 5 identifies the last storage location that stores readable data according to the same procedure as described with reference to FIG. 15. In this case, the controller 5 identifies the MG (WL5) as the last storage location that stores readable data.

The controller 5 then determines whether a storage location connected to a word line subsequent to the word line connected to the identified storage location stores unreadable data. In other words, the controller 5 determines whether the MG (WL6) stores unreadable data.

When the MG (WL6) stores unreadable data, the controller 5 determines whether an MG (WL7), which is a storage location on which the foggy program operation is to be executed subsequently to execution of the foggy program operation on the MG (WL6), is in the erased state.

In a case where power loss occurred during execution of the foggy program operation on the MG (WL7), the controller 5 is not able to read data correctly from the MG (WL7). In addition, the MG (WL7) includes one or more memory cells each having a threshold voltage higher than the erased page threshold voltage. It is therefore determined that the MG (WL7) is not in the erased state. On the basis of this result, the controller 5 determines that the foggy program operation on the MG (WL7) and the fine program operation on the MG (WL6) have not been completed as a series of program operations. In this case, the controller 5 is not able to determine whether the MG (WL7) is in the foggy programmed state or power loss occurred during execution of the foggy program operation on the MG (WL7).

The controller 5 is also not able to determine whether the MG (WL6) is in the foggy programmed state or power loss occurred during execution of the fine program operation on the MG (WL6).

In this manner, when finding a possibility that a storage location in the program interrupted state may be present in the block allocated as the write destination block, the controller 5 determines that the previous write operation in the memory system 3 was stopped improperly.

When determining that the previous write operation was stopped improperly, the controller 5 registers the block, which is allocated as the write destination block, in the block management table 72 as an unavailable block. The controller 5 thus deallocates the registered block from the write destination block. The controller 5 then selects another block from the free block list 73. The controller 5 newly allocates the selected block as the write destination block. The controller 5 determines the MG (WL0), which is the head storage location among storage locations included in the newly allocated block, as the next write destination storage location.

Figure 26:
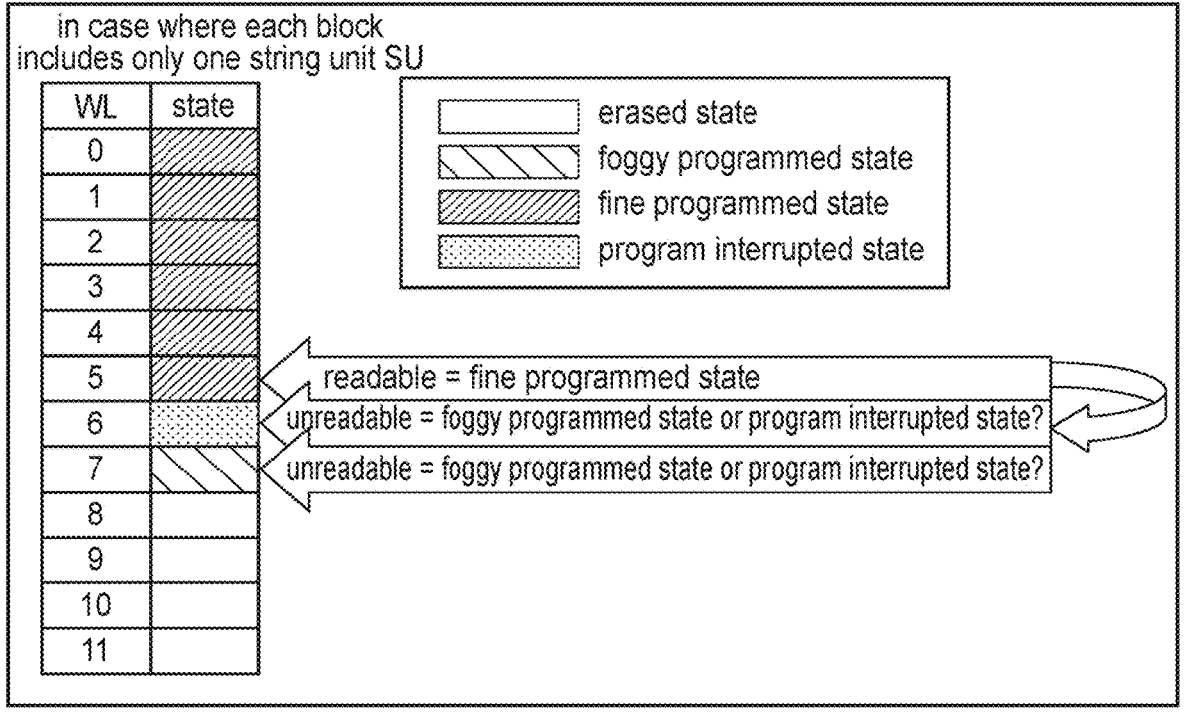
FIG. 26 illustrates a third example of the relationship between the foggy-fine program operations and the unexpected power loss determination process that are executed in the memory system according to the first embodiment in a case where each block includes only one string unit.

Another case of determining that the previous write operation in the memory system 3 was stopped improperly will then be described. FIG. 26 illustrates a third example of the relationship between the foggy-fine program operations and the unexpected power loss determination process, which are executed in the memory system 3 according to the first embodiment, in the case where each block includes only one string unit.

It is assumed in this example that power loss occurred during execution of the fine program operation on the MG (WL6).

When the memory system 3 restarts after power supply to the memory system 3 is shut off, the controller 5 identifies the last storage location that stores readable data according to the same procedure as described with reference to FIG. 15. In a case where power loss occurred during execution of the fine program operation on the MG (WL6), data cannot be read correctly from the MG (WL6). The controller 5 thus identifies the MG (WL5) as the last storage location that stores readable data.

The controller 5 then determines whether a storage location connected to a word line subsequent to the word line connected to the identified storage location stores unreadable data. In other words, the controller 5 determines whether the MG (WL6) stores unreadable data.

When the MG (WL6) stores unreadable data, the controller 5 determines whether the MG (WL7), which is a storage location on which the foggy program operation is to be executed following execution of the foggy program operation on the MG (WL6), is in the erased state The MG (WL7) is in the foggy programmed state, and therefore data cannot be read correctly from the MG (WL7). In addition, the MG (WL7) includes one or more memory cells each having a threshold voltage higher than the erased page threshold voltage. It is therefore determined that the MG (WL7) is not in the erased state. On the basis of this result, the controller 5 determines that the foggy program operation on the MG (WL7) and the fine program operation on the MG (WL6) have not been completed as a series of program operations. In this case, the controller 5 is not able to determine whether the MG (WL7) is in the foggy programmed state or power loss occurred during execution of the foggy program operation on the MG (WL7).

The controller 5 is also not able to determine whether the MG (WL6) is in the foggy programmed state or power loss occurred during execution of the fine program operation on the MG (WL6). This is because data stored in the MG (WL6) is unreadable data and the MG (WL7) is not in the erased state. Therefore, the MG (WL6) may be in the foggy programmed state or may be in the program interrupted state in which power loss occurred during execution of the fine program operation.

In this manner, when there is a possibility that a storage location in the program interrupted state may be present in the block allocated as the write destination block, the controller 5 determines that the previous write operation in the memory system 3 was stopped improperly.

Figure 27:
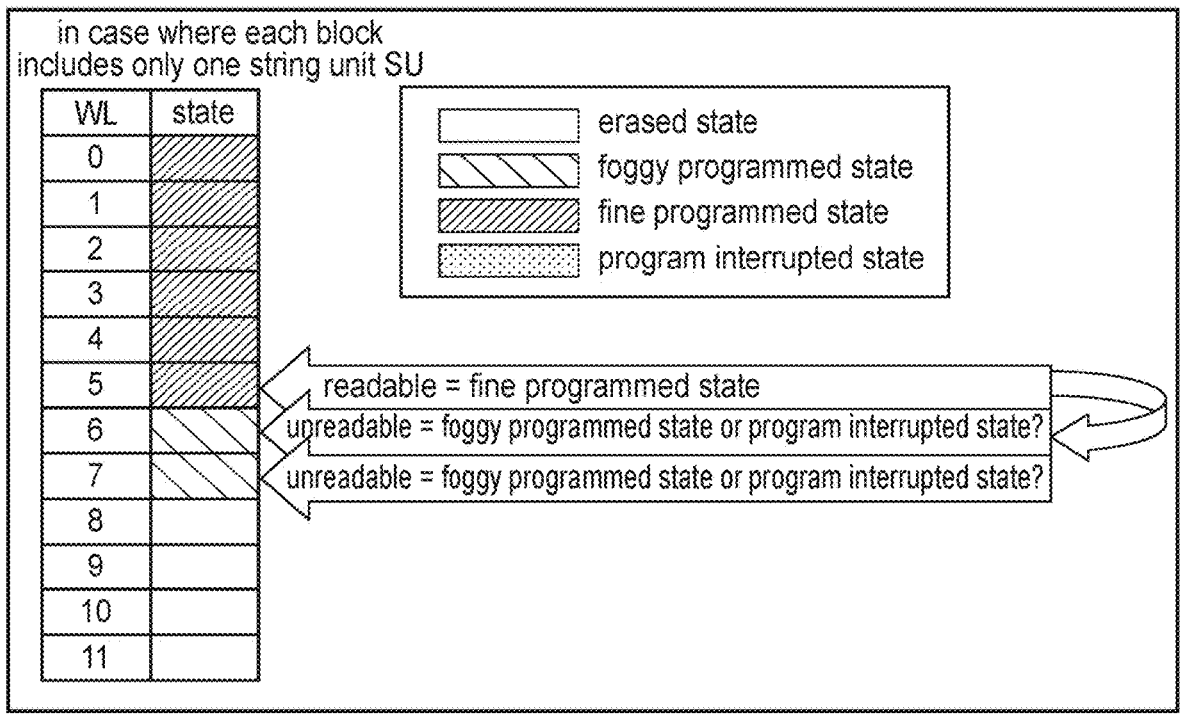
FIG. 27 illustrates a fourth example of the relationship between the foggy-fine program operations and the unexpected power loss determination process that are executed in the memory system according to the first embodiment in a case where each block includes only one string unit.

A still another case of determining that the previous write operation in the memory system 3 was stopped improperly will then be described. FIG. 27 illustrates a fourth example of the relationship between the foggy-fine program operations and the unexpected power loss determination process, which are executed in the memory system 3 according to the first embodiment, in the case where each block includes only one string unit.

It is assumed in this example that power loss occurred in a period between completion of the foggy program operation on the MG (WL7) and the start of the fine program operation on the MG (WL6).

When the memory system 3 restarts after power supply to the memory system 3 is shut off, the controller 5 identifies the last storage location that stores readable data according to the same procedure as described with reference to FIG. 15. In this case, the controller 5 identifies the MG (WL5) as the last storage location that stores readable data.

The controller 5 then determines whether a storage location connected to a word line subsequent to the word line connected to the identified storage location stores unreadable data. In other words, the controller 5 determines whether the MG (WL6) stores unreadable data.

When the MG (WL6) stores unreadable data, the controller 5 determines whether the MG (WL7), which is a storage location on which the foggy program operation is to be executed subsequently to execution of the foggy program operation on the MG (WL6), is in the erased state.

The MG (WL7) is in the foggy programmed state, and therefore data cannot be read correctly from the MG (WL7). In addition, the MG (WL7) includes one or more memory cells each having a threshold voltage higher than the erased page threshold voltage. It is therefore determined that the MG (WL7) is not in the erased state. On the basis of this result, the controller 5 determines that the foggy program operation on the MG (WL7) and the fine program operation on the MG (WL6) have not been completed as a series of program operations. In this case, the controller 5 is not able to determine whether the MG (WL7) is in the foggy programmed state or power loss occurred during execution of the foggy program operation on the MG (WL7).

The controller 5 is also not able to determine whether the MG (WL6) is in the foggy programmed state or power loss occurred during execution of the fine program operation on the MG (WL6). This is because data stored in the MG (WL6) is unreadable data and the MG (WL7) is not in the erased state. Therefore, the MG (WL6) may be in the foggy programmed state or may be in the program interrupted state in which power loss occurred during execution of the fine program operation.

In this manner, when there is a possibility that a storage location in the program interrupted state may be present in the block allocated as the write destination block, the controller 5 determines that the previous write operation in the memory system 3 was stopped improperly.

Figure 28:
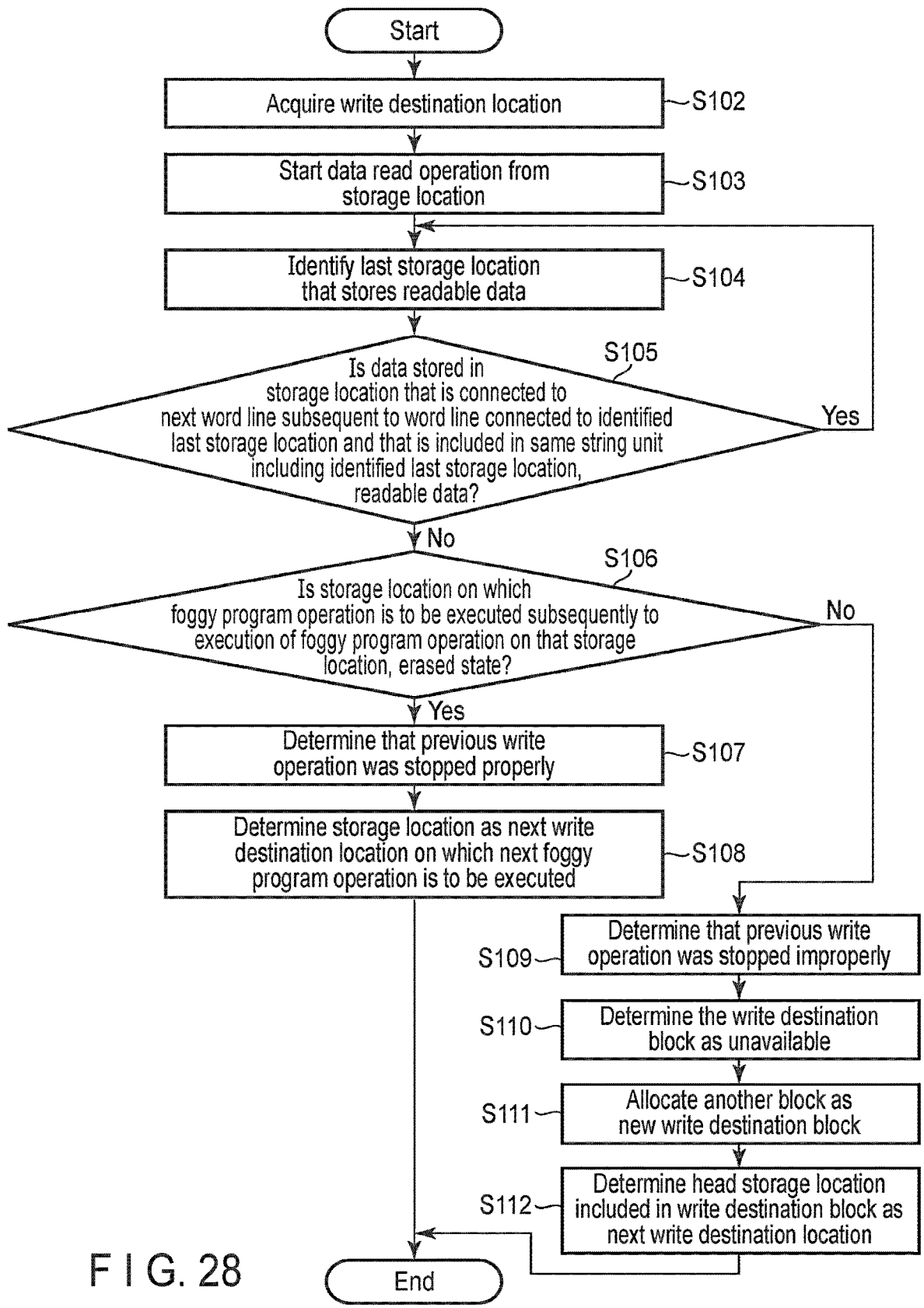
FIG. 28 is a flowchart illustrating the procedure of the unexpected power loss determination process executed in the memory system according to the first embodiment.

The procedure of the unexpected power loss determination process will then be described. FIG. 28 is a flowchart illustrating the procedure of the unexpected power loss determination process that is executed in the memory system 3 according to the first embodiment. When the memory system 3 restarts, that is, power supply to the memory system 3 is resumed after power supply to the memory system 3 is shut off, the controller 5 executes the unexpected power loss determination process. The unexpected power loss determination process is a process of determining whether the previous write operation in the memory system 3 was stopped properly and correctly determining the next write destination storage location.

When power supply to the memory system 3 is resumed, the controller 5 acquires information indicating a write destination storage location (step S102). The controller 5 reads the information indicating the write destination storage location, from the NAND memory 6. The information indicating the write destination storage location is periodically stored in the NAND memory 6. A storage location indicated as the write destination storage location by the information acquired from the NAND memory 6 is, therefore, a storage location to which a data write operation had been completed when the previous power loss occurred, among storage locations included in the write destination block.

The controller 5 starts a data read operation from the storage location indicated by the information acquired in step S102 (step S103). The controller 5 executes the data read operation on the storage location indicated by the information acquired in step S102, and checks a result of error correction (ECC pass or ECC error) by the ECC circuit 55. The controller 5 thus determines whether data stored in the storage location is readable data. When the data stored in the storage location is readable data, the controller 5 executes a data read operation on the next storage location subsequent to this storage location, and checks a result of error correction by the ECC circuit 55. The controller 5 thus determines whether data stored in the next storage location is readable data.

By repeating the data read operation and check of the error correction result in step S103, the controller 5 identifies the last storage location that stores readable data (step S104). The last storage location that stores readable data is a storage location storing data that becomes readable last, among the storage locations included in the write destination block.

The controller 5 determines whether data stored in a storage location that is connected to the next word line subsequent to the word line connected to the identified last storage location (i.e., the last storage location that stores readable data) and that is included in the same string unit including the identified last storage location, is readable data (step S105).

When the data stored in the storage location that is connected to the next word line and included in the same string unit is not readable data (No in step S105), the process by the controller 5 proceeds to step S106. In this case, the data stored in the storage location that is connected to the next word line and included in the same string unit is unreadable data.

The controller 5 determines whether a storage location on which the foggy program operation is to be executed subsequently to execution of the foggy program operation on the storage location that stores the unreadable data is in the erased state (step S106). The controller 5 executes the erased page check on the storage location on which the foggy program operation is to be executed subsequently to the storage location that stores the unreadable data. By executing the erased page check, the controller 5 determines whether the target storage location includes a memory cell whose threshold voltage is equal to or higher than the erased page threshold voltage. When the storage location does not include a memory cell whose threshold voltage is equal to or higher than the erased page threshold voltage, the controller 5 determines that the storage location is in the erased state.

When the storage location on which the foggy program operation is to be executed subsequently to the storage location that stores the unreadable data is in the erased state (Yes in step S106), that is, when the first condition is satisfied (No in step S105 and Yes in step S106), the controller 5 determines that the previous write operation in the memory system 3 was stopped properly (step S107). The controller 5 understands that the previous power loss occurred in a period between completion of the fine program operation on the storage location identified in step S104 and the start of the foggy program operation on the storage location on which the erased page check in step S106 is performed. On the basis of this understanding, the controller 5 determines that the previous write operation in the memory system 3 was stopped properly.

The controller 5 determines the storage location determined to be in the erased state in step S106, as the next write destination storage location on which the next foggy program operation is to be executed (step S108). In other words, when determining that the previous write operation in the memory system 3 was stopped properly, the controller 5 decides to continue data writing to the block allocated as the write destination block.

When the data stored in the storage location that is connected to the next word line and included in the same string unit is readable data (Yes in step S105), the process by the controller 5 returns to step S104.

In this case, the first condition is not satisfied. Besides, it is determined that the last storage location identified in step S104 is incorrect one. The controller 5, therefore, identifies again the last storage location that stores readable data (step S104).

When the storage location on which the foggy program operation is to be executed subsequently to the storage location that is determined to be storing the unreadable data in step S105 is not in the erased state (No in step S106), the controller 5 determines that the previous write operation in the memory system 3 was stopped improperly (step S109). The controller 5 understands that the previous power loss to the memory system 3 occurred during a period between the start of the foggy program operation on the storage location determined not to be in the erased state in step S106 and completion of the fine program operation on the storage location on which the fine program operation is to be executed subsequently to the storage location identified in step S104. The controller 5 thus determines that the previous write operation in the memory system 3 was stopped improperly. In this case, there is a possibility that a storage location in the program interrupted state may be present in the block allocated as the write destination block.

In this case, the first condition is not satisfied. The controller 5, therefore, determines the block allocated as the write destination block, as an unavailable block (step S110). The controller 5 registers this block in the block management table 72 as an unavailable block.

The controller 5 allocates another block as a new write destination block (step S111). The controller 5 selects the block from the free block list 73. The controller 5 then allocates the selected block as the write destination block.

The controller 5 determines the head storage location among a plurality of storage locations included in the block allocated as the write destination block, that is, one of one or more storage locations connected to the head word line, as the next write destination storage location (step S112).

Basically, the controller 5 may execute the unexpected power loss determination process every time power supply is resumed, regardless of whether the previous power loss is unexpected power loss in which power supply is suddenly shut off or power supply is shut off after receiving a shutdown notice from the host 2.

Note that the controller 5 may execute the unexpected power loss determination process in response to the restart of power supply only when the previous power loss was the unexpected power loss. When receiving the shutdown notice from the host 2, the controller 5 performs a shutdown preparation process that includes a process of storing necessary data to the NAND memory 6. Therefore, in response to the restart of power supply, the controller 5 can determine, for example, whether information indicating completion of the shutdown preparation process is stored in the NAND memory 6. When the information indicating completion of the shutdown preparation process is not stored in the NAND memory 6, the controller 5 determines that the previous power loss is the unexpected power loss.

The procedure of the data write operation on the write destination block will then be described. FIG. 29 is a flowchart illustrating the procedure of the data write operation executed in the memory system 3 according to the first embodiment.

The controller 5 determines whether data to be written into a write destination block has been prepared (step S21). For example, the controller 5 determines whether the size of data to be written has reached the size of a write unit. The size of the write unit is the size of data to be written into one storage location (memory cell group MG) of the write destination block. When data is written to the write destination block in the QLC mode, the size of the write unit is equivalent to the size of four pages.

When data to be written into the write destination block has not been prepared (No in step S21), the controller 5 waits until the data is prepared.

When data to be written into the write destination block has been prepared (Yes in step S21), the controller 5 determines whether a storage location of the next writing destination is a storage location connected to the head word line of the write destination block (step S22).

When the storage location of the next write destination is not connected to the head word line (No in step S22), the controller 5 executes the foggy program operation on the storage location of the next write destination (step S23).

The controller 5 then executes the fine program operation on a storage location to which the fine program operation has become executable upon having executed the foggy program operation in step S23 (step S24).

When the storage location of the next write destination is connected to the head word line (Yes in step S22), the controller 5 determines whether the total size of data to be written into the write destination block has reached the size that enables execution of the fine program operation (step S25). For example, in a case where the write destination block includes four string units SU, the data size that enables execution of the fine program operation is equivalent to the size of five storage locations (five memory cell groups MG). When data is written into the write destination block in the QLC mode, therefore, the data size that enables execution of the fine program operation is equivalent to the size of 20 pages.

When the total size of data has not reached the size that enables execution of the fine program operation (No in step S25), the controller 5 waits until the total size of data reaches the size that enables execution of the fine program operation. In this case, the process by the controller 5 returns to step S25.

When the total size of data has reached the size that enables execution of the fine program operation (Yes in step S25), the controller 5 executes the foggy program operations until the fine program operation becomes executable (step S23). Specifically, the controller 5 executes the foggy program operations on one or more storage locations that are connected to the head word line of the write destination block and the foggy program operation on one storage location that is connected to the word line subsequent to the head word line.

The controller 5 then executes the fine program operation on a storage location to which the fine program operation has become executable upon having executed the foggy program operation in step S23 (step S24).

As described above, according to the first embodiment, the controller 5 can determine whether the previous write operation was stopped properly by using the rule that the foggy program operation and the fine program operation, which becomes executable upon completion of the foggy program operation, are executed as a series of program operations, thereby determining the next write destination storage location correctly.

A method of determining, in the first embodiment, whether a storage location on which the fine program operation of the series of program operations is to be executed is in the foggy programmed state or in the program interrupted state in which power loss occurred during execution of the fine program operation, will then be described.

For example, in the case of FIG. 18, the MG (WL N+1, SU2) is a storage location that cannot be determined to be whether in the foggy programmed state or in the program interrupted state in which power loss occurred during execution of the fine program operation.

When determining that the foggy program operation on the MG (WL N+2, SU2) and the fine program operation on the MG (WL N+1, SU2) have not been completed as a series of program operations, the controller 5 may execute the following operations.

The controller 5 executes the fine program operation on the MG (WL N+1, SU2). When completing the fine program operation on the MG (WL N+1, SU2), the controller 5 determines whether data is read correctly from the MG (WL N+1, SU2). When data is read correctly from the MG (WL N+1, SU2), the controller 5 can determine that the MG (WL N+1, SU2) was in the foggy programmed state when the previous write operation was stopped.

A measure by which, in the first embodiment, a series of program operations can be completed even if unexpected power loss occurs during execution of a write operation will then be described.

As illustrated with a broken line in FIG. 1, the memory system 3 may further include a capacitor 81. The capacitor 81 is an element capable of storing power. The capacitor 81 is electrically connected to the power supply circuit 8. When a voltage supplied from the host 2 drops due to unexpected power loss, the power supply circuit 8 supplies power accumulated in the capacitor 81, to the respective components of the memory system 3.

When the unexpected power loss has occurred, the controller 5 continues a write operation by using power from the capacitor 81, at least until a series of program operations in progress is completed. For example, in the case of FIG. 16, unexpected power loss occurs during execution of the foggy program operation on the MG (WL N+2, SU2). In this case, the controller 5 continues the foggy program operation on the MG (WL N+2, SU2) by using power from the capacitor 81. When completing the foggy program operation on the MG (WL N+2, SU2), the controller 5 executes the fine program operation on the MG (WL N+1, SU2) by using power from the capacitor 81. Through this process, the series of program operations is completed.

In the case of FIG. 17, for example, unexpected power loss occurs during execution of the fine program operation on the MG (WL N+1, SU2). In this case, the controller 5 continues the fine program operation on the MG (WL N+1, SU2) by using power from the capacitor 81. Through this process, the series of program operations is completed.

In the case of FIG. 18, for example, unexpected power loss occurs in a period between completion of the foggy program operation on the MG (WL N+2, SU2) and the start of the fine program operation on the MG (WL N+1, SU2). In this case, the controller 5 executes the fine program operation on the MG (WL N+1, SU2) by using power from the capacitor 81. Through this process, the series of program operations is completed.

An operation of writing information which indicates a storage location where a write operation is interrupted, into the NAND memory 6 by using power from the capacitor 81, which is executed in the first embodiment, will then be described.

For example, in the case of FIG. 16, unexpected power loss occurs during execution of the foggy program operation on the MG (WL N+2, SU2). In this case, the controller 5 writes information which indicates the MG (WL N+2, SU2) where writing of data is interrupted, into the NAND memory 6 by using power from the capacitor 81.

In the case of FIG. 17, for example, unexpected power loss occurs during execution of the fine program operation on the MG (WL N+1, SU2). In this case, the controller 5 writes information which indicates the MG (WL N+1, SU2) where writing of data is interrupted, into the NAND memory 6 by using power from the capacitor 81.

In the case of FIG. 18, for example, unexpected power loss occurs in a period between completion of the foggy program operation on the MG (WL N+2, SU2) and the start of the fine program operation on the MG (WL N+1, SU2). In this case, the controller 5 writes information which indicates that the write operation is interrupted between the foggy program operation on the MG (WL N+2, SU2) and the fine program operation on the MG (WL N+1, SU2), into the NAND memory 6.

In this manner, by writing information on a storage location where the write operation is interrupted, into the NAND memory 6, whether the previous write operation was stopped properly can be easily determined.

Second Embodiment

A second embodiment will be described. FIG. 30 is a block diagram illustrating an example of a configuration of an information processing system 1 including a memory system 3 according to the second embodiment.

Most of the components included in the memory system 3 according to the second embodiment are the same as those included in the memory system 3 according to the first embodiment illustrated in FIG. 1. The following description, therefore, will be focused on differences between the memory system 3 according to the second embodiment and the memory system 3 according to the first embodiment.

In the memory system 3 according to the second embodiment, the controller 5 additionally manages foggy program management information 76. The foggy program management information 76 is stored in, for example, the DRAM 7.

The foggy program management information 76 is information indicating a storage location in the foggy programmed state among a plurality of storage locations included in a block allocated as a write destination block. Specifically, the foggy program management information 76 indicates each storage location where the foggy program operation is completed and the fine program operation is not started yet.

Figure 31:
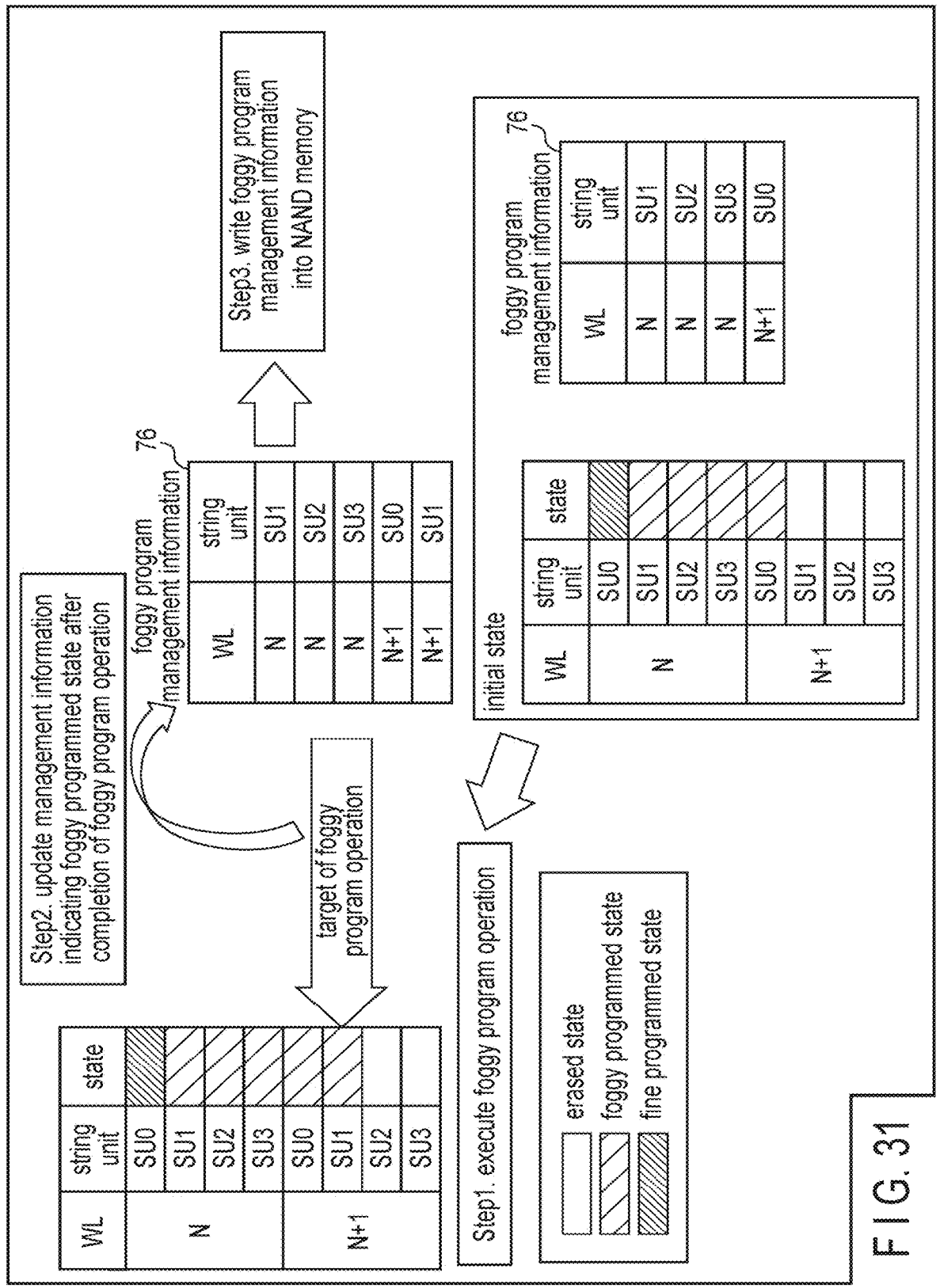
FIG. 31 illustrates a foggy program operation executed in the memory system according to the second embodiment.

An operation of updating the foggy program management information 76 in response to completion of the foggy program operation will then be described. FIG. 31 illustrates the foggy program operation executed in the memory system 3 according to the second embodiment.

In an initial state illustrated in FIG. 31, the MG (WL N, SU0) connected to the word line WL N is in the fine programmed state. The other three MGs (WL N, SU1), (WL N, SU2), and (WL N, SU3) connected to the word line WL N are each in the foggy programmed state. The MG (WL N+1, SU0) connected to the word line WL N+1 is also in the foggy programmed state. In the initial state illustrated in FIG. 31, therefore, information indicating the MG (WL N, SU1) to the MG (WL N, SU3) and information indicating the MG (WL N+1, SU0) are managed as the foggy program management information 76.

Step 1: The controller 5 executes, for example, the foggy program operation on the MG (WL N+1, SU1).

Step 2: In response to completion of the foggy program operation, the controller 5 updates the foggy program management information 76 stored in the DRAM 7. The controller 5 adds information indicating a storage location where the foggy program operation is completed, i.e., information indicating the MG (WL N+1, SU1), to the foggy program management information 76.

Step 3: The controller 5 writes the updated foggy program management information 76 into the NAND memory 6.

In this manner, the controller 5 updates the foggy program management information 76 in response to completion of the foggy program operation. The controller 5 then stores the updated latest foggy program management information 76 to the NAND memory 6.

In this manner, after completion of the foggy program operation, the foggy program management information 76 is updated and is written into the NAND memory 6. According to this process, for example, if power loss occurred during execution of the foggy program operation on the MG (WL N+1, SU1), information indicating the MG (WL N+1, SU1) is not added to the foggy program management information 76. When power supply to the memory system 3 is resumed, therefore, the controller 5 reads the foggy program management information 76 from the NAND memory 6, thereby properly determining each storage location in the foggy programmed state, which is included in a block allocated as a write destination block at the time of power loss. Then, the controller 5 can determine that the MG (WL N+1, SU1) storing unreadable data is in the program interrupted state. Hence, the controller 5 can determine that the previous write operation was stopped improperly.

An operation of updating the foggy program management information 76 before starting the fine program operation will then be described. FIG. 32 illustrates the fine program operation executed in the memory system 3 according to the second embodiment. It is assumed in FIG. 32 that after the state illustrated in FIG. 31, the fine program operation on the MG (WL N, SU1) is started.

Step 1: Before starting the fine program operation on the MG (WL N, SU1), the controller 5 updates the foggy program management information 76. Specifically, the controller 5 deletes information indicating the MG (WL N, SU1) on which the fine program operation is to be executed next, from the foggy program management information 76.

Step 2: The controller 5 writes the updated foggy program management information 76 into the NAND memory 6.

Step 3: The controller 5 executes the fine program operation on the MG (WL N, SU1).

In this manner, before starting the fine program operation on a certain storage location, the controller 5 updates the foggy program management information 76 so that information indicating the certain storage location is deleted from the foggy program management information 76. The controller 5 then stores the updated latest foggy program management information 76 into the NAND memory 6.

When power loss occurs during execution of the fine program operation on the MG (WL N, SU1), the MG (WL N, SU1) transitions not to the foggy programmed state but to the program interrupted state. The information indicating the MG (WL N, SU1) has already been deleted from the foggy program management information 76. Therefore, even if power loss occurs during execution of the fine program operation, the controller 5 reads the foggy program management information 76 from the NAND memory 6 at the restart of power supply to the memory system 3, thereby correctly determining each storage location in the foggy programmed state (that is, the MG (WL N, SU1) is not in the foggy programmed state but in the program interrupted state) in a block allocated as a write destination block at the time of power loss.

On the basis of the foggy program management information 76, therefore, the controller 5 can correctly determine whether each storage location storing unreadable data is in the foggy programmed state or in the program interrupted state. The controller 5 is thus able to correctly determine whether a storage location in the program interrupted state is present in the block allocated as the write destination block at the time of the power loss. When determining that no storage location in the program interrupted state is present in the block, the controller 5 continues the data write operation on this block.

Specifically, when power supply to the memory system 3 is resumed, the controller 5 may execute the following unexpected power loss determination process.

The controller 5 reads the foggy program management information 76 from the NAND memory 6. By referring to the foggy program management information 76, the controller 5 checks foggy programmed states in the write destination block. Now a case is assumed where the foggy program management information 76 illustrated in FIG. 32 is stored in the NAND memory 6. The foggy program management information 76 illustrated in FIG. 32 indicates that the MG (WL N, SU2), the MG (WL N, SU3), the MG (WL N+1, SU0), and the MG (WL N+1, SU1) are storage locations in the foggy programmed state. The MG (WL N, SU2) is the oldest storage location among the storage locations in the foggy programmed state. The MG (WL N+1, SU1) is the latest storage location among the storage locations in the foggy programmed state.

The controller 5 determines whether a second condition that: (2-A) the storage location (MG (WL N, SU1)) on which the foggy program operation was executed immediately before execution of the foggy program operation on the oldest storage location (MG (WL N, SU2)) in the foggy programmed state, which is indicated by the foggy program management information 76, stores readable data; (2-B) each of the storage locations (MG (WL N, SU2), MG (WL N, SU3), MG (WL N+1, SU0), and MG (WL N+1, SU1)), which are indicated by the foggy program management information 76, stores unreadable data; and (2-C) the storage location (MG (WL N+1, SU2)) on which the foggy program operation is to be executed subsequently to execution of the foggy program operation on the latest storage location (MG (WL N+1, SU1)) in the foggy programmed state, which is indicated by the foggy program management information 76, is in the erased state, is satisfied.

When this condition is satisfied, the controller 5 determines that the previous write operation in the memory system 3 was stopped properly, and determines the MG (WL N+1, SU2) as the next write destination storage location.

When this condition is not satisfied, the controller 5 determines that the previous write operation in the memory system 3 was stopped improperly and a storage location in the program interrupted state is present in the write destination block, and then allocates a new block as the write destination block.

Figure 33:
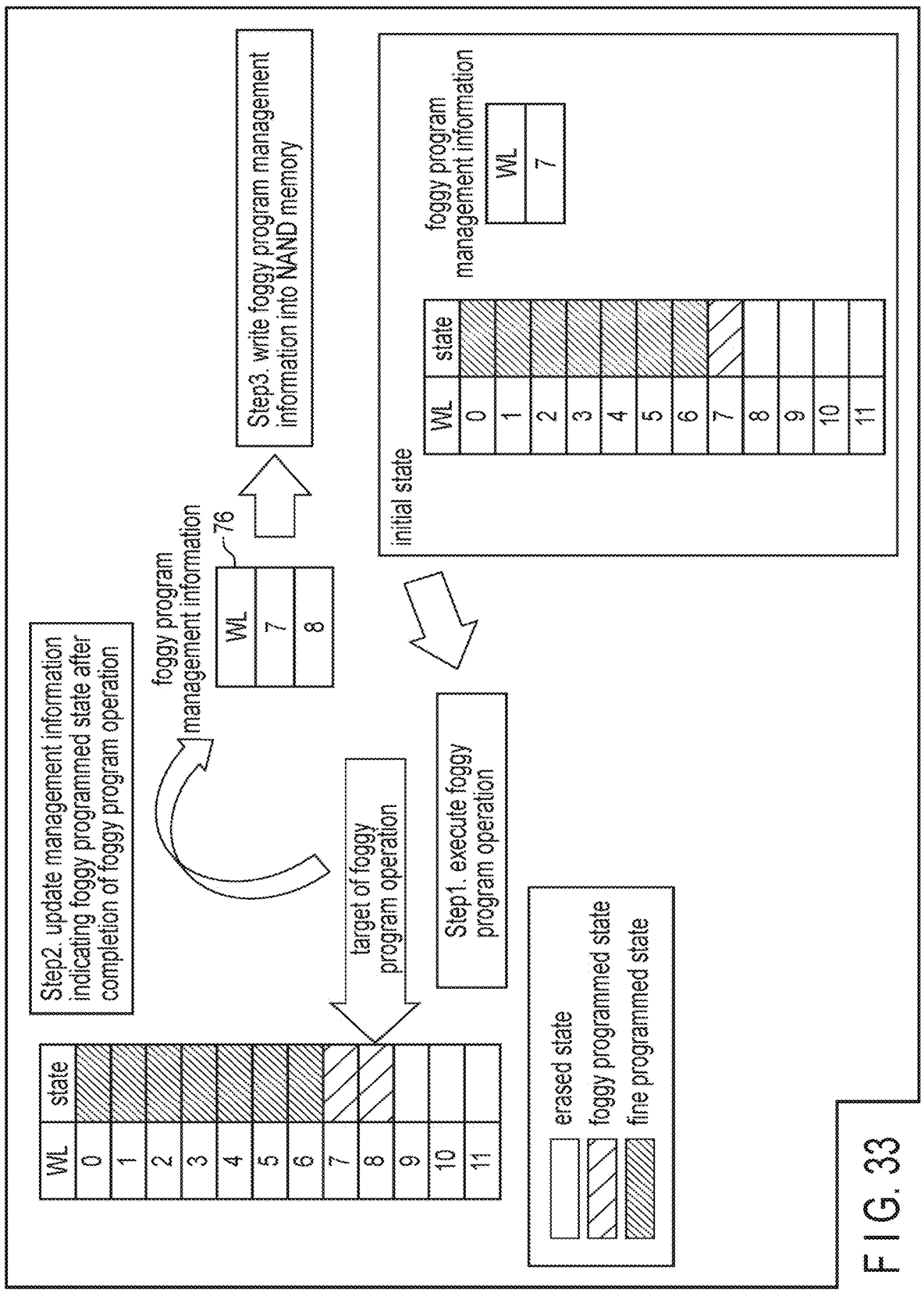
FIG. 33 illustrates a foggy program operation executed in the memory system according to the second embodiment in a case where each block includes only one string unit.

An operation of updating the foggy program management information 76 in response to completion of the foggy program operation, which is executed in a case where each block includes only one string unit, will then be described. FIG. 33 illustrates the foggy program operation in a case where each block includes only one string unit, which is executed in the memory system 3 according to the second embodiment.

In an initial state illustrated in FIG. 33, the MG (WL0) to MG (WL6) are each in the fine programmed state. The MG (WL7) is in the foggy programmed state. The foggy program management information 76, therefore, includes information indicating the MG (WL7).

Step 1: The controller 5 executes, for example, the foggy program operation on a storage location connected to the word line WL8.

Step 2: In response to completion of the foggy program operation, the controller 5 updates the foggy program management information 76 stored in the DRAM 7. The controller 5 adds information which indicates a storage location where the foggy program operation is completed, i.e., information indicating the MG (WL8), to the foggy program management information 76.

Step 3: The controller 5 writes the updated foggy program management information 76 into the NAND memory 6.

An operation of updating the foggy program management information 76 before starting the fine program operation, which is executed in the case where each block includes only one string unit, will then be described. FIG. 34 illustrates the fine program operation in the case where each block includes only one string unit, which is executed in the memory system 3 according to the second embodiment. It is assumed in FIG. 34 that after the state illustrated in FIG. 33, the fine program operation on the MG (WL7) is started.

Step 1: Before starting the fine program operation on the MG (WL7), the controller 5 updates the foggy program management information 76. The controller 5 deletes information which indicates the MG (WL7) on which the fine program operation is to be executed next, from the foggy program management information 76.

Step 2: The controller 5 writes the updated foggy program management information 76 into the NAND memory 6.

Step 3: The controller 5 executes the fine program operation on the MG (WL7).

In this manner, even when each block includes only one string unit, the controller 5 executes updating of the foggy program management information 76 and writing of the foggy program management information 76 into the NAND memory 6 in the same manner as in the case of each block includes two or more string units.

A process of updating the foggy program management information 76 will then be described. FIG. 35 is a flowchart illustrating the procedure of a process of updating and storing the foggy program management information 76 in response to completion of the foggy program operation, which is executed in the memory system 3 according to the second embodiment.

First, the controller 5 determines whether the foggy program operation on a certain storage location has been completed (step S31).

When the foggy program operation is not completed yet (No in step S31), the controller 5 waits until the foggy program operation is completed.

When the foggy program operation has been completed (Yes in step S31), the controller 5 updates the foggy program management information 76 (step S32). The controller 5 adds, to the foggy program management information 76, information indicating the storage location that has transitioned to the foggy programmed state upon completion of the foggy program operation.

The controller 5 writes the foggy program management information 76 updated in step S32, into the NAND memory 6 (step S33). As a result, the updated foggy program management information 76 is stored in the NAND memory 6. The updated foggy program management information 76 may be written into, for example, an SLC block.

FIG. 36 is a flowchart illustrating the procedure of a process of updating and storing the foggy program management information 76 before starting the fine program operation, which is executed in the memory system 3 according to the second embodiment.

First, the controller 5 determines whether the fine program operation is executable on any one of the storage locations (step S41).

When the fine program operation is not executable (No in step S41), the controller 5 waits until the fine program operation becomes executable.

When the fine program operation is executable (Yes in step S41), the controller 5 updates the foggy program management information 76 (step S42). The controller 5 deletes, from the foggy program management information 76, information indicating a storage location on which the fine program operation, which has become executable, is to be executed.

The controller 5 writes the foggy program management information 76 updated in step S42, into the NAND memory 6 (step S43). As a result, the updated foggy program management information 76 is stored in the NAND memory 6.

The controller 5 then executes the fine program operation (step S44).

Figure 37:
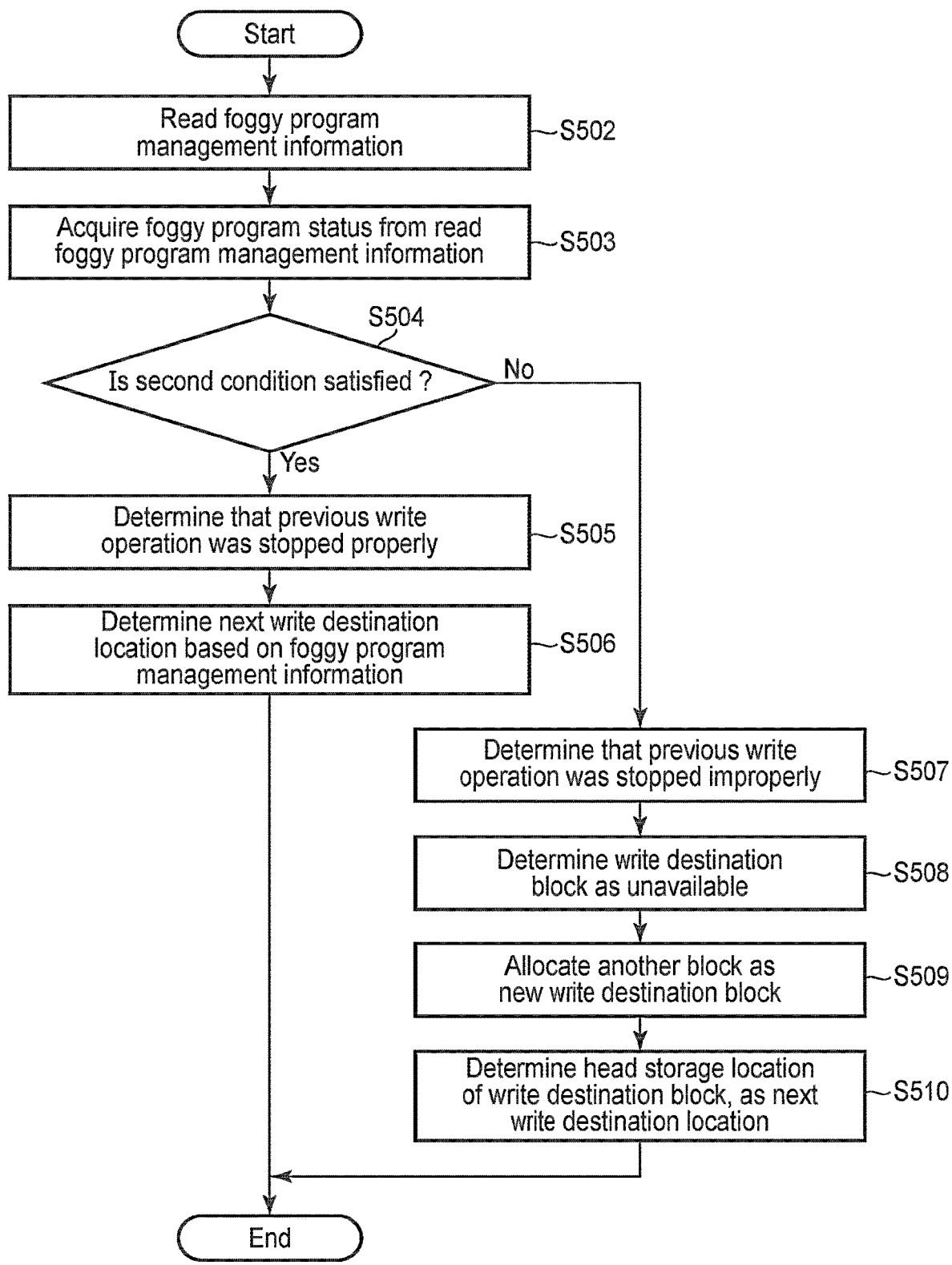
FIG. 37 is a flowchart illustrating the procedure of an unexpected power loss determination process executed in the memory system according to the second embodiment.

The unexpected power loss determination process will then be described. FIG. 37 is a flowchart illustrating the procedure of the unexpected power loss determination process executed in the memory system 3 according to the second embodiment.

When power supply to the memory system 3 is resumed, the controller 5 reads the foggy program management information 76 from the NAND memory 6 (step S502).

The controller 5 acquires a foggy program status of a write destination block, from the foggy program management information 76 read in step S502 (step S503).

By referring to the foggy program management information 76, the controller 5 checks the foggy program status of the write destination block (step S504). Specifically, the controller 5 identifies the oldest storage location in the foggy programmed state and the latest storage location in the foggy programmed state within the foggy program management information 76. The controller 5 then determines whether a second condition that: (1) a storage location on which the foggy program operation was executed immediately before execution of the foggy program operation on the oldest storage location in the foggy programmed state, stores readable data; (2) each of storage locations which are indicated by the foggy program management information 76 stores unreadable data; and (3) a storage location on which the foggy program operation is to be executed subsequently to execution of the foggy program operation on the latest storage location in the foggy programmed state, is in the erased state, is satisfied.

When the second condition is satisfied (Yes in step S504), the controller 5 determines that the previous write operation in the memory system 3 was stopped properly, that is, no storage location in the program interrupted state is present in the block allocated as the write destination block (step S505).

On the basis of the foggy program management information 76 read in step S502, the controller 5 then determines the next write destination storage location (step S506). The storage location on which the foggy program operation is to be executed subsequently to the latest storage location in the foggy programmed state is thus determined as the next write destination storage location.

When the second condition is not satisfied (No in step S504), the controller 5 determines that the previous write operation in the memory system 3 was stopped improperly (step S507).

The controller 5 registers the block, which is allocated as the write destination block, in the block management table 72 as an unavailable block (step S508).

The controller 5 allocates another block as a new write destination block (step S509). The controller 5 selects the block from the free block list 73, and allocates the selected block as the write destination block.

The controller 5 determines the head storage location of the write destination block as the next write destination storage location (step S510).

Basically, the controller 5 may execute the unexpected power loss determination process every time power supply is resumed, regardless of whether the previous power loss is unexpected power loss in which power supply is suddenly shut off or power supply is shut off after receiving a shutdown notice from the host 2.

Note that the controller 5 may execute the unexpected power loss determination process in response to the restart of power supply only when the previous power loss was the unexpected power loss.

As described above, in the memory system 3 according to the second embodiment, the controller 5 can determine whether the previous write operation was stopped properly by using the foggy program management information 76 written in the NAND memory 6, thereby correctly determining the next write destination storage location.

Third Embodiment

A memory system 3 according to the third embodiment has a configuration for reducing the number of times of write operations of writing the foggy program management information 76 into the NAND memory 6.

Specifically, in the memory system 3 according to the third embodiment, the foggy program management information 76 is written into the NAND memory 6 only in the case of unexpected power loss in which power supply to the memory system 3 is shut off without notice from the host 2.

A configuration of the memory system 3 according to the third embodiment will be described. FIG. 38 illustrates an example of a configuration of the information processing system 1 that includes the memory system 3 according to the third embodiment.

Most of the components included in the memory system 3 according to the third embodiment are the same as those included in the memory system 3 according to the second embodiment illustrated in FIG. 30. The following description, therefore, will be focused on differences between the memory system 3 according to the third embodiment and the memory system 3 according to the second embodiment.

The memory system 3 according to the third embodiment further includes the capacitor 81.

When unexpected power loss has occurred, the controller 5 executes a process of storing the foggy program management information 76 to the NAND memory 6 by using power from the capacitor 81.

Figure 39:
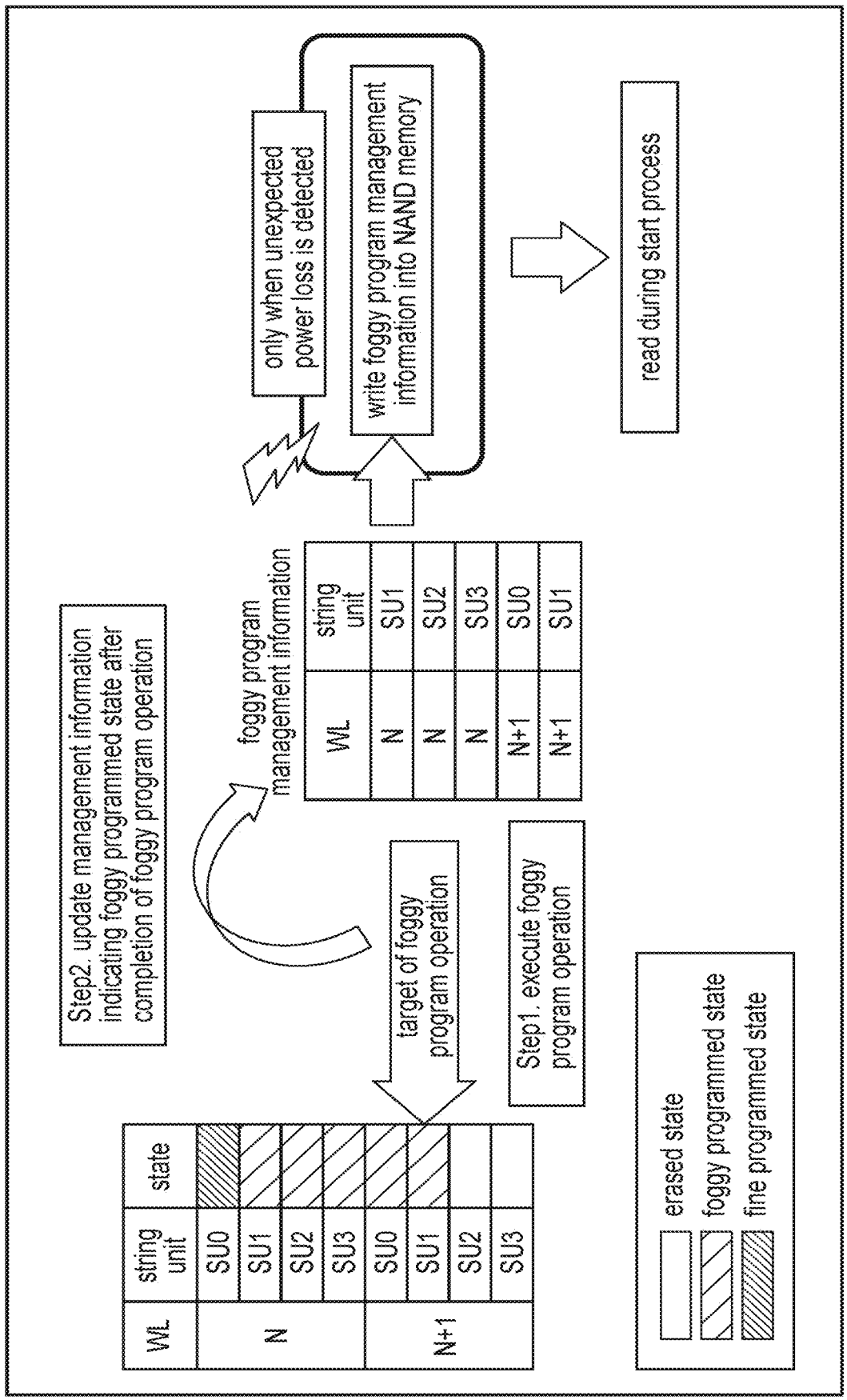
FIG. 39 illustrates a process of storing foggy program management information to a nonvolatile memory, which is executed in the memory system according to the third embodiment.

The foggy program operation and an operation of writing the foggy program management information 76 into the NAND memory 6 will then be described. FIG. 39 illustrates the foggy program operation and a process of storing the foggy program management information 76 to the NAND memory 6, which are executed in the memory system 3 according to the third embodiment.

Step 1: The controller 5 executes, for example, the foggy program operation on the MG (WL N+1, SU1).

Step 2: In response to completion of the foggy program operation, the controller 5 updates the foggy program management information 76 stored in the DRAM 7. The controller 5 adds information which indicates the MG (WL N+1, SU1) where the foggy program operation has been completed, to the foggy program management information 76.

In the same manner as in the second embodiment, before starting the fine program operation on a certain storage location, the controller 5 updates the foggy program management information 76 stored in the DRAM 7 so as to delete information indicative of the certain storage location.

When having detected occurrence of unexpected power loss, the controller 5 writes the foggy program management information 76 stored in the DRAM 7, into the NAND memory 6. At this time, the controller 5 and the NAND memory 6 operate by using power accumulated in the capacitor 81. After writing the foggy program management information 76 into the NAND memory 6, the controller 5 controls the power supply circuit 8 to stop operating of the memory system 3.

Then, when power supply to the memory system 3 is resumed, the controller 5 reads the foggy program management information 76 from the NAND memory 6.

Figure 40:
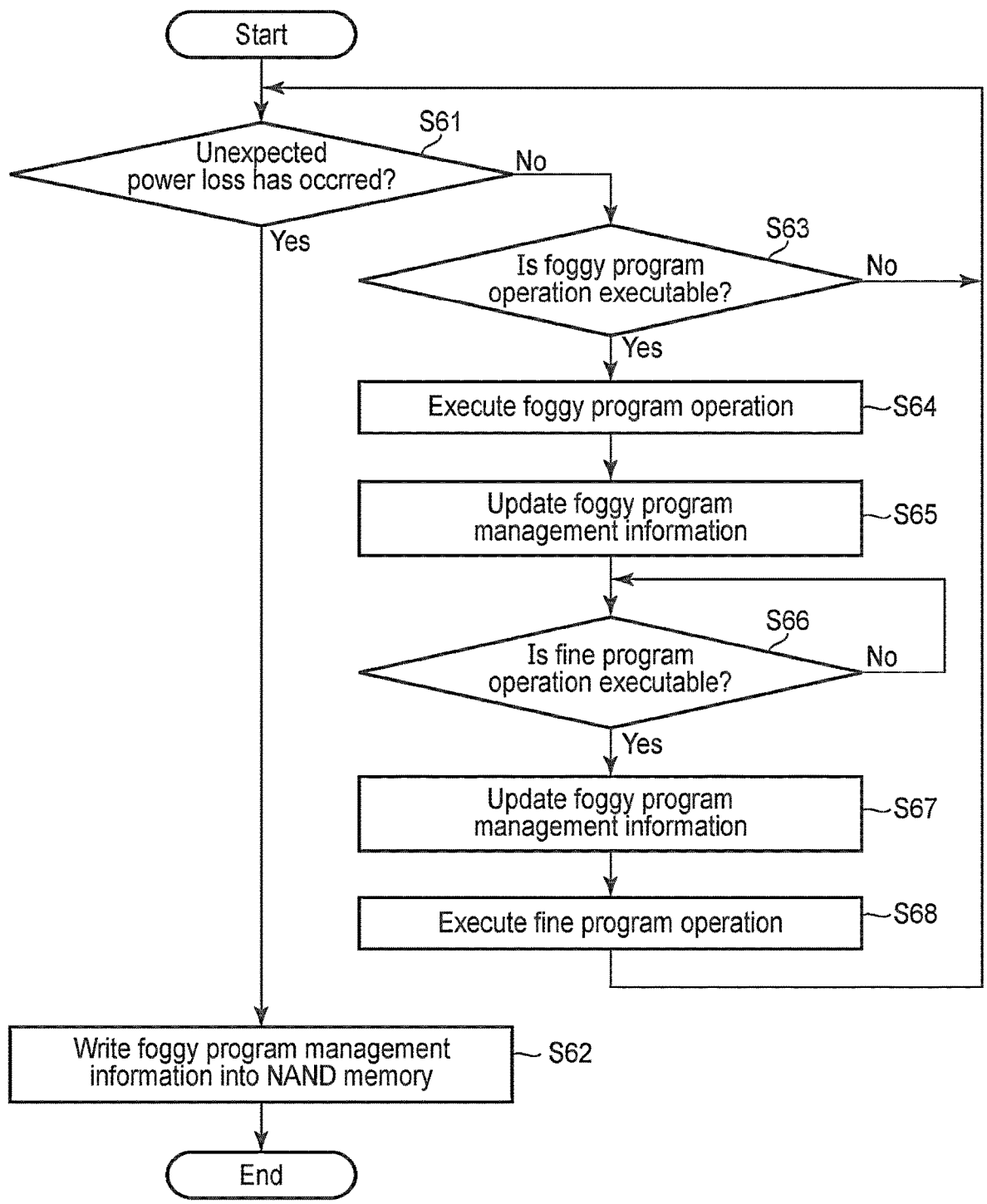
FIG. 40 is a flowchart illustrating the procedure of a process of managing the foggy program management information, which is executed in the memory system according to the third embodiment.

A process of managing the foggy program management information 76 will then be described. FIG. 40 is a flowchart illustrating the procedure of a process of managing the foggy program management information 76, which is executed in the memory system 3 according to the third embodiment.

First, the controller 5 determines whether unexpected power loss has occurred (step S61).

When unexpected power loss has occurred (Yes in step S61), the controller 5 writes the foggy program management information 76 stored in the DRAM 7, into the NAND memory 6 (step S62).

When unexpected power loss has not occurred (No in step S61), the controller 5 determines whether the foggy program operation is executable (step S63).

When the foggy program operation is not executable (No in step S63), the controller 5 waits until the foggy program operation becomes executable or unexpected power loss occurs.

When the foggy program operation is executable (Yes in step S63), the controller 5 executes the foggy program operation (step S64).

In response to completion of the foggy program operation, the controller 5 then updates the foggy program management information 76 (step S65). The controller 5 adds information which indicates a storage location where the foggy program operation has been completed, to the foggy program management information 76.

The controller 5 determines whether the fine program operation is executable (step S66).

When the fine program operation is not executable (No in step S66), the controller 5 waits until the fine program operation becomes executable.

When the fine program operation is executable (Yes in step S66), the controller 5 updates the foggy program management information 76 before starting the fine program operation (step S67). The controller 5 deletes information which indicates a storage location where the fine program operation is to be executed, from the foggy program management information 76.

The controller 5 then executes the fine program operation (step S68). Subsequently, the process by the controller 5 returns to step S61.

Through these steps, in the memory system 3 according to the third embodiment, the controller 5 can determine whether the previous write operation was stopped properly, by the same method as executed in the second embodiment.

In addition, by using the capacitor 81, the foggy program management information 76 is written into the NAND memory 6 only when unexpected power loss occurred. As a result, the frequency of operations of writing the foggy program management information 76 into the NAND memory 6 can be reduced as compared to a case where the foggy program management information 76 is written into the NAND memory 6 every time the foggy program management information 76 is updated. This suppresses effects on write amplification and I/O performance.

Fourth Embodiment

Components of a memory system 3 according to a fourth embodiment are the same as the components of the memory system 3 according to the third embodiment that have been described with reference to FIG. 38, and therefore will be omitted in further description.

Figure 41:
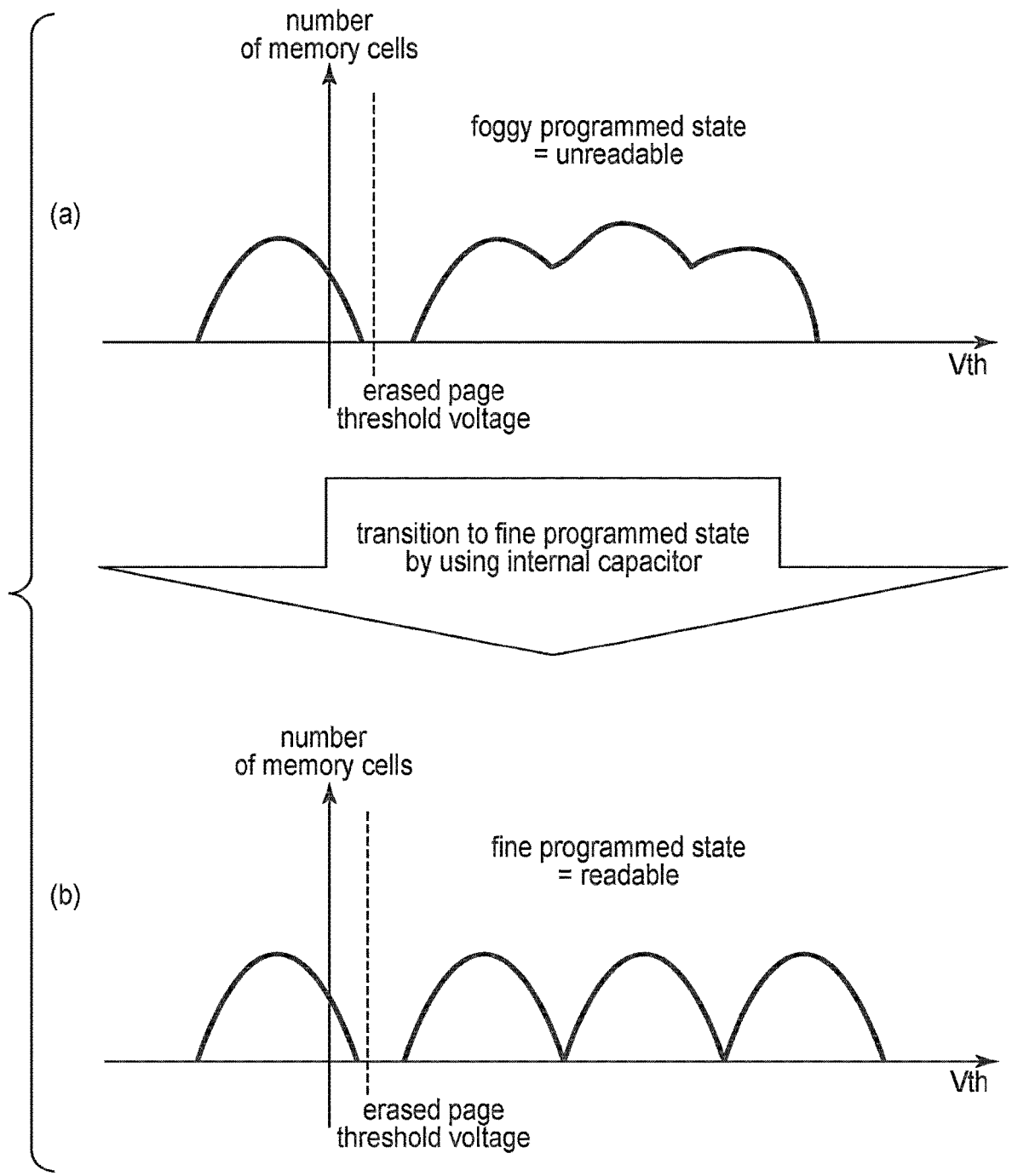
FIG. 41 illustrates an additional write operation of transitioning the threshold voltage of a memory cell from a foggy programmed state to a fine programmed state, which is executed in a memory system according to a fourth embodiment.

A data write operation executed in the memory system 3 according to the fourth embodiment will then be described. In the memory system 3 according to the fourth embodiment, when unexpected power loss has occurred, a write operation of transitioning every storage location in the foggy programmed state to the fine programmed state is executed by using power accumulated in the capacitor 81. FIG. 41 illustrates an additional write operation of transitioning the threshold voltage of a memory cell from the foggy programmed state to the fine programmed state, which is executed in the memory system 3 according to the fourth embodiment.

As illustrated in FIG. 41 (*a*), the threshold voltage of each of a plurality of memory cells included in a storage location in the foggy programmed state, where the foggy program operation has been executed but the fine program operation has not been executed yet, is set with low precision in which data cannot be read correctly.

In the memory system 3 according to the fourth embodiment, in a case where unexpected power loss occurs when a storage location in the foggy programmed state is present, the controller 5 executes the fine program operation on this storage location by using power stored in the capacitor 81.

As illustrated in FIG. 41 (*b*), each of a plurality of memory cells included in a storage location in the fine programmed state has a threshold voltage corresponding to a data value to be stored in each memory cell.

A block where a data write operation is executed at occurrence of unexpected power loss will then be described. FIG. 42 illustrates a state of storage locations of a block in which unexpected power loss has occurred and a state of the storage locations of the block after execution of the additional write operation, which are in the memory system 3 according to the fourth embodiment.

FIG. 42 (*a*) illustrates the state of storage locations of a block in which unexpected power loss has occurred. It is assumed in FIG. 42 (*a*) that unexpected power loss has occurred in a period between completion of the foggy program operation on the MG (WL N+2, SU2) and completion of the fine program operation on the MG (WL N+1, SU2).

When unexpected power loss has occurred, the controller 5 executes the additional write operation of transitioning each storage location in the foggy programmed state that is included in a write destination block, to the fine programmed state by using power accumulated in the capacitor 81.

To execute the fine program operation on a storage location included in each string unit connected to a certain word line, the foggy program operation needs to be executed on a storage location that is connected to the next word line subsequent to the certain word line and that is included in the same string unit. In an example of the additional write operation illustrated in FIG. 42 (*a*), the controller 5 completes the fine program operation on the MG (WL N+1, SU2), and then executes the foggy program operation on the MG (WL N+2, SU3). In this case, dummy data may be written into the MG (WL N+2, SU3).

FIG. 42 (*b*) illustrates a state of storage locations of the write destination block after the additional write operation is executed. As illustrated in FIG. 42 (*b*), all the storage locations included in the write destination block are in the fine programmed state. Because the write destination block becomes full, the controller 5 registers the write destination block in the QLC active block list 75.

Then, when power supply to the memory system 3 is resumed, the controller 5 selects another block from the free block list 73, and allocates the selected block as a new write destination block. The controller 5 then determines the head storage location of the new write destination block as the next write destination storage location.

The procedure of a data write operation executed at occurrence of unexpected power loss will then be described. FIG. 43 is a flowchart illustrating the procedure of a data write operation executed at occurrence of unexpected power loss, in the memory system 3 according to the fourth embodiment.

First, the controller 5 determines whether unexpected power loss has occurred (step S71).

When unexpected power loss has not occurred (No in step S71), the controller 5 waits until unexpected power loss occurs.

When unexpected power loss has occurred (Yes in step S71), the controller 5 executes the additional write operation (step S72). The controller 5 continues executing the additional write operation until the fine program operations on all storage locations included in a write destination block are completed, that is, until the write destination block becomes full.

In this manner, according to the memory system 3 of the fourth embodiment, when unexpected power loss occurs, the controller 5 continues executing the additional write operation until the write destination block becomes full. Because of this, when power supply to the memory system 3 is resumed, the controller 5 does not need to determine whether the previous power loss was unexpected power loss.

Fifth Embodiment

Components of a memory system 3 according to a fifth embodiment are the same as the components of the memory system 3 according to the first embodiment that have been described with reference to FIG. 1, and therefore will be omitted in further description.

In the fifth embodiment, the controller 5 writes a flag (foggy flag) to at least one memory cell for storing management information among a plurality of memory cells included in a storage location. The foggy flag is information indicating that the storage location is in the foggy programmed state.

Figure 44:
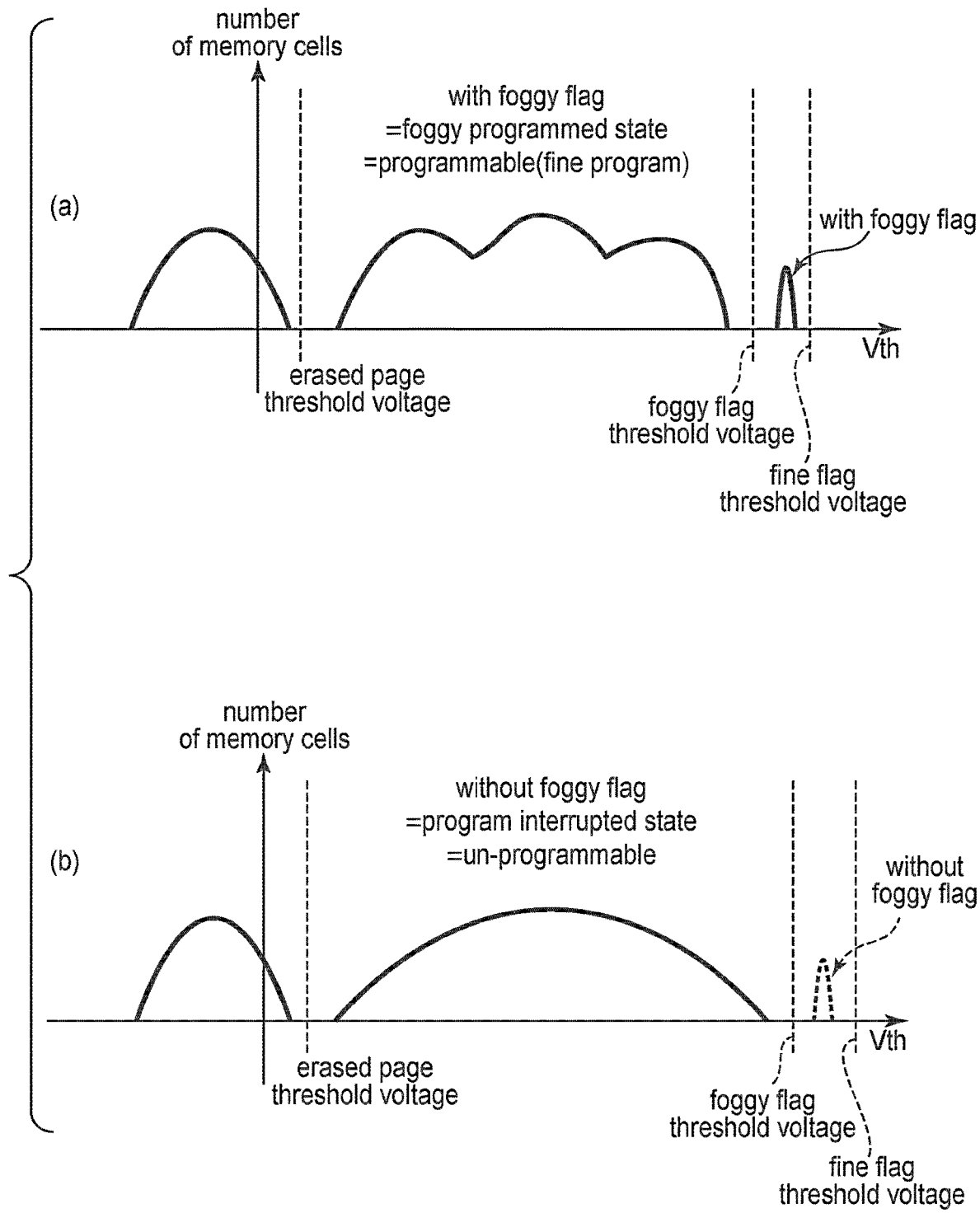
FIG. 44 illustrates a first example and a second example of threshold voltage distributions of memory cells included in a storage location in a memory system according to a fifth embodiment.

The foggy flag will first be described. FIG. 44 (a) illustrates threshold voltage distributions of a plurality of memory cells included in a storage location in the foggy programmed state, in the memory system 3 according to the fifth embodiment. FIG. 44 (b) illustrates threshold voltage distributions of a plurality of memory cells included in a storage location in the program interrupted state in which power loss occurred during execution of the foggy program operation, in the memory system 3 according to the fifth embodiment.

Each of storage locations included in a block includes a plurality of memory cells for storing data and at least one memory cell for storing the management information. Hereinafter, the at least one memory cell for storing the management information is referred to as a redundant memory cell.

In response to completion of the foggy program operation on a certain storage location, the controller 5 writes a foggy flag to the redundant memory cell included in the certain storage location.

The threshold voltage of the redundant memory cell to which the foggy flag has been written is higher than a threshold voltage range used in the foggy-fine program operation. Specifically, in response to completion of the foggy program operation on a certain storage location, the controller 5 sets the threshold voltage of the redundant memory cell included in the certain storage location, to a threshold voltage higher than the threshold voltage range used in the foggy-fine program operation, thereby writing the foggy flag to the redundant memory cell.

As illustrated in FIG. 44 (a), the threshold voltage distributions of the memory cells included in the storage location where the foggy program operation is completed are set with low precision in which data cannot be read correctly. The threshold voltage of the redundant memory cell among the memory cells is set higher than the threshold voltage range used in the foggy-fine program operation. Specifically, the threshold voltage of the redundant memory cell to which the foggy flag has been written is set higher than a foggy flag threshold voltage and lower than a fine flag threshold voltage. The foggy flag threshold voltage is higher than, for example, Vr16, which has been described with reference to FIG. 6.

The controller 5 can determine that the foggy flag has been written to the storage location by, for example, confirming that the storage location includes a memory cell having a threshold voltage equal to or higher than the foggy flag threshold voltage but does not include a memory cell having a threshold voltage equal to or higher than the fine flag threshold voltage.

In this manner, the storage location where the foggy program operation is completed stores unreadable data and further stores the foggy flag. The controller 5 is thus able to determine that the storage location in which the foggy flag is present and from which data cannot be read correctly is a storage location in the foggy programmed state.

As illustrated in FIG. 44 (b), no foggy flag is written to the redundant memory cell of a storage location in the program interrupted state. Each of threshold voltages of all memory cells included in the storage location are, therefore, within the threshold voltage range used in the foggy-fine program operation.

The controller 5 can determine that the foggy flag is not written in the storage location by, for example, confirming that the storage location includes no memory cell having a threshold voltage equal to or higher than the foggy flag threshold voltage.

In this manner, the storage location where power loss occurred during execution of the foggy program operation stores unreadable data but does not store the foggy flag. The controller 5 is thus able to determine that the storage location in which the foggy flag is not present and from which data cannot be read correctly is a storage location in the program interrupted state, that is, the storage location where power loss occurred during execution of the foggy program operation.

Figure 45:
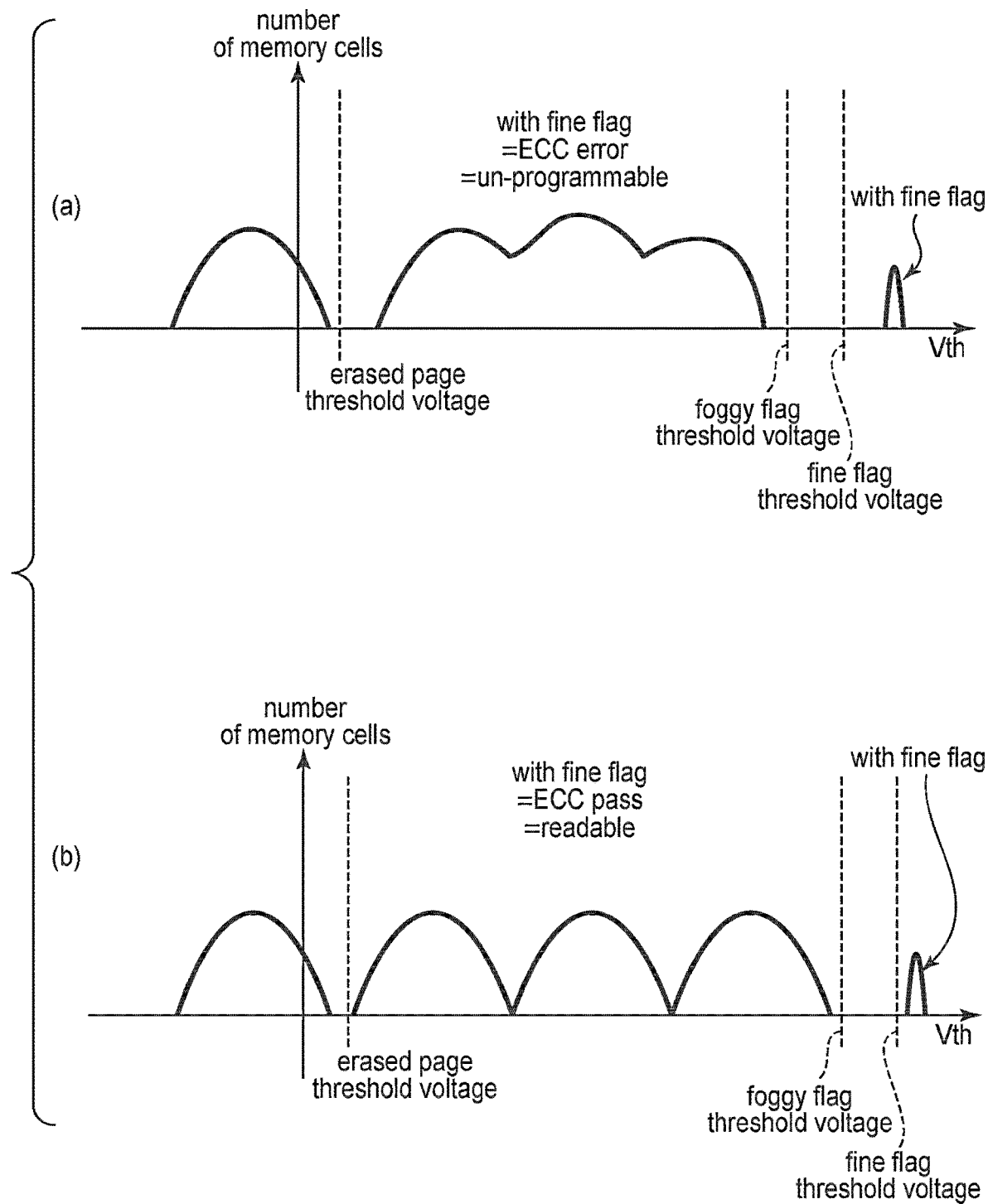
FIG. 45 illustrates a third example and a fourth example of the threshold voltage distributions of the memory cells included in the storage location in the memory system according to the fifth embodiment.

A fine flag will then be described. FIG. 45 (a) illustrates threshold voltage distributions of a plurality of memory cells included in a storage location in the program interrupted state, in which power loss occurred during execution of the fine program operation, in the memory system 3 according to the fifth embodiment. FIG. 45 (b) illustrates threshold voltage distributions of a plurality of memory cells included in a storage location in the fine programmed state, in the memory system 3 according to the fifth embodiment.

When the fine program operation on a certain storage location becomes executable, the controller 5 removes a foggy flag from the redundant memory cell included in the certain storage location before starting the fine program operation. Specifically, the controller 5 changes the threshold voltage of the redundant memory cell from the threshold voltage corresponding to the foggy flag threshold voltage to the threshold voltage corresponding to the fine flag threshold voltage, thereby removing the foggy flag from the redundant memory cell. The redundant memory cell having the threshold voltage corresponding to the fine flag threshold voltage is also referred to as a memory cell in which the fine flag is written. In other words, the controller 5 writes the fine flag to the redundant memory cell, thereby removing the foggy flag from the redundant memory cell.

As illustrated in FIG. 45 (*a*), the foggy flag is not written in the redundant memory cell of a storage location in the program interrupted state. Specifically, the storage location where power loss occurred during execution of the fine program operation stores unreadable data but does not store the foggy flag (and stores the fine flag instead). The controller 5 is thus able to determine that the storage location in which the foggy flag is not present and from which data cannot be read correctly is a storage location in the program interrupted state.

The controller 5 may determine whether the fine flag is present in the storage location. In this case, the controller 5 can also determine that the storage location in which the fine flag is present and from which data cannot be read correctly is a storage location where power loss occurred during execution of the fine program operation.

As illustrated in FIG. 45 (*b*), the foggy flag is not written in the redundant memory cell of a storage location in the fine programmed state. Specifically, the storage location where the fine program operation is completed stores readable data but does not store the foggy flag (and stores the fine flag instead). The controller 5 thus determines that the storage location from which data can be read correctly is a storage location in the fine programmed state.

In this manner, by checking the foggy flag of a storage location that stores unreadable data, the controller 5 can correctly determine that the storage location is in the foggy programmed state. Specifically, depending on whether the foggy flag is stored in each storage location storing unreadable data, the controller 5 can correctly determine whether each storage location storing the unreadable data is in the foggy programmed state or in the program interrupted state. The controller 5 is thus able to correctly determine whether a storage location in the program interrupted state is present in the block that is allocated as the write destination block at the time of the power loss. When determining that no storage location in the program interrupted state is present in the block, the controller 5 continues the data write operation on this block.

Specifically, when power supply to the memory system 3 is resumed, the controller 5 may execute the following unexpected power loss determination process.

When power supply to the memory system 3 has been resumed after power supply to the memory system 3 was shut off, the controller 5 identifies a storage location storing data that becomes readable last among a plurality of storage locations included in the write destination block. The controller 5 then determines whether a third condition that: (3-A) each of a first number of storage locations on which the foggy program operation was executed following execution of the foggy program operation on the storage location storing data that becomes readable last, stores unreadable data and the foggy flag; and (3-B) a storage location on which the foggy program operation is to be executed following execution of the foggy program operation on the first number of the storage locations, is in the erased state, is satisfied.

The first number is determined on the basis of the number of string units SU included in each block.

For example, in a case where each block includes four string units SU, the first number is four (or five). In a case where each block includes only one string unit SU, the first number is one (or two).

In the case where each block includes four string units SU, therefore, the controller 5 determines whether the third condition that: each of four or five storage locations on which the foggy program operation is to be executed following execution of the foggy program operation on the storage location storing data that becomes readable last, stores unreadable data and the foggy flag; and a storage location on which the foggy program operation is to be executed subsequently to execution of the foggy program operation on the four or five storage locations, is in the erased state, is satisfied.

For example, as in the example illustrated in FIG. 7, at the point of completion of the fine program operation on the MG (WL1, SU2), the MG (WL1, SU2) is a storage location storing data that becomes readable last. In this case, the storage location on which the foggy program operation has been executed subsequently to execution of the foggy program operation on the MG (WL1, SU2) is the MG (WL1, SU3). The controller 5 determines whether the MG (WL1, SU3) stores unreadable data and the foggy flag. The controller 5 further determines whether three storage locations, i.e., the MG (WL2, SU0) to the MG (WL2, SU2) each store unreadable data and the foggy flag. In this case, the first number is four. The controller 5 then determines whether the MG (WL2, SU3), which is a storage location on which the foggy program operation is to be executed subsequently to execution of the foggy program operation on the MG (WL2, SU2), is in the erased state. Through this process, the controller 5 determines whether the third condition is satisfied.

In the case where each block includes only one string unit SU, the controller 5 determines whether a condition is satisfied, the condition requiring that each of one or two storage locations on which the foggy program operation is to be executed subsequently to execution of the foggy program operation on a storage location that is the last to store readable data, stores unreadable data and the foggy flag, and that a storage location on which the foggy program operation is to be executed subsequently to execution of the foggy program operation on the one or two storage locations, is in the erased state.

Each storage location that stores unreadable data and the foggy flag is a storage location in the foggy programmed state in which the foggy program operation is completed and the fine program operation is not started yet.

When this condition is satisfied, therefore, the controller 5 can determine that no storage location in the program interrupted state is present in the block that is allocated as the write destination block. In this case, the controller 5 determines, as the next write destination storage location, the storage location in the erased state on which the foggy program operation is to be executed subsequently to execution of the foggy program operation on the storage location that stores unreadable data and the foggy flag.

The foggy program operation will then be described. FIG. 46 is a flowchart illustrating the procedure of the foggy program operation executed in the memory system 3 according to the fifth embodiment.

First, the controller 5 determines whether the foggy program operation on a storage location where the foggy program operation is to be executed next, is executable (step S81).

When the foggy program operation is not executable (No in step S81), the controller 5 waits until the foggy program operation becomes executable.

When the foggy program operation is executable (Yes in step S81), the controller 5 executes the foggy program operation on the storage location (step S82).

When the foggy program operation on the storage location is completed, the controller 5 sets the threshold voltage of the redundant memory cell of the storage location to a voltage that corresponds to the foggy flag threshold voltage, thereby writing the foggy flag to the redundant memory cell (step S83).

The fine program operation will then be described. FIG. 47 is a flowchart illustrating the procedure of the fine program operation executed in the memory system 3 according to the fifth embodiment First, the controller 5 determines whether the fine program operation on a storage location where the fine program operation is to be executed next, is executable (step S91).

When the fine program operation is not executable (No in step S91), the controller 5 waits until the fine program operation becomes executable.

When the fine program operation is executable (Yes in step S91), the controller 5 removes the foggy flag from the redundant memory cell of the storage location before starting the fine program operation on the storage location (step S92). In other words, the controller 5 changes the threshold voltage of the redundant memory cell to a voltage that corresponds to the fine flag threshold voltage.

The controller 5 then executes the fine program operation on the storage location (step S93).

Figure 48:
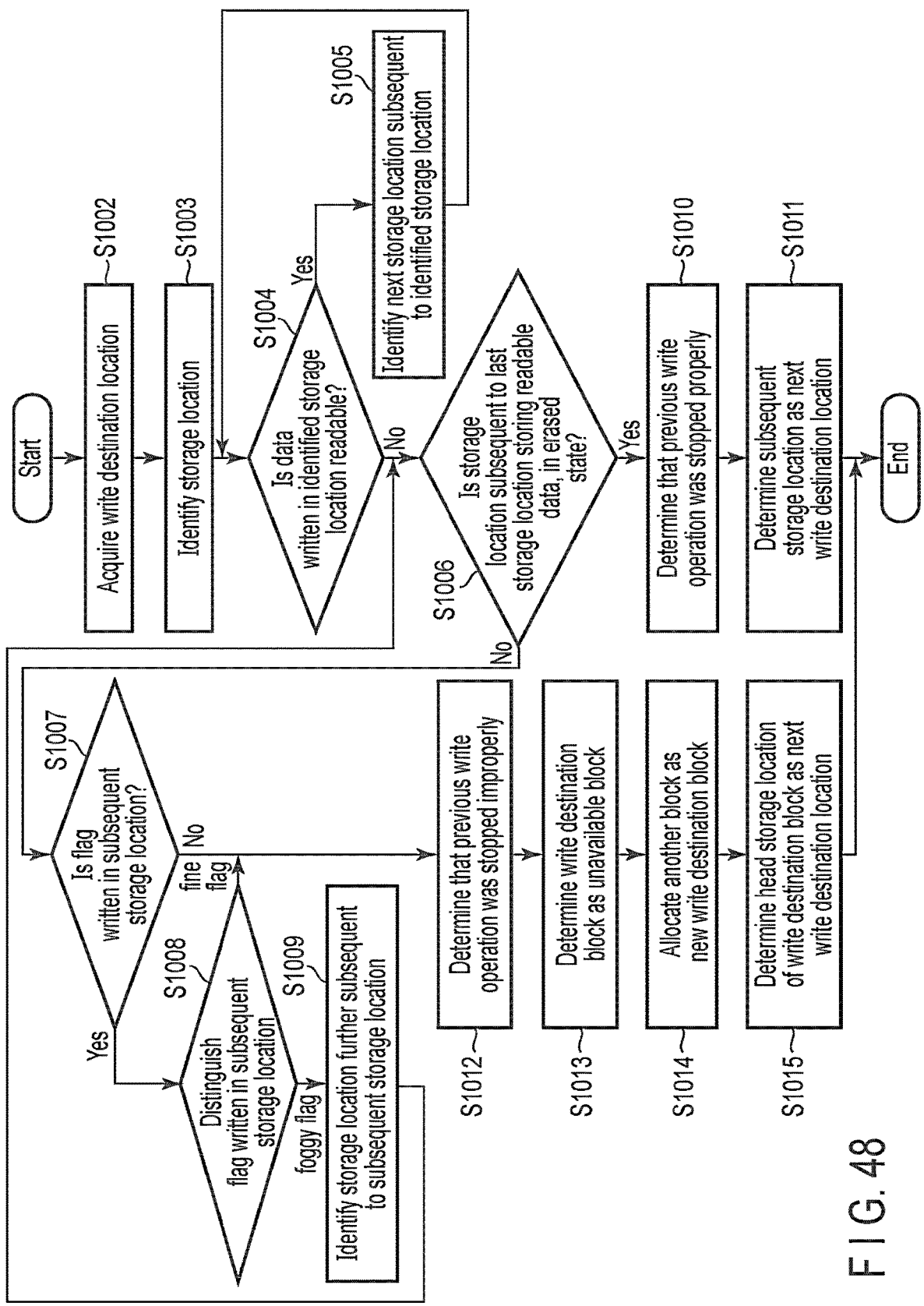
FIG. 48 is a flowchart illustrating the procedure of an unexpected power loss determination process executed in the memory system according to the fifth embodiment.

The procedure of the unexpected power loss determination process will then be described. FIG. 48 is a flowchart illustrating the procedure of the unexpected power loss determination process executed in the memory system 3 according to the fifth embodiment.

When power supply to the memory system 3 is resumed, the controller 5 acquires information indicative of a write destination storage location, from the NAND memory 6 (step S1002).

Subsequently, the controller 5 executes data read operations on several storage locations that start from the storage location indicated by the acquired information, thereby identifying the last storage location that stores readable data (steps S1003 to S1005).

In this case, the controller 5 first specifies the storage location indicated by the acquired information, as a storage location on which the data read operation is to be executed first (step S1003).

The controller 5 determines whether data written in the specified storage location is readable data (step S1004). When data written in the specified storage location is readable data (Yes in step S1004), the controller 5 specifies the next storage location subsequent to the specified storage location (step S1005). Subsequently, the process by the controller 5 returns to step S1004. In step S1004, the controller 5 determines whether the data written in the storage location specified in step S1005 is readable data.

When a storage location subsequent to the storage location storing the readable data stores unreadable data, the controller 5 determines the storage location storing the readable data, as the last storage location that stores readable data.

When determining the last storage location that stores readable data, the controller 5 determines whether the storage location subsequent to the last storage location storing readable data (that is, the storage location on which the foggy program operation has been executed subsequently to execution of the foggy program operation on the last storage location), is in the foggy programmed state (steps S1006 to S1009).

When the subsequent storage location stores unreadable data and stores the foggy flag as well, the controller 5 can determine that the subsequent storage location is in the foggy programmed state. Note that it has already been confirmed in step S1004 that the subsequent storage location stores unreadable data. The controller 5, therefore, just determines whether the subsequent storage location stores the foggy flag.

Alternatively, the controller 5 may first determine whether the subsequent storage location is in the erased state. In this case, when determining that the subsequent storage location is not in the erased state, the controller 5 may determine whether the subsequent storage location stores the foggy flag.

Here, a case will be described where the controller 5 first determines whether the subsequent storage location is in the erased state, and when determining that the subsequent storage location is not in the erased state, then determines whether the subsequent storage location stores the foggy flag.

The controller 5 determines whether the subsequent storage location is in the erased state (step S1006). In other words, the controller 5 determines whether the subsequent storage location includes a memory cell that has a threshold voltage equal to or higher than the erased page threshold voltage.

When the subsequent storage location is not in the erased state (No in step S1006), the controller 5 determines whether a flag is written in the subsequent storage location (step S1007). The controller 5 determines whether a plurality of memory cells included in the subsequent storage location include a memory cell that has a threshold voltage equal to or higher than the foggy flag threshold voltage.

When the flag is written in the subsequent storage location (Yes in step S1007), the controller 5 determines whether the flag written in the subsequent storage location is the foggy flag or the fine flag (step S1008). The controller 5 determines whether the memory cells included in the subsequent storage location include a memory cell that has a threshold voltage equal to or higher than the fine flag threshold voltage. When the memory cells include a memory cell that has a threshold voltage equal to or higher than the fine flag threshold voltage, the controller 5 determines that the flag written in the subsequent storage location is the fine flag. When the memory cells does not include a memory cell that has a threshold voltage equal to or higher than the fine flag threshold voltage, the controller 5 determines that the flag written in the subsequent storage location is the foggy flag.

When the flag written in the subsequent storage location is the foggy flag (foggy flag in step S1008), the controller 5 specifies a storage location further subsequent to the subsequent storage location (step S1009). The process by the controller 5 then returns to step S1006. In step S1006, the controller 5 determines whether the storage location specified in step S1009 is in the erased state.

In this manner, the controller 5 determines whether each of the first number of the storage locations on which the foggy program operation has been executed subsequently to execution of the foggy program operation on the storage location storing data that becomes readable last, stores unreadable data and the foggy flag.

A storage location subsequent to the first number of storage locations that each store unreadable data and the foggy flag, is specified in step S1009. Subsequently, in step S1006, the controller 5 determines whether the storage location subsequent to the first number of the storage locations is in the erased state.

When the subsequent storage location is in the erased state (Yes in step S1006), the controller 5 determines that the previous write operation in the memory system 3 was stopped properly, that is, no storage location in the program interrupted state is present in the block that is allocated as the write destination block (step S1010).

The controller 5 then determines the subsequent storage location as the next write destination storage location (step S1011).

When the subsequent storage location is not in the erased state (No in step S1006) and no foggy flag is written in the subsequent storage location (No in step S1007 or fine flag in step S1008), the controller 5 determines that the previous write operation was stopped improperly (step S1012).

Furthermore, in the process of determining whether the first number of storage locations each store unreadable data and the foggy flag, when no foggy flag is written in the target storage location (No in step S1007 or fine flag in step S1008), the controller 5 determines that the previous write operation was stopped improperly (step S1012). In other words, the controller 5 determines that there is a possibility that a storage location in the program interrupted state is present in the block that is allocated as the write destination block.

The controller 5 thus determines the write destination block as an unavailable block (step S1013).

The controller 5 allocates another block, as a new write destination block (step S1014). The controller 5 selects the block from the free block list 73. The controller 5 then allocates the selected block as a write destination block.

The controller 5 determines the head storage location of the write destination block, as the next write destination storage location (step S1015). Specifically, the controller 5 determines the head storage location of the block allocated as the write destination block in step S1014, as the next write destination storage location.

As described above, in the fifth embodiment, the foggy flag is written to at least one memory cell (redundant memory cell) among a plurality of memory cells included in each storage location. Then, in response to resuming of power supply to the memory system 3 after shut off of power supply to the memory system 3, the controller 5 determines whether a condition that: each of the first number of the storage locations on which the foggy program operation has been executed subsequently to execution of the foggy program operation on the storage location storing data that becomes readable last, stores unreadable data and the foggy flag; and a storage location on which the foggy program operation is to be executed subsequently to execution of the foggy program operations on the first number of the storage locations is in the erased state, is satisfied. This enables the controller 5 to correctly determine whether the previous write operation was stopped properly.

Basically, the controller 5 may execute the unexpected power loss determination process every time power supply is resumed, regardless of whether the previous power loss was unexpected power loss in which power supply is suddenly shut off or power supply was shut off after receiving a shutdown notice from the host 2.

Note that the controller 5 may execute the unexpected power loss determination process in response to the restart of power supply only when the previous power loss was the unexpected power loss.

As described above, according to the first to fifth embodiments, even when power supply to the memory system 3 is suddenly shut off due to unexpected power loss during execution of the first step program operation (foggy program operation) or the second step program operation (foggy program operation), the next write destination storage location can be correctly determined.

It should be noted that any two or more of the first to fifth embodiments may be combined appropriately.

In the first to fifth embodiments, the case where data received from the host 2 is written into an SLC block and then the data stored in the SLC block is written into a QLC block by using a multi-step program operation, has been described. However, the first to fifth embodiments are not limited to this configuration. For example, data received from the host 2 may be written directly into the QLC block by using the multi-step program operation.

The last storage location that stores readable data is a storage location where the second step program operation (i.e., fine program operation) has been executed last. Unreadable data is also referred to as data impossible of reading.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A memory system comprising:
a nonvolatile memory that includes a plurality of blocks, each of the plurality of blocks being a unit of a data erase operation and including a plurality of storage locations, each of the plurality of storage locations including a plurality of first memory cells for storing data and at least one second memory cell for storing management information; and
a controller electrically connected to the nonvolatile memory and configured to execute a data write operation on each of the plurality of first memory cells included in a write destination block among the plurality of blocks by using a multi-step program operation that includes at least a first step program operation and a second step program operation, wherein
the controller is configured to execute the data write operation on the plurality of storage locations of the write destination block in an order in which:
the first step program operation on a first storage location of the write destination block is executed;
after completion of the first step program operation on the first storage location, the first step program operation on a second storage location of the write destination block is executed;
in response to completion of the first step program operation on the second storage location, the second step program operation on the first storage location is executed; and
after completion of the second step program operation on the first storage location, the first step program operation on a third storage location of the write destination block is executed, wherein the controller is further configured to:

in executing the data write operation on the write destination block according to the order, write, in response to completion of the first step program operation on a storage location of the write destination block, a first flag to the second memory cell of the storage location by setting a threshold voltage of the second memory cell to a first voltage that is higher than a threshold voltage range used in the multi-step program operation; and remove, before starting the second step program operation on the storage location, the first flag from the second memory cell by changing the threshold voltage of the second memory cell from the first voltage to a second voltage that is higher than the first voltage.

2. The memory system according to claim 1, wherein the controller is further configured to, in response to resuming of power supply to the memory system after shutoff of power supply to the memory system:

identify, in a first block among the plurality of blocks, a fourth storage location on which the second step program operation is executed last among the plurality of storage locations of the first block according to the order;

determine whether a third condition that (A) a fifth storage location of the first block stores unreadable data and the first flag and (B) each of the first memory cells of a sixth storage location of the first block has a threshold voltage corresponding to an erased state, is satisfied, wherein, among the plurality of storage locations of the first block, according to the order, the first step program operation on the fourth storage location has been executed;

after completion of the first step program operation on the fourth storage location, the first step program operation on the fifth storage location has been executed;

in response to completion of the first step program operation on the fifth storage location, the second step program operation on the fourth storage location has been executed; and the first step program operation on the sixth storage location is to be executed after completion of the second step program operation on the fifth storage location, and when the third condition is satisfied, determine the sixth storage location of the first block as a next write destination storage location.

3. The memory system according to claim 2, wherein the controller is further configured to:

when the third condition is not satisfied:

manage the first block as an unavailable block;

allocate a second block among the plurality of blocks as a new write destination block; and determine a head storage location of the plurality of storage locations of the second block as the next write destination storage location.

4. The memory system according to claim 2, wherein the controller is further configured to, upon resuming of power supply to the memory system after power supply to the memory system is shut off by unexpected power loss:

identify the fourth storage location of the first block;

determine whether the third condition is satisfied; and when the third condition is satisfied, determine the sixth storage location of the first block as the next write destination storage location.

5. The memory system according to claim 2, wherein the controller is further configured to:

store write destination information about a write destination storage location to the nonvolatile memory; and upon resuming of power supply to the memory system after shutoff of power supply to the memory system, identify the fourth storage location by reading data from one or more of the plurality of storage locations of the first block from a last storage location of the first block indicated by the write destination information.

6. The memory system according to claim 2, wherein the first step program operation makes a threshold voltage of at least one of the plurality of memory cells of a write destination storage location higher than a threshold voltage that corresponds to the erased state, but data written to the write destination storage location is unreadable after completion of the first step operation, the second step program operation adjusts the threshold voltage of the at least one of the plurality of memory cells of the write destination storage location, and data written to the write destination storage location becomes readable after completion of the second step program operation.

\* \* \* \* \*